United States Patent
Heo et al.

(10) Patent No.: US 11,830,436 B2
(45) Date of Patent: Nov. 28, 2023

(54) GATE DRIVER AND DISPLAY DEVICE INCLUDING THE SAME

(71) Applicant: LG DISPLAY CO., LTD., Seoul (KR)

(72) Inventors: Seung Ho Heo, Paju-si (KR); Dong Hyun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/901,517

(22) Filed: Sep. 1, 2022

(65) Prior Publication Data

US 2023/0073923 A1   Mar. 9, 2023

(30) Foreign Application Priority Data

Sep. 3, 2021 (KR) .................. 10-2021-0117376
Dec. 8, 2021 (KR) .................. 10-2021-0174798

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0852* (2013.01); *G09G 2310/0286* (2013.01)

(58) Field of Classification Search
CPC .............. G09G 3/3266; G09G 3/3677; G09G 2310/0286; G11C 19/28
See application file for complete search history.

(56) References Cited

U.S. PATENT DOCUMENTS

| | | | | |
|---|---|---|---|---|
| 8,040,313 B2* | 10/2011 | Jang | ................ | G11C 19/00 377/64 |
| 11,151,956 B1* | 10/2021 | Iwase | ................ | G09G 3/3688 |
| 2012/0062528 A1* | 3/2012 | Kimura | ................ | G09G 3/3677 345/204 |

FOREIGN PATENT DOCUMENTS

KR   10-2017-0064644 A    6/2017
KR      10-2051389 A    12/2019

* cited by examiner

*Primary Examiner* — Xuemei Zheng
(74) *Attorney, Agent, or Firm* — Morgan, Lewis & Bockius LLP

(57) ABSTRACT

A gate driver includes a first shift register to supply a gate signal to a plurality of gate lines through output nodes, and a second shift register to supply the gate signal to the gate lines through output nodes. The gate signal is supplied from the first shift register to one side of an i-th gate line and supplied from the second shift register to the other side of the i-th gate line, then the gate signal is supplied from the second shift register to the other side of the i-th gate line, then the gate signal is supplied from the first shift register to one side of the i-th gate line, and then, the gate signal is supplied from the first shift register to one side of the i-th gate line and simultaneously supplied from the second shift register to the other side of the i-th gate line.

37 Claims, 28 Drawing Sheets

| PERIOD | FIRST GATE DRIVER (120L) | SECOND GATE DRIVER (120R) |
|---|---|---|
| ① | ON QG1-1a, OFF QG1-1b, QBG1; Q11→TR1-1a (GVDD), Q12→TR1-1b (GVSS), QB1→TR1-2 (GVSS); EM Out | ON QG2-1a, OFF QG2-1b, QBG2; Q21→TR2-1a (GVDD), Q22→TR2-1b (GVSS), QB2→TR2-2 (GVSS); EM Out |
| ② | OFF QG1-1a, OFF QG1-1b, QBG1; Q11→TR1-1a (Tran), Q12→TR1-1b (Tran), QB1→TR1-2 (GVSS); EM Out | ON QG2-1a, OFF QG2-1b, QBG2; Q21→TR2-1a (GVDD), Q22→TR2-1b (GVSS), QB2→TR2-2 (GVSS); EM Out |
| ③ | OFF QG1-1a, ON QG1-1b, QBG1; Q11→TR1-1a (GVSS), Q12→TR1-1b (GVDD), QB1→TR1-2 (GVSS); EM Out | OFF QG2-1a, OFF QG2-1b, QBG2; Q21→TR2-1a (Tran), Q22→TR2-1b (Tran), QB2→TR2-2 (GVSS); EM Out |
| ④ | OFF QG1-1a, ON QG1-1b, QBG1; Q11→TR1-1a (GVSS), Q12→TR1-1b (GVDD), QB1→TR1-2 (GVSS); EM Out | OFF QG2-1a, ON QG2-1b, QBG2; Q21→TR2-1a (GVDD), Q22→TR2-1b (GVSS), QB2→TR2-2 (GVSS); EM Out |

FIG. 19A

| PERIOD | FIRST GATE DRIVER (120L) | SECOND GATE DRIVER (120R) |
|---|---|---|
| ① | ON QBG1-1a, OFF QBG1-1b; QG1→Q1→TR1-1 (GVDD), QB11→TR1-2a, QB12→TR1-2b (VSS VSS); EM Out → | ← EM Out; TR2-1 (GVDD)→Q2→QG2, TR2-2a→QB21, TR2-2b→QB22 (VSS VSS); ON QBG2-1a, OFF QBG2-1b |
| ② | OFF QBG1-1a, OFF QBG1-1b; QG1→Q1→TR1-1 (GVDD), QB11→TR1-2a, QB12→TR1-2b (VSS VSS); EM Out | ← EM Out; TR2-1 (GVDD)→Q2→QG2, TR2-2a→QB21, TR2-2b→QB22 (VSS VSS); ON QBG2-1a, OFF QBG2-1b |
| ③ | OFF QBG1-1a, ON QBG1-1b; QG1→Q1→TR1-1 (GVDD), QB11→TR1-2a, QB12→TR1-2b (VSS VSS); EM Out → | EM Out; TR2-1 (GVDD)→Q2→QG2, TR2-2a→QB21, TR2-2b→QB22 (VSS VSS); OFF QBG2-1a, OFF QBG2-1b |
| ④ | OFF QBG1-1a, ON QBG1-1b; QG1→Q1→TR1-1 (GVDD), QB11→TR1-2a, QB12→TR1-2b (VSS VSS); EM Out → | ← EM Out; TR2-1 (GVDD)→Q2→QG2, TR2-2a→QB21, TR2-2b→QB22 (VSS VSS); OFF QBG2-1a, ON QBG2-1b |

GATE DRIVER AND DISPLAY DEVICE INCLUDING THE SAME

CROSS-REFERENCE TO RELATED APPLICATION

This application claims priority to and the benefit of Korean Patent Application No. 2021-0117376, filed on Sep. 3, 2021, and Korean Patent Application No. 2021-0174798, filed on Dec. 8, 2021, the disclosure of which is incorporated herein by reference in its entirety.

BACKGROUND

1. Technical Field

The present disclosure relates to a gate driver and a display device including the same.

2. Discussion of the Related Art

Display devices includes a liquid crystal display (LCD) device, an electroluminescence display device, a field emission display (FED) device, a plasma display panel (PDP), and the like.

Some of display devices, for example, a liquid crystal display device or an organic light emitting display device includes a display panel including a plurality of sub-pixels, a driver outputting a driving signal for driving the display panel, a power supply generating power to be supplied to the display panel or the driver, and the like. The driver includes a gate driver that supplies a scan signal or a gate signal to the display panel, and a data driver that supplies a data signal to the display panel.

In such a display device, when a driving signal such as a scan signal, an EM signal, and a data signal is supplied to a plurality of sub-pixels formed in the display panel, the selected sub-pixel transmits light or emits light directly to thereby display an image.

In general, a gate driving circuit for supplying a gate pulse to gate lines of a flat panel display device includes a plurality of gate driver integrated circuits (ICs). Since each of the gate driver ICs needs to output gate pulses sequentially, each gate driver IC may basically include a shift register, and may include circuits and output buffers used to adjust an output voltage of the shift register according to driving characteristics of a display panel. The shift register that generates gate pulses in the display device may be implemented in the form of a gate-in-panel (GIP), which is configured by combining thin-film transistors in a bezel area that is a non-display area of the display panel. In particular, a waveform output from an emission (EM) GIP is a waveform that directly controls light emission of an organic light-emitting display (OLED), and a stable output waveform should be generated outside a sensing period, and thus, it is difficult to apply the alternating driving of transistors.

SUMMARY

Accordingly, embodiments of the present disclosure are directed to a gate driver and a display device including the same that substantially obviate one or more of the problems due to limitations and disadvantages of the related art.

An aspect of the present disclosure is to provide a gate driving circuit allowing alternating driving to be performed while stably maintaining an output waveform, and a display device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a gate driver comprises a first shift register configured to sequentially supply a gate signal to a plurality of gate lines through output nodes connected to the gate lines, and a second shift register configured to sequentially supply the gate signal to the gate lines through output nodes connected to the gate lines, wherein, in a first process, the gate signal is supplied from the first shift register to one side of an i-th gate line (i is a positive integer) and simultaneously supplied from the second shift register to the other side of the i-th gate line, in a second process following the first process, the gate signal is supplied from the second shift register to the other side of the i-th gate line, in a third process following the second process, the gate signal is supplied from the first shift register to one side of the i-th gate line, and in a fourth process following the third process, the gate signal is supplied from the first shift register to one side of the i-th gate line and simultaneously supplied from the second shift register to the other side of the i-th gate line.

In another aspect, a gate driver comprises a first shift register configured to sequentially supply a gate signal to a plurality of gate lines through output nodes connected to the gate lines, and a second shift register configured to sequentially supply the gate signal to the gate lines through output nodes connected to the gate lines, wherein, in a first process, the first shift register pulls down an i-th gate line (i is a positive integer), and simultaneously, the second shift register pulls down the i-th gate line, in a second process following the first process, the second shift register pulls down the i-th gate line, in a third process following the second process, the first shift register pulls down the i-th gate line, and in a fourth process following the third process, the first shift register pulls down the i-th gate line, and simultaneously, the second shift register pulls down the i-th gate line.

In another aspect, a gate driver comprises an i-th signal transmitter (i is a positive integer) of a first shift register, which is configured to output a first gate signal to one side of an i-th gate line according to a voltage of a (1-1)th control node that pulls up a first output voltage and a voltage of a (1-2)th control node that pulls down the first output voltage; and an i-th signal transmitter of a second shift register, which is configured to output a second gate signal to the other side of the i-th gate line according to a voltage of a (2-1)th control node that pulls up a second output voltage and a voltage of a (2-2)th control node that pulls down the second output voltage, wherein the (1-1)th control node is controlled to be a pull-up control node during a (1-1)th unit time, and deactivated during a (1-2)th unit time, the (1-2)th control node is deactivated during the (1-1)th unit time, and controlled to be the pull-up control node during the (1-2)th unit time, the (2-1)th control node is controlled to be the pull-up control node during a (2-1)th unit time, and deactivated during a (2-2)th unit time, and the (2-2)th control node is deactivated during the (2-1)th unit time, and controlled to be the pull-up control node during the (2-2)th unit time, wherein a time point, at which a transition between the (1-1)th unit time and the (1-2)th unit time is made, is different from a time point at which a transition between (2-1)th unit time and the (2-2)th unit time is made.

In another aspect, a gate driver comprises an i-th signal transmitter (i is a positive integer) of a first shift register, which is configured to output a first gate signal to one side of an i-th gate line according to a voltage of a (1-1)th control node that pulls up a first output voltage and a voltage of a (1-2)th control node that pulls down the first output voltage; and an i-th signal transmitter of a second shift register, which is configured to output a second gate signal to the other side of the i-th gate line according to a voltage of a (2-1)th control node that pulls up a second output voltage and a voltage of a (2-2)th control node that pulls down the second output voltage, wherein the (1-1)th control node is controlled to be a pull-up control node, the (1-2)th control node is controlled to be a pull-down control node during a (1-1)th unit time, and deactivated during a (1-2)th unit time, the (2-1)th control node is controlled to be the pull-up control node, and the (2-2)th control node is deactivated during a (2-1)th unit time, and controlled to be the pull-down control node during a (2-2)th unit time, wherein a time point, at which a transition between the (1-1)th unit time and the (1-2)th unit time is made, is different from a time point at which a transition between (2-1)th unit time and the (2-2)th unit time is made.

In another aspect, a display device comprises a display panel in which a plurality of data lines to which a data voltage is applied, a plurality of gate lines crossing the data lines and to which a gate signal is applied, and pixel circuits connected to a plurality of power lines are disposed; a data driver configured to receive pixel data and output the data voltage; and a gate driver configured to output the gate signal using a shift register, wherein the gate driver includes: a first shift register configured to sequentially supply the gate signal to the plurality of gate lines through output nodes connected to the gate lines; and a second shift register configured to sequentially supply the gate signal to the gate lines through output nodes connected to the gate lines, wherein, in a first process, the gate signal is supplied from the first shift register to one side of an i-th gate line (i is a positive integer) and simultaneously supplied from the second shift register to the other side of the i-th gate line, in a second process following the first process, the gate signal is supplied from the second shift register to the other side of the i-th gate line, in a third process following the second process, the gate signal is supplied from the first shift register to the one side of the i-th gate line, and in a fourth process following the third process, the gate signal is supplied from the first shift register to the one side of the i-th gate line and simultaneously supplied from the second shift register to the other side of the i-th gate line.

In another aspect, a display device comprises a display panel in which a plurality of data lines to which a data voltage is applied, a plurality of gate lines crossing the data lines and to which a gate signal is applied, and pixel circuits connected to a plurality of power lines are disposed; a data driver configured to receive pixel data and output the data voltage; and a gate driver configured to output the gate signal using a shift register, wherein the gate driver includes: a first shift register configured to sequentially supply the gate signal to the plurality of gate lines through output nodes connected to the gate lines; and a second shift register configured to sequentially supply the gate signal to the gate lines through output nodes connected to the gate lines, wherein, in a first process, the first shift register pulls down an i-th gate line (i is a positive integer), and simultaneously, the second shift register pulls down the i-th gate line, in a second process following the first process, the second shift register pulls down the i-th gate line, in a third process following the second process, the first shift register pulls down the i-th gate line, and in a fourth process following the third process, the first shift register pulls down the i-th gate line, and simultaneously, the second shift register pulls down the i-th gate line.

In the present disclosure, it is possible to alternately drive buffer transistors in two gate drivers disposed in bezel areas on both sides of a display panel while stably maintaining an output waveform applied to pixels, and reduce stress due to long-time driving by alternately driving the buffer transistors at a predetermined period, and setting the alternate driving timings in the two gate drivers to be different from each other.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIGS. 6A and 6B are views for describing an operation principle of the gate driver illustrated in FIG. 5;

FIGS. 13A and 13B are views for describing an operation principle of the gate driver shown in FIG. 12;

FIGS. 19A and 19B are views for describing an operation principle of the gate driver illustrated in FIG. 18;

DETAILED DESCRIPTION

Figure 1:
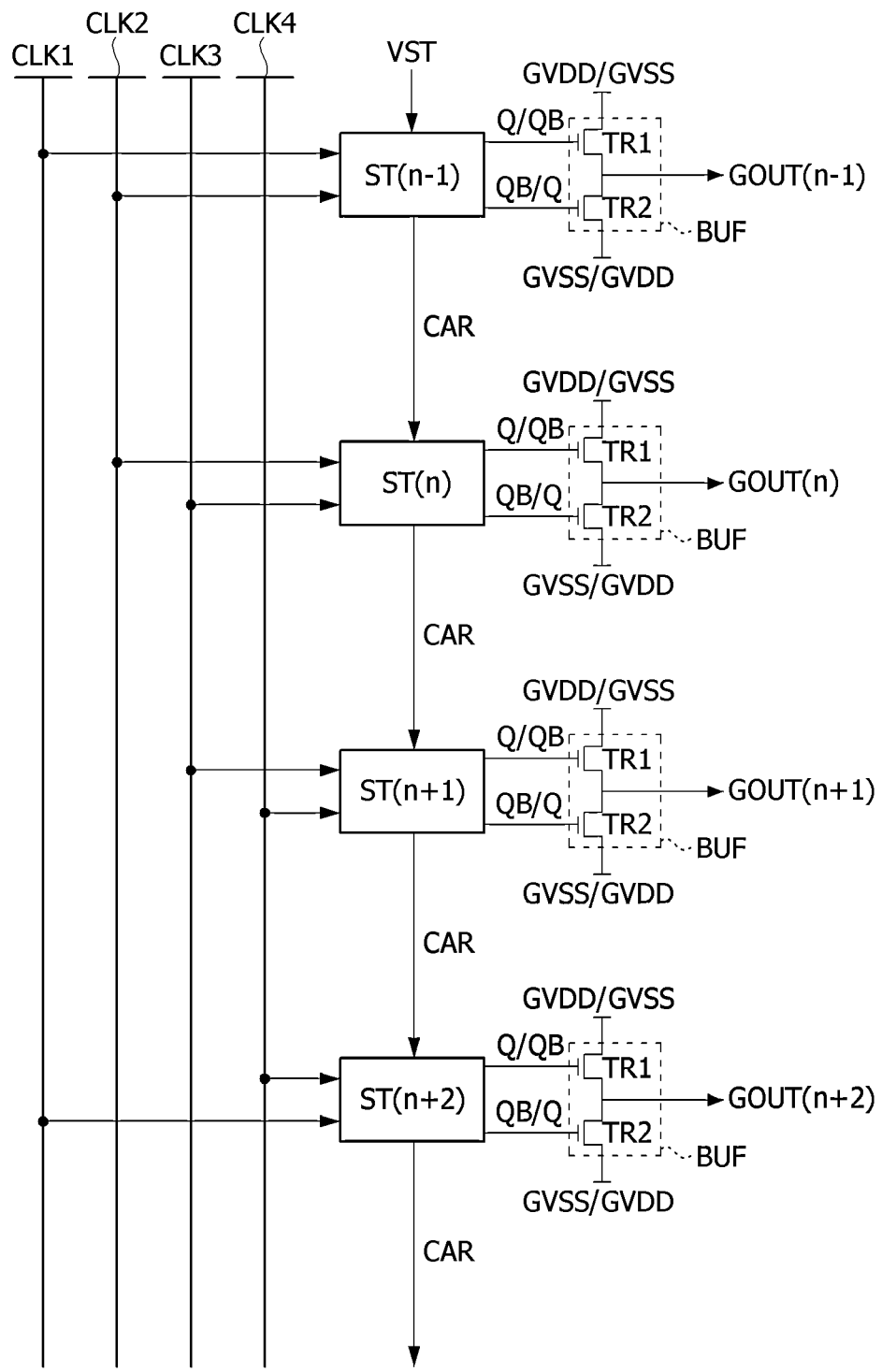
FIG. 1 is a view schematically illustrating a shift register of a gate driving circuit according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having," used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

Each of the pixels may include a plurality of sub-pixels having different colors to in order to reproduce the color of the image on a screen of the display panel. Each of the sub-pixels includes a transistor used as a switch element or a driving element. Such a transistor may be implemented as a TFT (Thin Film Transistor).

A driving circuit of the display device writes a pixel data of an input image to pixels on the display panel. To this end, the driving circuit of the display device may include a data driving circuit configured to supply data signal to the data lines, a gate driving circuit configured to supply a gate signal to the gate lines, and the like.

In a display device of the present disclosure, a pixel circuit and a gate driving circuit may include a plurality of transistors. Each of the transistors may be implemented as a thin-film transistor (TFT) of a metal oxide semiconductor field-effect transistor (MOSFET) structure, and may be an oxide TFT including an oxide semiconductor or a low-temperature poly silicon (LTPS) TFT including LTPS. Hereinafter, an example in which the transistors constituting the pixel circuit and the gate driving circuit are implemented as n-channel oxide TFTs implemented as oxide TFTs will be mainly described, but the present disclosure is not limited thereto.

Generally, a transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor.

The transistor is turned on in response to the gate-on voltage and is turned off in response to the gate-off voltage. In the case of an n-channel transistor, a gate-on voltage may be a gate high voltage VGH and VEH, and a gate-off voltage may be a gate low voltage VGL and VEL.

Hereinafter, various embodiments of the present disclosure will be described in detail with reference to the accompanying drawings. In the following embodiments, a display device will be described focusing on an organic light emitting display device, but the present disclosure is not limited thereto.

Figure 2:
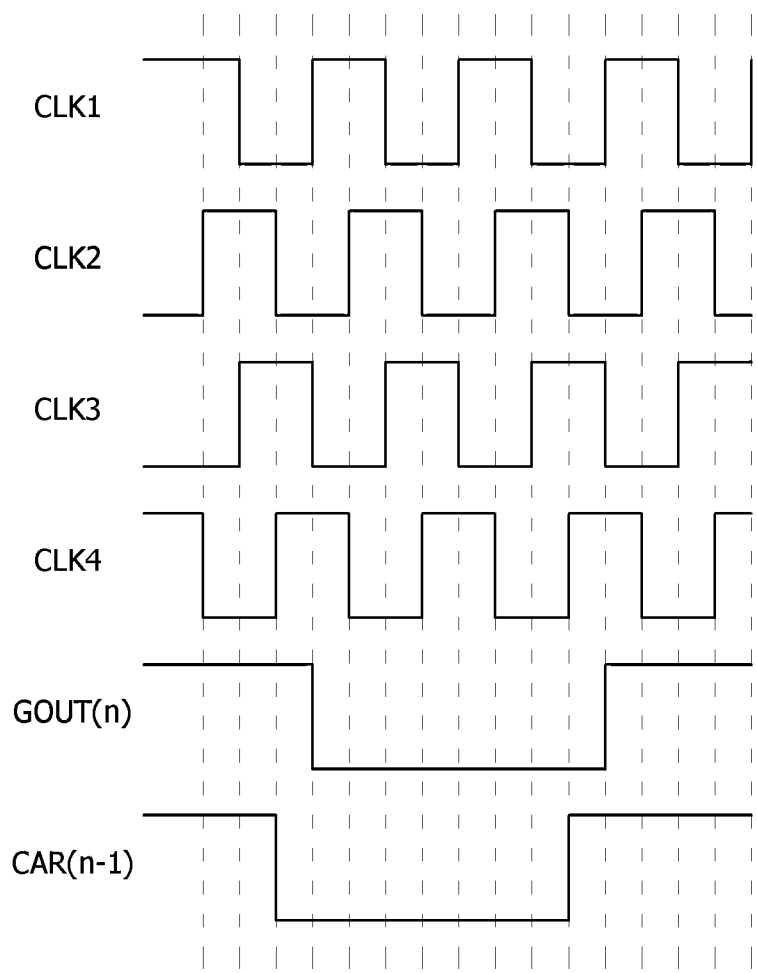
FIG. 2 is a waveform diagram illustrating shift clocks, a gate pulse, and a carry signal input to the shift register illustrated in FIG. 1.

FIG. 1 is a view schematically illustrating a shift register of a gate driving circuit according to an embodiment of the present disclosure, and FIG. 2 is a waveform diagram illustrating shift clocks, a gate pulse, and a carry signal input to the shift register illustrated in FIG. 1.

Referring to FIGS. 1 and 2, the gate driving circuit includes the shift register that sequentially outputs pulses GOUT(n−1) to GOUT(n+2) (hereinafter, referred to as "gate pulses") of a gate signal in synchronization with shift clocks CLK.

The shift register includes signal transmitters ST(n−1) to ST(n+2) that are connected in a cascaded manner. Each of the signal transmitters ST(n−1) to ST(n+2) includes a VST node to which a start signal VST is input, a CLK node to which shift clocks CLK1 to CLK4 are input, and first and second control nodes configured to alternately drive buffer transistors TR1 and TR2.

In general, the start signal VST is input to a first signal transmitter. In FIG. 1, an (n−1)th signal transmitter ST(n−1) may be the first signal transmitter that receives the start signal VST. The shift clocks CLK1 to CLK4 may be k-phase clocks (where k is a natural number), but the present disclosure is not limited thereto.

The signal transmitters ST(n) to ST(n+2), which are cascade-connected to the (n−1)th signal transmitter ST(n−1), start driving by receiving a carry signal CAR from the previous signal transmitter as the start signal. The signal transmitters ST(n−1) to ST(n+2) may output gate pulses GOUT(n−1) to GOUT(n+2) through first output nodes thereof, respectively, and simultaneously, output the carry signal CAR through second output nodes thereof.

A buffer BUF illustrated in FIG. 1 is a buffer connected to the first output node through which the gate pulse is output. The buffer BUF includes a first transistor TR1 and a second transistor TR2 connected to the first output node, and outputs each of the gate pulses GOUT(n−1) to GOUT(n+2) through the first output node. The first output node is connected to gate lines of a display panel on which an input image is reproduced.

In at least one of the buffers BUF, the first and second transistors TR1 and TR2 alternately operate as a pull-up transistor at a predetermined time period and supply a gate driving voltage GVDD to the first output node and rise a voltage of the first output node. The first and second transistors TR1 and TR2 are driven as pull-down transistors at a predetermined time period to discharge the first output node, thereby falling the voltage of the gate pulses GOUT(n−1) to GOUT(n+2). The gate driving voltage GVDD may be a voltage higher than a gate reference voltage GVSS. The gate driving voltage GVDD may be set as a gate-on voltage, and the gate reference voltage GVSS may be set as a gate-off voltage.

The predetermined time may be a j-frame period (j is a natural number), or a unit time set to several seconds [sec].

In at least one of the buffers BUF, the first and second transistors TR1 and TR2 alternately operate as a pull-up transistor at a predetermined time period. When one of the first and second transistors TR1 and TR2 operates as the pull-up transistor, the other one thereof operates as a pull-down transistor, thereby outputting the gate pulse through the first output node.

Each of the signal transmitters ST(n−1) to ST(n+2) alternately charges and discharges a first control node, which controls the first transistor TR1, and a second control node, which controls the second transistor TR2, at a predetermined time period.

The first transistor TR1 may be driven as the pull-up transistor during an odd-numbered unit time and may be driven as the pull-down transistor during an even-numbered unit time. The second transistor TR2 may be driven as the pull-up transistor during the even-numbered unit time and may be driven as the pull-down transistor during the odd-numbered unit time. Hereinafter, a first unit time may be interpreted as the odd-numbered unit time, and a second unit time may be interpreted as the even-numbered unit time.

Figure 3:
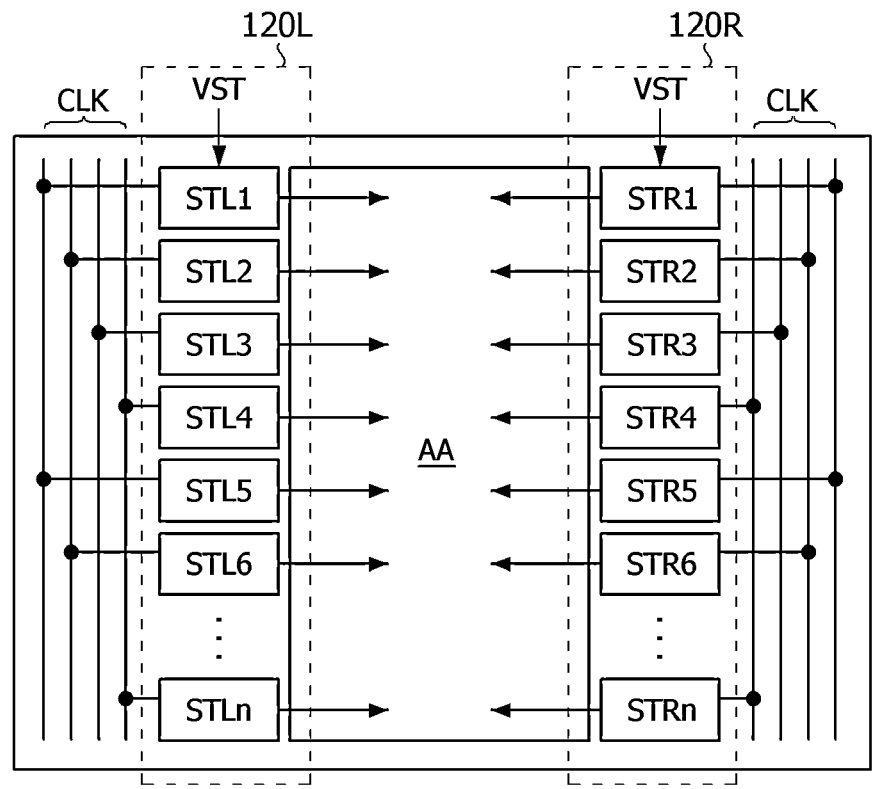
FIG. 3 is a view illustrating an example in which the shift register of the gate driving circuit is mounted on a display panel on which an input image is reproduced.

FIG. 3 is a view illustrating an example in which the shift register of the gate driving circuit is mounted on a display panel on which an input image is reproduced. The gate driving circuit may include a first gate driver 120L formed in a left bezel area of the display panel, and a second gate driver 120R formed in a right bezel area of the display panel. The first gate driver 120L and the second gate driver 120R may be separated on both sides with a pixel array AA of a screen, on which an input image is displayed, therebetween. Each of the first and second gate drivers 120L and 120R includes the shift register as illustrated in FIG. 1. In order to reduce the bezel area of the display panel, at least some of the circuit components of the first and second gate drivers may be disposed in the pixel array AA.

The gate pulses GOUT(n−1) to GOUT(n+2) sequentially output through the shift register of the gate driving circuit may be a scan pulse and an emission control pulse (hereinafter, referred to as an "EM pulse").

Signal transmitters STL1 to STLn and STR1 to STRn of the first gate driver 120L and the second gate driver 120R are connected to the same gate line. For example, an output node of a first signal transmitter STL1 of the first gate driver 120L may be connected to one side end of a first gate line, and an output node of a first signal transmitter STR1 of the second gate driver 120R may be connected to the other side end of the first gate line. An output node of an n-th signal transmitter STLn of the first gate driver 120L may be connected to one side end of an n-th gate line, and an output node of an n-th signal transmitter STRn of the second gate driver 120R may be connected to the other side end of the n-th gate line. The first and second gate drivers 120L and 120R operate in a double-feeding manner in which a gate signal is simultaneously applied to both side ends of the gate line. In addition, the first and second gate drivers 120L and 120R may reduce the stress of buffer transistors of the gate drivers 120L and 120R by driving the gate line in a single-feeding manner in which a gate signal is applied to one side end of the gate line, and then the gate signal is applied to the other side end of the gate line.

In the present disclosure, stress on the transistors TR1 and TR2 connected to one signal transmitter may be reduced by alternately driving the transistors TR1 and TR2 at a predetermined time period. In another embodiment of the present disclosure, by alternately driving a plurality of transistors connected to one signal transmitter, the stress of the transistors may be reduced.

Figure 4:
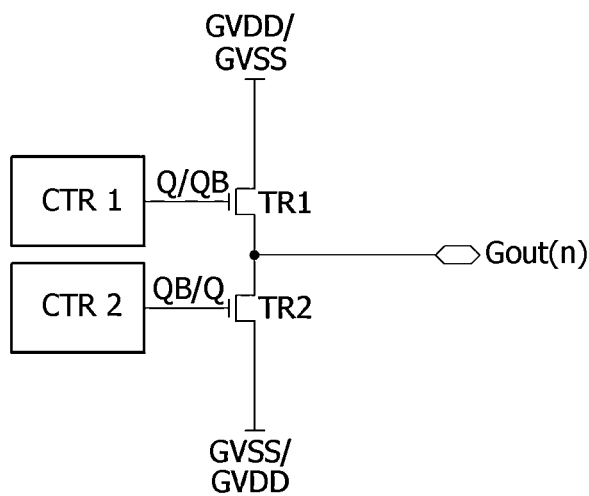
FIG. 4 is a view illustrating a configuration of a signal transmitter according to a first embodiment of the present disclosure.

FIG. 4 is a view illustrating a configuration of a signal transmitter according to a first embodiment of the present disclosure.

Referring to FIG. 4, a signal transmitter ST(n) according to the first embodiment of the present disclosure includes a first controller CTR1 configured to control a voltage of a first control node Q/QB and a second controller CTR2 configured to control a voltage of a second control node QB/Q, which are respectively connected to a first buffer transistor or a first transistor TR1 and a second buffer transistor or a second transistor TR2.

The first controller CTR1 charges the first control node Q/QB during a first unit time in which an activation clock is input to control the first transistor TR1 to be a pull-up transistor, and is deactivated during a second unit time in which a deactivation clock is input. The second controller CTR2 charges the second control node QB/Q during the second unit time in which the activation clock is input to control the second transistor TR2 to be the pull-up transistor, and is deactivated during the first unit time in which the deactivation clock is input. In FIG. 1, one of two shift clocks input to the signal transmitter may be the activation clock, and the other one thereof may be the deactivation clock.

The activation clock includes a plurality of pulses that swing between a high voltage and a low voltage during the unit time. The deactivation clock may allow the low voltage to be maintained during the unit time. A pulse voltage of the activation clock, that is, the high voltage, may be set as a gate-on voltage. The low voltage may be set as a gate-off voltage.

The first transistor TR1 operates as a pull-up transistor during the first unit time in which the first control node Q/QB is a pull-up control node Q(n). During the first unit time, the second control node QB/Q may be controlled to be a pull-down control node QB(n) by the second controller CTR2. During the first unit time, the second control node QB/Q is maintained at the gate reference voltage GVSS. In this case, the second transistor TR2 operates as a pull-down transistor.

The second transistor TR2 operates as a pull-up transistor during the second unit time in which the second control node QB/Q is the pull-up control node Q(n). During the second unit time, the first control node Q/QB may be controlled to be the pull-down control node QB(n) by the first controller CTR1. During the second unit time, the first control node Q/QB is maintained at the gate reference voltage GVSS. In this case, the first transistor TR1 operates as a pull-down transistor.

In this manner, the first and second transistors TR1 and TR2 are alternatively driven as a pull-up transistor at a predetermined period, but a time point at which buffer transistors in gate drivers disposed in bezel areas on both sides of a display panel are alternately driven is set differently, so that an output waveform applied to pixels can be stably maintained.

The alternate driving of the gate driver is performed in a vertical blanking time, but is not necessarily limited thereto, and when a data signal is not applied in a middle of a frame, the alternate driving of the gate driver may be applied even when the signal is changed for sensing a threshold voltage.

First, in the gate driver according to the first embodiment of the present disclosure, the stress of the pull-up transistors may be distributed by alternately driving the pull-up transistor and the pull-down transistor.

Figure 5:
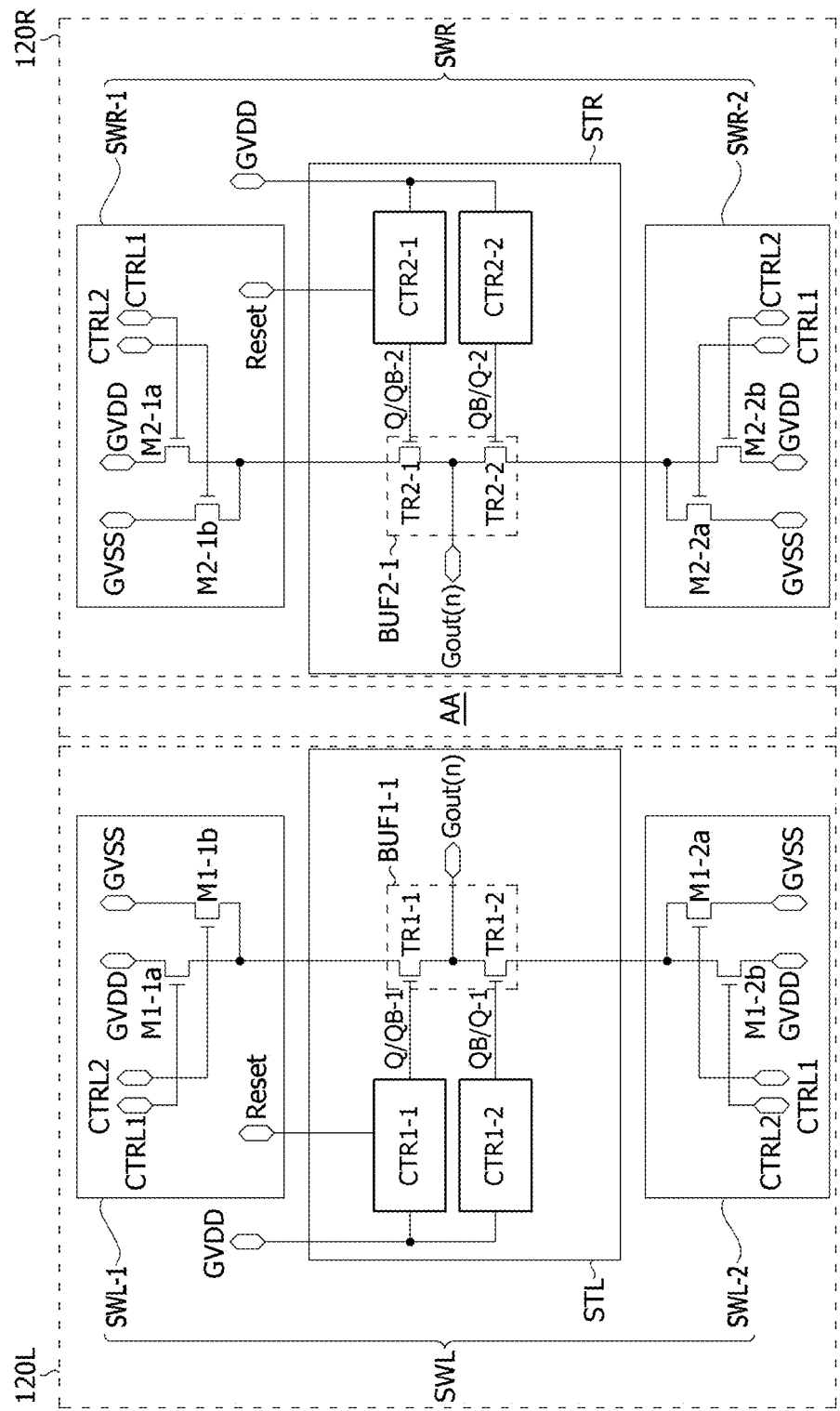
FIG. 5 is a view illustrating a schematic configuration of a gate driver according to the first embodiment of the present disclosure.

FIG. 5 is a view illustrating a schematic configuration of the gate driver according to the first embodiment of the present disclosure.

Referring to FIG. 5, the gate driver according to the first embodiment of the present disclosure may include a first gate driver composed of a first signal transmitter STL and a first switch part SWL, and a second gate driver composed of a second signal transmitter STR and a second switch part SWR. A pixel array AA of a screen on which an input image is displayed is disposed between the first gate driver 120L and the second gate driver 120R, but is omitted for convenience of description.

The first signal transmitter STL may be disposed in a left bezel area of the display panel, and may include a (1-1)th controller CTR1-1, a (1-2)th controller CTR1-2, and a (1-1)th buffer BUF1-1.

The (1-1)th controller CTR1-1 may control a voltage of a (1-1)th control node Q/QB-1, and the (1-2)th controller CTR1-2 may control a voltage of a (1-2)th control node QB/Q-1.

The (1-1)th buffer BUF1-1 may include a (1-1)th transistor TR1-1 and a (1-2)th transistor TR1-2. The (1-1)th transistor TR1-1 may operate as a pull-up transistor during the first unit time and may operate as a pull-down transistor during the second unit time. The (1-2)th transistor TR1-2 may operate as the pull-down transistor during the first unit time and may operate as the pull-up transistor during the second unit time.

The first switch part SWL may include a (1-1)th switch part SWL-1 and a (1-2)th switch part SWL-2. The (1-1)th switch part SWL-1 may include a (1-1a)th switch element M1-1a and a (1-1b)th switch element M1-1b. The (1-1a)th switch element M1-1a includes a gate electrode to which a first control signal CTRL1 is applied, a first electrode connected to a first power node GVDD, and a second electrode connected to a (1-1)th node. The (1-1b)th switch element M1-1b includes a gate electrode to which a second control signal CTRL2 is applied, a first electrode connected to a second power node GVSS, and a second electrode connected to the (1-1)th node. The (1-1)th node is connected to the second electrode of the (1-1a)th switch element M1-1a, the second electrode of the (1-1b)th switch element M1-1b, and a drain node of the (1-1)th transistor TR1-1.

The (1-2)th switch part SWL-2 may include a (1-2a)th switch element M1-2a and a (1-2b)th switch element M1-2b. The (1-2a)th switch element M1-2a includes a gate electrode to which the first control signal CTRL1 is applied, a first electrode connected to a (1-2)th node, and a second electrode connected to the second power node GVSS. The (1-2b)th switch element M1-2b includes a gate electrode to which the second control signal CTRL2 is applied, a first electrode connected to the (1-2)th node, and a second electrode connected to the first power node GVDD. The (1-2)th node is connected to the first electrode of the (1-2a)th switch element M1-2a, the first electrode of the (1-2b)th switch element M1-2b, and a source node of the (1-2)th transistor TR1-2.

At this point, the (1-1)th switch part SWL-1 and the (1-2)th switch part SWL-2 may respectively receive the first control signal CTRL1 and the second control signal CTRL2 from a timing controller.

Here, the first switch part SWL is illustrated as being connected only to the (1-1)th buffer BUF1-1, but may also be connected to a power node for applying a voltage to the (1-1)th control node Q/QB-1 and the (1-2)th control node QB/Q-1 in the (1-1)th controller CTR1-1.

The second signal transmitter STR may be disposed in a right bezel area of the display panel, and may include a (2-1)th controller CTR2-1, a (2-2)th controller CTR2-2, and a (2-1)th buffer BUF2-1.

The (2-1)th controller CTR2-1 may control a voltage of a (2-1)th control node Q/QB-2, and the (2-2)th controller CTR2-2 may control a voltage of a (2-2)th control node QB/Q-2.

The (2-1)th buffer BUF2-1 may include a (2-1)th transistor TR2-1 and a (2-2)th transistor TR2-2. The (2-1)th transistor TR2-1 may operate as the pull-up transistor during the first unit time and may operate as the pull-down transistor during the second unit time. The (2-2)th transistor TR2-2 may operate as the pull-down transistor during the first unit time and may operate as the pull-up transistor during the second unit time.

The second switch part SWR may include a (2-1)th switch part SWR-1 and a (2-2)th switch part SWR-2. The (2-1)th switch part SWR-1 may include a (2-1a)th switch element M2-1a and a (2-1b)th switch element M2-1b. The (2-1a)th switch element M2-1a includes a gate electrode to which the first control signal CTRL1 is applied, a first electrode connected to the first power node GVDD, and a second electrode connected to a (2-1)th node. The (2-1b)th switch element M2-1b includes a gate electrode to which the second control signal CTRL2 is applied, a first electrode connected to the second power node GVSS, and a second electrode connected to the (2-1)th node. The (2-1)th node is connected to the second electrode of the (2-1a)th switch element M2-1a, the second electrode of the (2-1b)th switch element M2-1b, and a drain node of the (2-1)th transistor TR2-1.

The (2-2)th switch part SWR-2 may include a (2-2a)th switch element M2-2a and a (2-2b)th switch element M2-2b. The (2-2a)th switch element M2-2a includes a gate electrode to which the first control signal CTRL1 is applied, a first electrode connected to a (2-2)th node, and a second electrode connected to the second power node GVSS. The (2-2b)th switch element M2-2b includes a gate electrode to which the second control signal CTRL2 is applied, a first electrode connected to the (2-2)th node, and a second electrode connected to the first power node GVDD. The (2-2)th node is connected to the first electrode of the (2-2a)th switch element M2-2a, the first electrode of the (2-2b)th switch element M2-2b, and a source node of the (2-2)th transistor TR2-2.

At this point, the (2-1)th switch part SWR-1 and the (2-2)th switch part SWR-2 may respectively receive the first control signal CTRL1 and the second control signal CTRL2 from the timing controller.

Here, the second switch part SWR is illustrated as being connected only to the (2-1)th buffer BUF2-1, but may also be connected to a power node for applying a voltage to the (2-1)th control node Q/QB-2 and the (2-2)th control node QB/Q-2 in the (2-1)th controller CTR2-1.

Figure 6A:
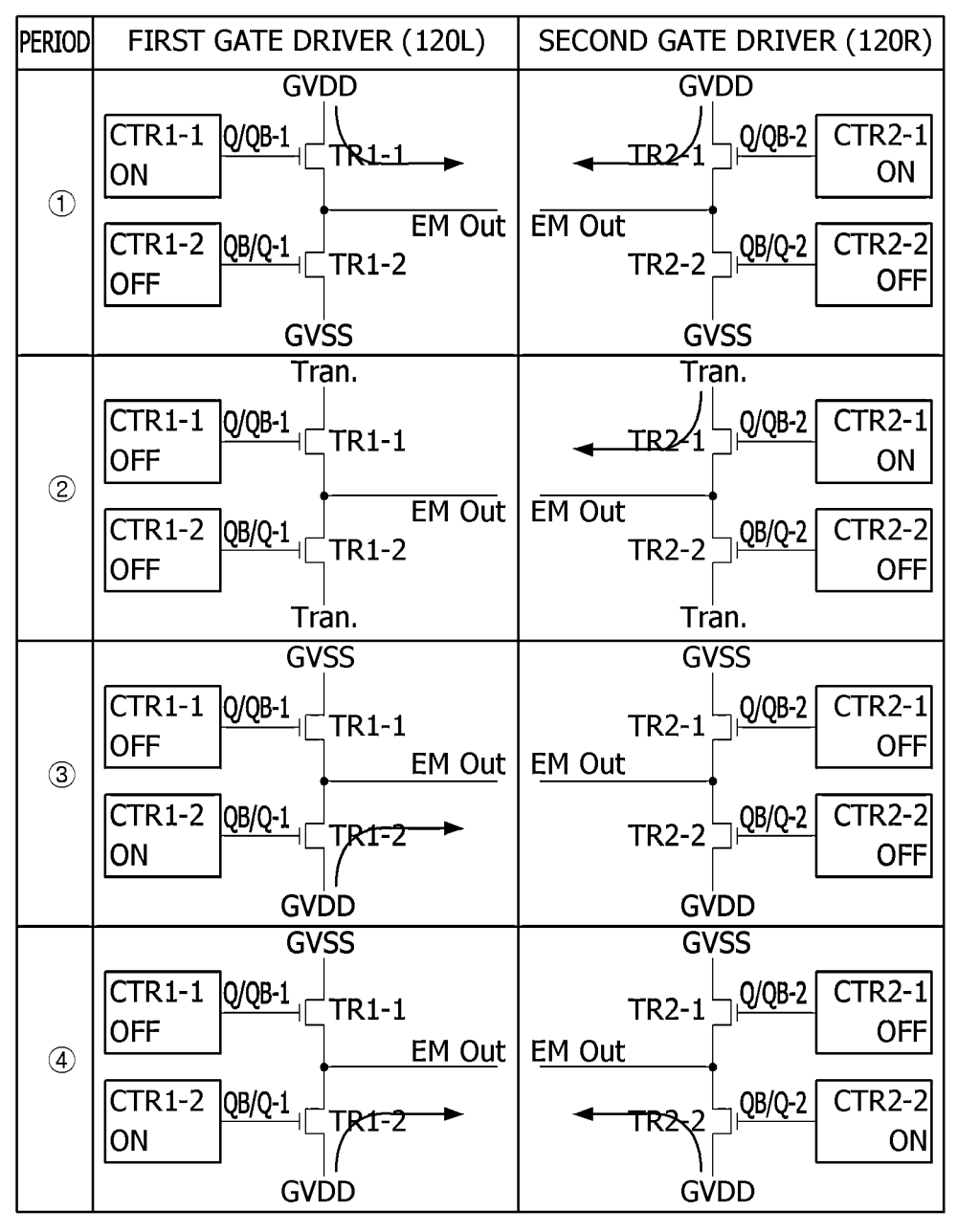
Figure 6B:
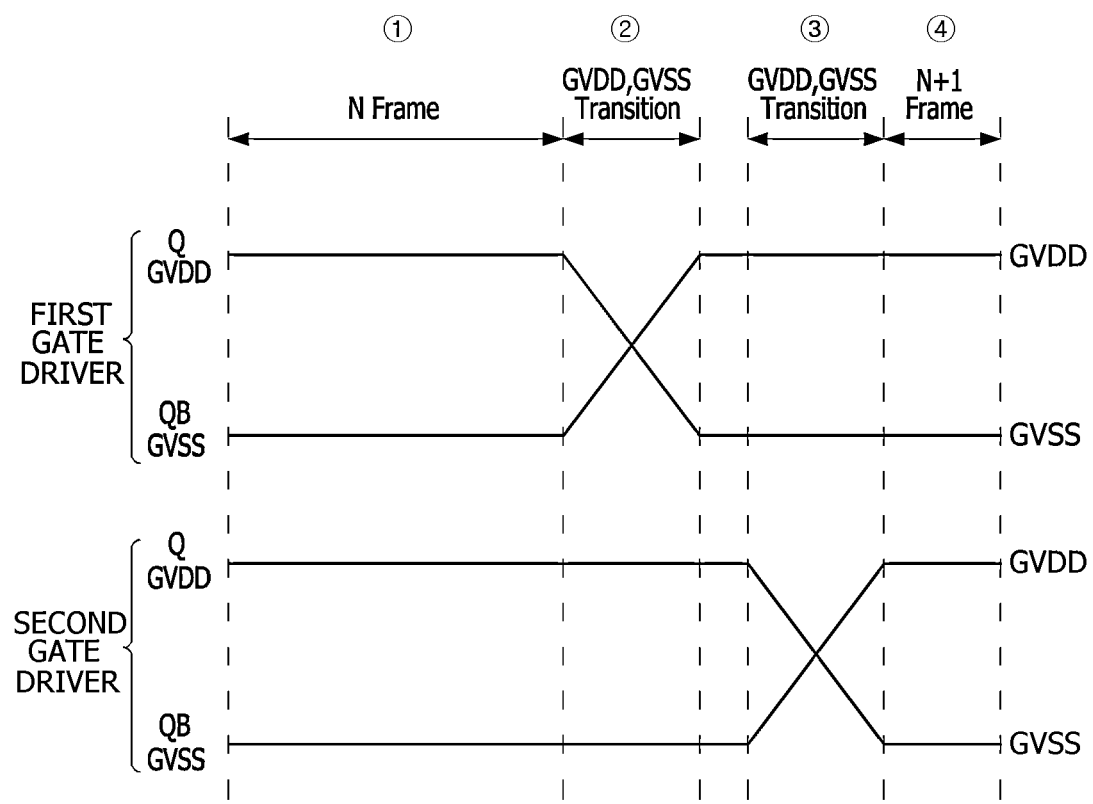

FIGS. 6A and 6B are views for describing an operation principle of the gate driver illustrated in FIG. 5.

Referring to FIGS. 5, 6A, and 6B, during a first process, that is, a first unit time ①, in the first gate driver 120L, the (1-1)th transistor TR1-1 may operate as the pull-up transistor (CTR1-1 ON), and the (1-2)th transistor TR1-2 may operate as the pull-down transistor (CTR1-2 OFF).

At this point, in the second gate driver 120R, the (2-1)th transistor TR2-1 may operate as the pull-up transistor, and the (2-2)th transistor TR2-2 may operate as the pull-down transistor.

That is, during the first unit time ①, both the first gate driver 120L and the second gate driver 120R are driven (double-feed) to generate an output so that an output waveform is maintained.

During a second process, that is, a first transition time ② after the first unit time, the (1-1)th control node Q/QB-1 of the first gate driver 120L may transition from the pull-up control node to the pull-down control node, and the (1-2)th control node QB/Q-1 may transition from the pull-down control node to the pull-up control node.

At this point, in the second gate driver 120R, the (2-1)th transistor TR2-1 may operate as the pull-up transistor, and the (2-2)th transistor TR2-2 may operate as the pull-down transistor.

That is, during the first transition time ②, even when the first gate driver 120L is not driven and thus no output is generated, the second gate driver 120R is driven (single-feed) so that the output waveform is maintained.

During a third process, that is, a second transition time ③ after the first transition time, the (2-1)th control node Q/QB-2 of the second gate driver 120R may transition from the pull-up control node to the pull-down control node, and the (2-2)th control node QB/Q-2 may transition from the pull-down control node to the pull-up control node.

At this point, in the first gate driver 120L, the (1-1)th transistor TR1-1 may operate as the pull-down transistor, and the (1-2)th transistor TR1-2 may operate as the pull-up transistor.

That is, during the second transition time ③, even when the second gate driver 120R is not driven and thus no output is generated, the first gate driver 120L is driven (single-feed) so that the output waveform is maintained.

During a fourth process, that is, a second unit time ④, in the first gate driver 120L, the (1-1)th transistor TR1-1 may operate as the pull-down transistor and the (1-2)th transistor TR1-2 may operate as the pull-up transistor.

At this point, in the second gate driver 120R, the (2-1)th transistor TR2-1 may operate as the pull-down transistor, and the (2-2)th transistor TR2-2 may operate as the pull-up transistor.

That is, during the second unit time ④, both the first gate driver 120L and the second gate driver 120R are driven (double-feed) to generate an output so that the output waveform is maintained.

The first gate driver may correspond to a first shift register and the second gate driver may correspond to a second shift register. In this case, in a first process, the gate signal is supplied from the first shift register to one side of an i-th gate line (i is a positive integer) and simultaneously supplied from the second shift register to the other side of the i-th gate line, in a second process following the first process, the gate signal is supplied from the second shift register to the other side of the i-th gate line, in a third process following the second process, the gate signal is supplied from the first shift register to one side of the i-th gate line, and in a fourth process following the third process, the gate signal is supplied from the first shift register to one side of the i-th gate line and simultaneously supplied from the second shift register to the other side of the i-th gate line.

In the first gate driver 120L, a transition between the pull-up control node and the pull-down control node may occur during the first transition time, and in the second gate driver 120R, a transition between the pull-up control node and the pull-down control node may occur during the second transition time, but the first transition time and the second transition time are set differently from each other without overlapping each other so that the output waveform is maintained. In the above-described embodiment, a hybrid driving method in which single-feeding and double-feeding are applied is used.

Figure 7:
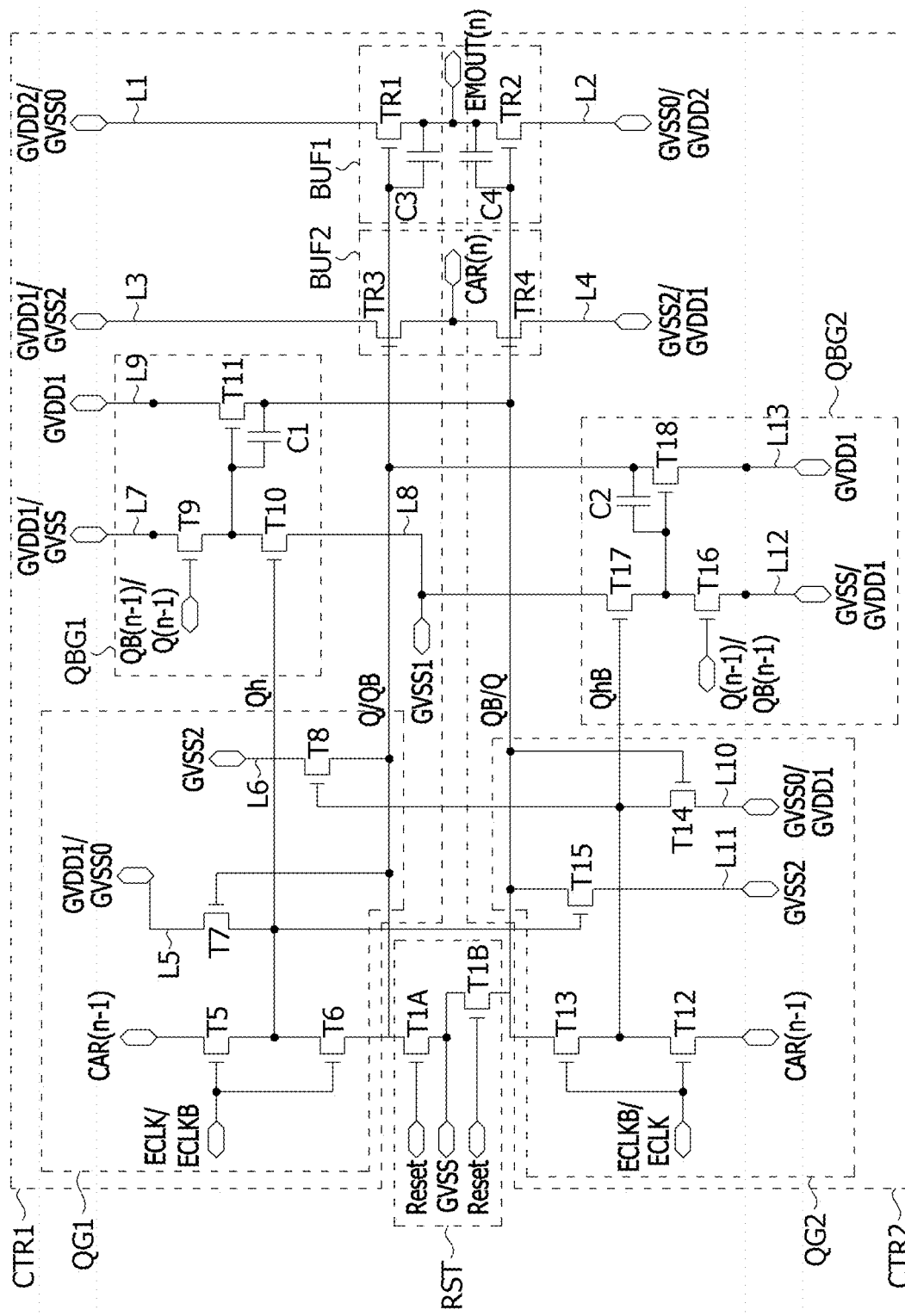
FIG. 7 is a circuit diagram illustrating the signal transmitter and a buffer illustrated in FIG. 4 in detail.

FIG. 7 is a circuit diagram illustrating the signal transmitter and the buffer illustrated in FIG. 4 in detail. In the embodiment illustrated in FIG. 7, a circuit of an n-th signal transmitter ST(n) configured to output an EM pulse and a buffer BUF connected to the signal transmitter ST(n) is exemplified, but the present disclosure is not limited thereto. For example, a scan pulse may be generated by using a circuit that is substantially the same as the circuit illustrated in FIG. 4 and using a clock that matches the scan pulse as a shift clock. The other signal transmitters other than the n-th signal transmitter ST(n) may be implemented using substantially the same circuit as the n-th signal transmitter ST(n). All transistors constituting the shift register may each be implemented as an n-channel oxide TFT.

Figure 8A:
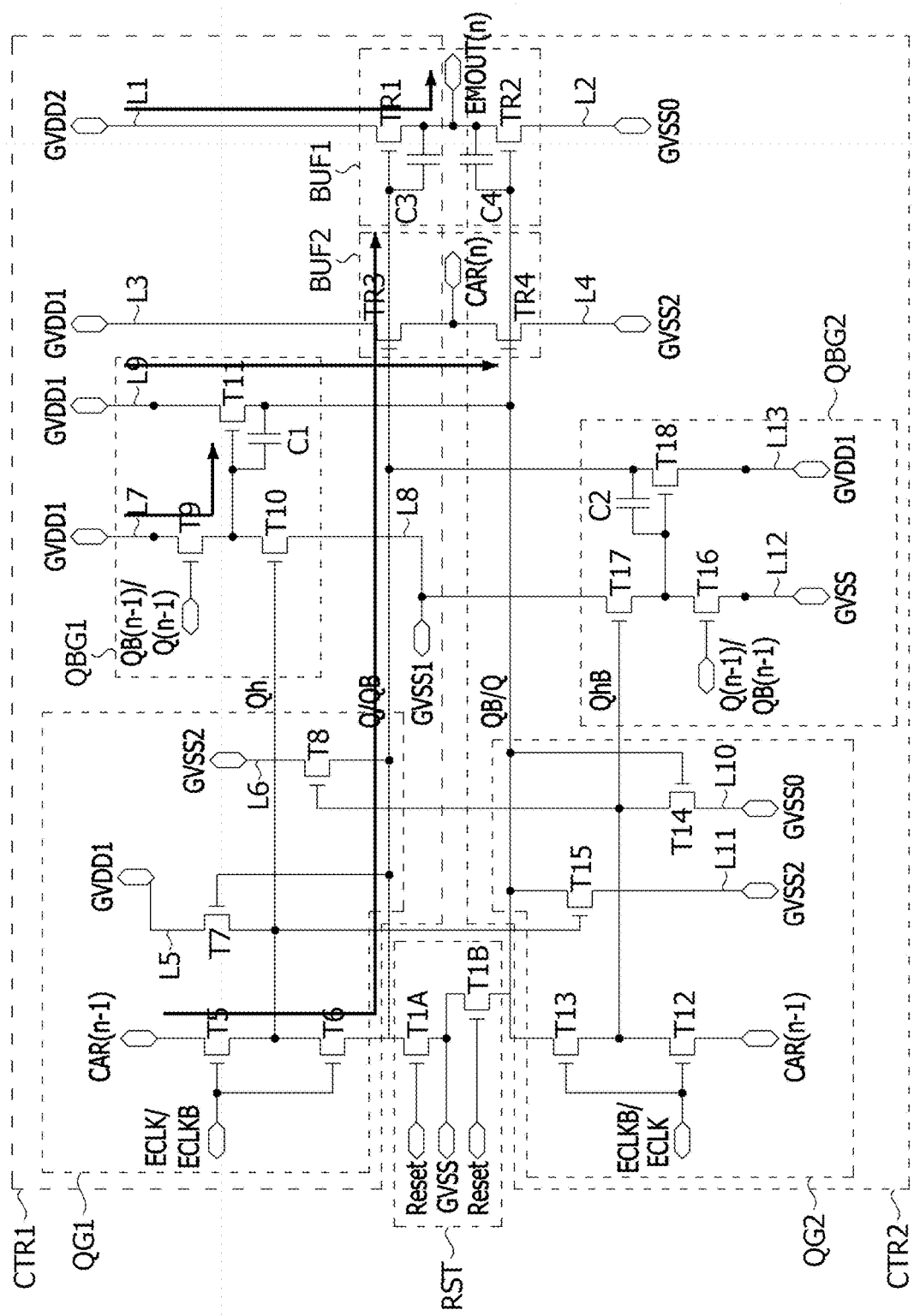
FIGS. 8A and 8B are circuit diagrams illustrating operations of a first unit time and a second unit time in the circuit illustrated in FIG. 7.
Figure 8B:
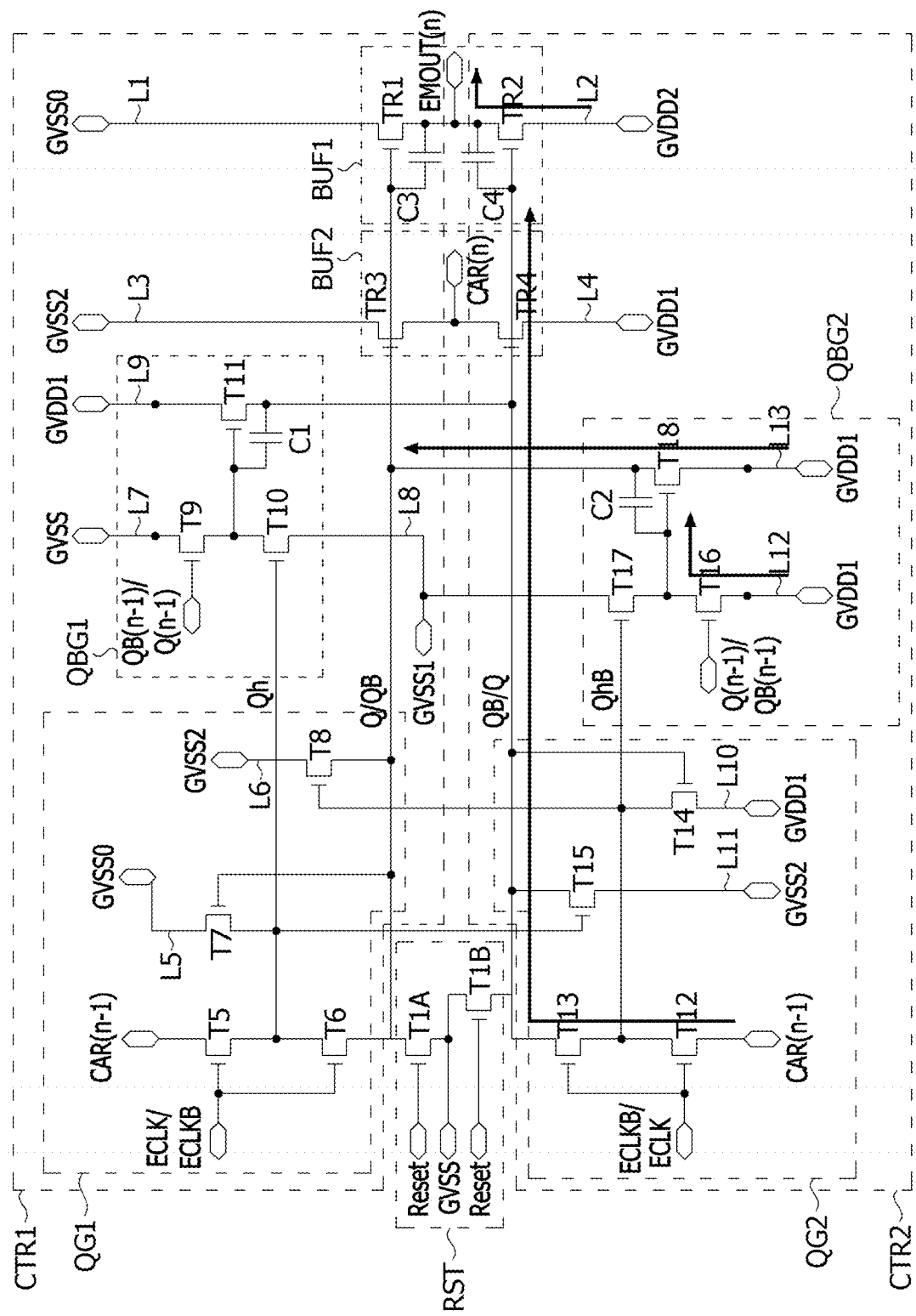

FIGS. 8A and 8B are circuit diagrams illustrating operations of the first unit time and the second unit time in the circuit illustrated in FIG. 7. FIG. 8A illustrates a current flow when the first control node Q/QB is controlled to be the pull-up control node Q(n) and the second control node QB/Q is controlled to be the pull-down control node QB(n) by the first controller CTR1 that is activated during the first unit time. FIG. 8B illustrates a current flow when the second control node QB/Q is controlled to be the pull-up control node Q(n) and the first control node Q/QB is controlled to be the pull-down control node QB(n) by the second controller CTR2 that is activated during the second unit time.

Referring to FIGS. 7, 8A, and 8B, the n-th signal transmitter ST(n) according to the embodiment of the present disclosure includes the first controller CTR1 and the second controller CTR2, which are respectively connected to first and second buffers BUF1 and BUF2. Here, gate driving voltages GVDD1 and GVDD2 may be set as different voltages, but the present disclosure is not limited thereto. Gate reference voltages GVSS, GVSS0, and GVSS2 may be set as different voltages, but the present disclosure is not limited thereto.

The first buffer BUF1 charges and discharges the first output node according to voltages of the first and second control nodes Q/QB and QB/Q to output an EM pulse EMOUT(n). The first buffer BUF1 includes first and second transistors TR1 and TR2. The first transistor TR1 includes a gate electrode connected to the first control node Q/QB, a first electrode connected to a first power node L1, and a second electrode connected to a first output node EMOUT(n). The second transistor TR2 is connected to the first transistor TR1 with the first output node EMOUT(n) therebetween. The second transistor TR2 includes a gate electrode connected to the second control node QB/Q, a first electrode connected to the first output node EMOUT(n), and a second electrode connected to a second power node L2. A voltage applied to each of the first power node L1 and the second power node L2 is switched between the gate driving voltage GVDD2 and the gate reference voltage GVSS0. For example, the gate reference voltage GVSS0 may be applied to the first power node L1 during the second unit time after the gate driving voltage GVDD2 is applied to the first power node L1 during the first unit time. In contrast, the gate driving voltage GVDD2 may be applied to the second power node L2 during the second unit time after the gate reference voltage GVSS0 is applied to the second power node L2 during the first unit time.

A third capacitor C3 may be connected between the gate electrode and the second electrode of the first transistor TR1. A fourth capacitor C4 may be connected between the gate electrode and the first electrode of the second transistor TR2.

The second buffer BUF2 charges and discharges the second output node according to the voltages of the first and second control nodes Q/QB and QB/Q to output a carry pulse CAR(n). The second buffer BUF2 includes third and fourth transistors TR3 and TR4. The third transistor TR3 includes a gate electrode connected to the first control node Q/QB, a first electrode connected to a third power node L3, and a second electrode connected to a second output node CAR(n). The fourth transistor TR4 is connected to the third transistor TR3 with the second output node CAR(n) therebetween. The fourth transistor TR4 includes a gate electrode connected to the second control node QB/Q, a first electrode connected to the second output node CAR(n), and a second electrode connected to a fourth power node L4. A voltage applied to each of the third power node L3 and the fourth power node L4 is switched between the gate driving voltage GVDD1 and the gate reference voltage GVSS2. For example, the gate reference voltage GVSS2 may be applied to the third power node L3 during the second unit time after the gate driving voltage GVDD1 is applied to the third power node L3 during the first unit time. In contrast, the gate driving voltage GVDD1 may be applied to the fourth power node L4 during the second unit time after the gate reference voltage GVSS2 is applied to the fourth power node L4 during the first unit time.

A power voltage applied to the first and second transistors may be periodically switched in at least one of the first buffers BUF1. A power voltage applied to the third and fourth transistors may be periodically switched in at least one of the second buffers BUF2.

The first controller CTR1 includes a first Q generation logic part QG1 and a first QB generation logic part QBG1.

As shown in FIG. 8A, in the first Q generation logic part QG1, during the first unit time, an activation clock ECLK is input to a first CLK node to charge the first control node Q/QB so that the first control node Q/QB is controlled to be the pull-up control node Q(n) and the second control node QB/Q is controlled to be the pull-down control node QB(n). The first Q generation logic part QG1 is deactivated during the second unit time in which a deactivation clock ECLKB is input to the first CLK node.

The first Q generation logic part QG1 may include fifth to eighth transistors T5 to T8.

The fifth transistor T5 is turned on during the first unit time, in which the activation clock ECLK is input to the first CLK node, to connect a carry signal node to a first buffer node Qh. A carry pulse CAR(n−1) is applied to the carry signal node. The carry pulse CAR(n−1) is output from a second output node of the previous signal transmitter, for example, the (n−1)th signal transmitter ST(n−1). The fifth transistor T5 includes a gate electrode connected to the first CLK node, a first electrode connected to the carry signal node, and a second electrode connected to the first buffer node Qh. The deactivation clock ECLKB is input to the first CLK node during the second unit time.

The sixth transistor T6 is turned on during the first unit time in which the activation clock ECLK is input to the first CLK node to connect the first buffer node Qh to the first control node Q/QB. The sixth transistor T6 includes a gate electrode connected to the first CLK node, a first electrode connected to the first buffer node Qh, and a second electrode connected to the first control node Q/QB.

The fifth and sixth transistors T5 and T6 are turned on in response to a high voltage VDD of the activation clock ECLK during the first unit time, in which the activation clock ECLK is applied to the first CLK node, to charge the first buffer node Qh and the first control node Q/QB. At this point, the first control node Q/QB is the pull-up control node Q(n). The fifth and sixth transistors T5 and T6 are maintained in an off state during the second unit time in which the deactivation clock ECLKB is input to the first CLK node.

The seventh transistor T7 is turned on when the first control node Q/QB is charged to the high voltage VDD, and connects a fifth power node L5 to the first buffer node Qh to charge the first buffer node Qh. In the fifth power node L5, the gate driving voltage GVDD1 is applied during the first unit time as shown in FIG. 8A, the gate reference voltage GVSS0 is applied during the second unit time as shown in FIG. 8B. The seventh transistor T7 includes a gate electrode connected to the first control node Q/QB, a first electrode connected to the fifth power node L5, and a second electrode connected to the first buffer node Qh.

The eighth transistor T8 is turned on when a voltage of a second buffer node QhB is the high voltage VDD, and connects a sixth power node L6 to the first control node Q/QB to discharge the first control node Q/QB. The gate reference voltage GVSS2 is applied to the sixth power node L6. The eighth transistor T8 includes a gate electrode connected to the second buffer node QhB, a first electrode connected to the sixth power node L6, and a second electrode connected to the first control node Q/QB.

As shown in FIG. 8A, in the first QB generation logic part QBG1, when the first control node Q/QB is discharged to a low voltage during the first unit time, the second control node QB/Q is charged so that the second control node QB/Q is controlled to be the pull-down control node QB(n).

The first QB generation logic part QBG1 may include ninth to eleventh transistors T9 to T11.

The ninth transistor T9 is turned on when a voltage of the second control node QB/Q of the signal transmitter in the previous stage, for example, the (n−1)th signal transmitter ST(n−1) is the high voltage VDD to connect a seventh power node L7 to a gate electrode of the eleventh transistor T11. In the seventh power node L7, the gate driving voltage GVDD1 is applied during the first unit time and the gate reference voltage GVSS is applied during the second unit time. The ninth transistor T9 includes a gate electrode connected to the second control node QB(n−1)/Q(n−1) of the signal transmitter in the previous stage, a first electrode connected to the seventh power node L7, and a second electrode connected to the gate electrode of the eleventh transistor T11.

The tenth transistor T10 is turned on when a voltage of the first buffer node Qh is the high voltage VDD to connect the gate electrode of the eleventh transistor T11 to an eighth power node L8. A gate reference voltage GVSS1 is applied to the eighth power node L8. The tenth transistor T10 includes a gate electrode connected to the first buffer node Qh, a first electrode connected to the gate electrode of the eleventh transistor T11, and a second electrode connected to the eighth power node L8.

The eleventh transistor T11 is turned on when a gate voltage is the high voltage VDD to connect a ninth power node L9 to the second control node QB/Q. The gate driving voltage GVDD1 is applied to the ninth power node L9. The eleventh transistor T11 includes a gate electrode connected to the second electrode of the ninth transistor T9 and the first electrode of the tenth transistor T10, a first electrode connected to the ninth power node L9, and a second electrode connected to the second control node QB/Q. A first capacitor C1 may be connected between the gate electrode and the second electrode of the eleventh transistor T11.

The second controller CTR2 includes a second Q generation logic part QG2 and a second QB generation logic part QBG2.

As shown in FIG. 8B, in the second Q generation logic part QG2, during the second unit time in which the activation clock ECLK is input to a second CLK node, the second control node QB/Q is charged so that the second control node QB/Q is controlled to be the pull-up control node Q(n) and the first control node Q/QB is controlled to be the pull-down control node QB(n). The second Q generation logic part QG2 is deactivated during the first unit time in which the deactivation clock ECLKB is input to the second CLK node.

The second Q generation logic part QG2 may include twelfth to fifteenth transistors T12 to T15.

The twelfth transistor T12 is turned on during the second unit time in which the activation clock ECLK is input to the second CLK node to connect the carry signal node to the second buffer node QhB. The carry pulse CAR(n−1) is applied to the carry signal node. The carry pulse CAR(n−1) is output from the second output node of the previous signal transmitter, for example, the (n−1)th signal transmitter ST(n−1). The twelfth transistor T12 includes a gate electrode connected to the second CLK node, a first electrode connected to the carry signal node, and a second electrode connected to the second buffer node QhB.

The thirteenth transistor T13 is turned on during the second unit time in which the activation clock ECLK is input to the second CLK node to connect the second buffer node QhB to the second control node QB/Q. The thirteenth transistor T13 includes a gate electrode connected to the second CLK node, a first electrode connected to the second buffer node QhB, and a second electrode connected to the second control node QB/Q.

The twelfth and thirteenth transistors T12 and T13 are turned on in response to the high voltage VDD of the activation clock ECLK during the second unit time, in which the activation clock ECLK is applied to the second CLK node, to charge the second buffer node QhB and the second control node QB/Q. At this point, the second control node QB/Q is the pull-up control node Q(n). The twelfth and thirteenth transistors T12 and T13 are maintained in an off state during the first unit time in which the deactivation clock ECLKB is input to the second CLK node.

The fourteenth transistor T14 is turned on when the second control node QB/Q is charged to the high voltage VDD, and connects a tenth power node L10 to the second buffer node QhB to charge the second buffer node QhB. In the tenth power node L10, the gate driving voltage GVDD1 is applied during the second unit time as shown in FIG. 8B and the gate reference voltage GVSS0 is applied during the first unit time as shown in FIG. 8A. The fourteenth transistor T14 includes a gate electrode connected to the second control node QB/Q, a first electrode connected to the tenth power node L10, and a second electrode connected to the second buffer node QhB.

The fifteenth transistor T15 is turned on when the voltage of the first buffer node Qh is the high voltage VDD, and connects an eleventh power node L11 to the second control node QB/Q to discharge the second control node QB/Q. The gate reference voltage GVSS2 is applied to the eleventh power node L11. The fifteenth transistor T15 includes a gate electrode connected to the first buffer node Qh, a first electrode connected to the eleventh power node L11, and a second electrode connected to the second control node QB/Q.

As shown in FIG. 8B, in the second QB generation logic part QBG2, when the second control node QB/Q is discharged to a low voltage VSS during the second unit time, the first control node Q/QB is charged so that the first control node Q/QB is controlled to be the pull-down control node Q(n).

The second QB generation logic part QBG2 may include sixteenth to eighteenth transistors T16 to T18.

The sixteenth transistor T16 is turned on when a voltage of the first control node Q/QB of the signal transmitter in the previous stage, for example, the (n−1)th signal transmitter ST(n−1) is the high voltage VDD to connect a twelfth power node L12 to a gate electrode of the eighteenth transistor T18. In the twelfth power node L12, the gate reference voltage GVSS is applied during the first unit time as shown in FIG. 8A, the gate driving voltage GVDD1 is applied during the second unit time as shown in FIG. 8B. The sixteenth transistor T16 includes a gate electrode connected to the first control node Q(n−1)/QB(n−1) of the signal transmitter in the previous stage, a first electrode connected to the twelfth power node L12, and a second electrode connected to the gate electrode of the eighteenth transistor T18.

The seventeenth transistor T17 is turned on when a voltage of the second buffer node QhB is the high voltage VDD to connect the gate electrode of the eighteenth transistor T18 to the eighth power node L8. The gate reference voltage GVSS1 is applied to the eighth power node L8. The seventeenth transistor T17 includes a gate electrode connected to the second buffer node QhB, a first electrode connected to the gate electrode of the eighteenth transistor T18, and a second electrode connected to the eighth power node L8.

The eighteenth transistor T18 is turned on when a gate voltage is the high voltage VDD to connect a thirteenth power node L13 to the first control node Q/QB. The gate driving voltage GVDD1 is applied to the thirteenth power node L13. The eighteenth transistor T18 includes the gate electrode connected to the second electrode of the sixteenth transistor T16 and the first electrode of the seventeenth transistor T17, a first electrode connected to the thirteenth power node L13, and a second electrode connected to the first control node Q/QB. A second capacitor C2 may be connected between the gate electrode and the second electrode of the eighteenth transistor T18.

At this point, in order to prevent a malfunction of the gate driver, the n-th signal transmitter ST(n) according to the embodiment of the present disclosure may further include a reset part RST so that the pull-up control node and the pull-down control node are discharged before the first transition time and the second transition time.

The reset part RST may include a 1A-th switch element T1A and a 1B-th switch element T1B.

The 1A-th switch element T1A may be turned on in response to a first reset signal Reset to discharge the pull-up control node. The 1A-th switch element T1A includes a gate electrode to which the first reset signal is applied, a first electrode connected to the pull-up control node, and a second electrode connected to a second power node.

The 1B-th switch element T1B may be turned on in response to a second reset signal Reset to discharge the pull-down control node. The 1B-th switch element T1B includes a gate electrode to which the second reset signal is applied, a first electrode connected to the second power node, and a second electrode connected to the pull-down control node.

Figure 9:
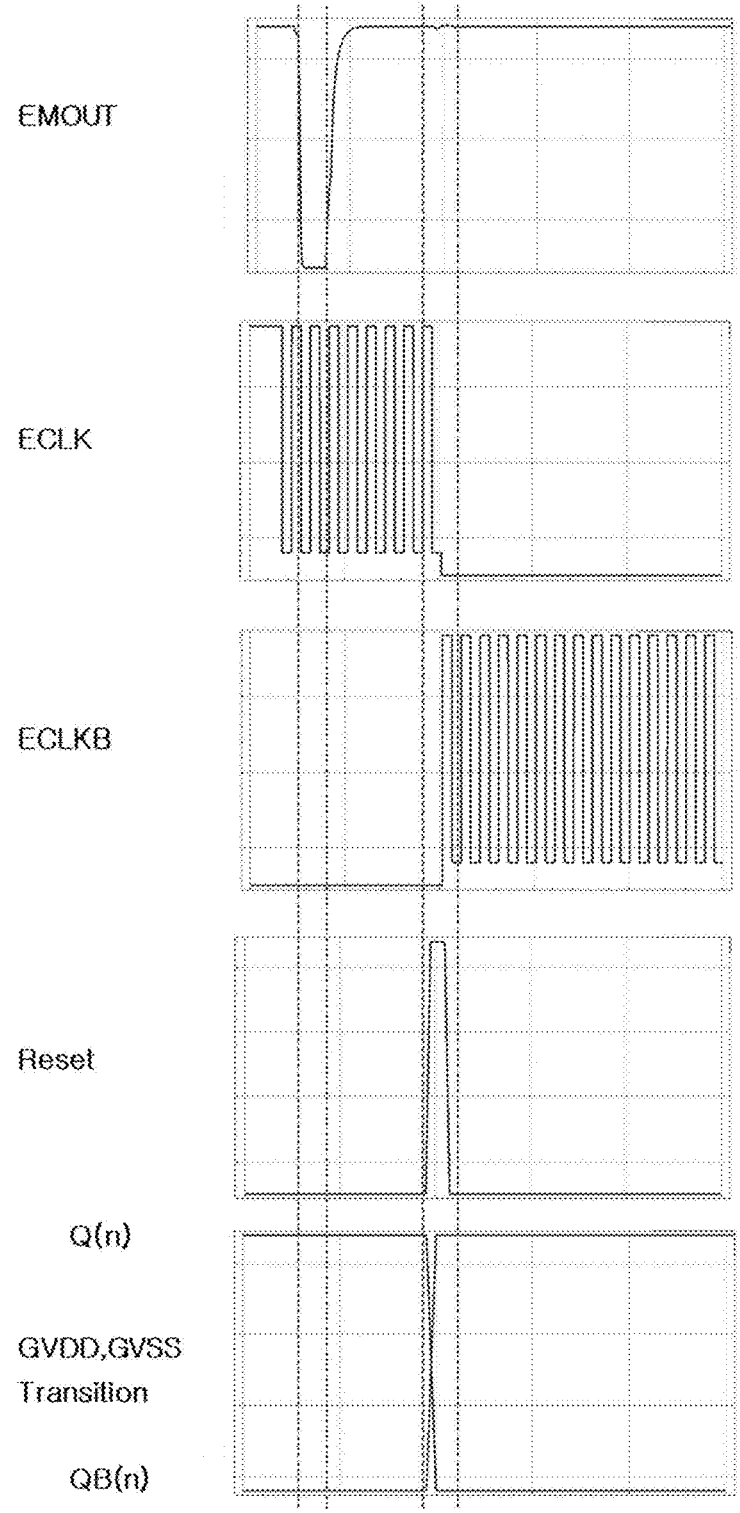
FIG. 9 is a set of simulation waveforms obtained by inputting a driving signal to the circuit illustrated in FIG. 7.
Figure 10:
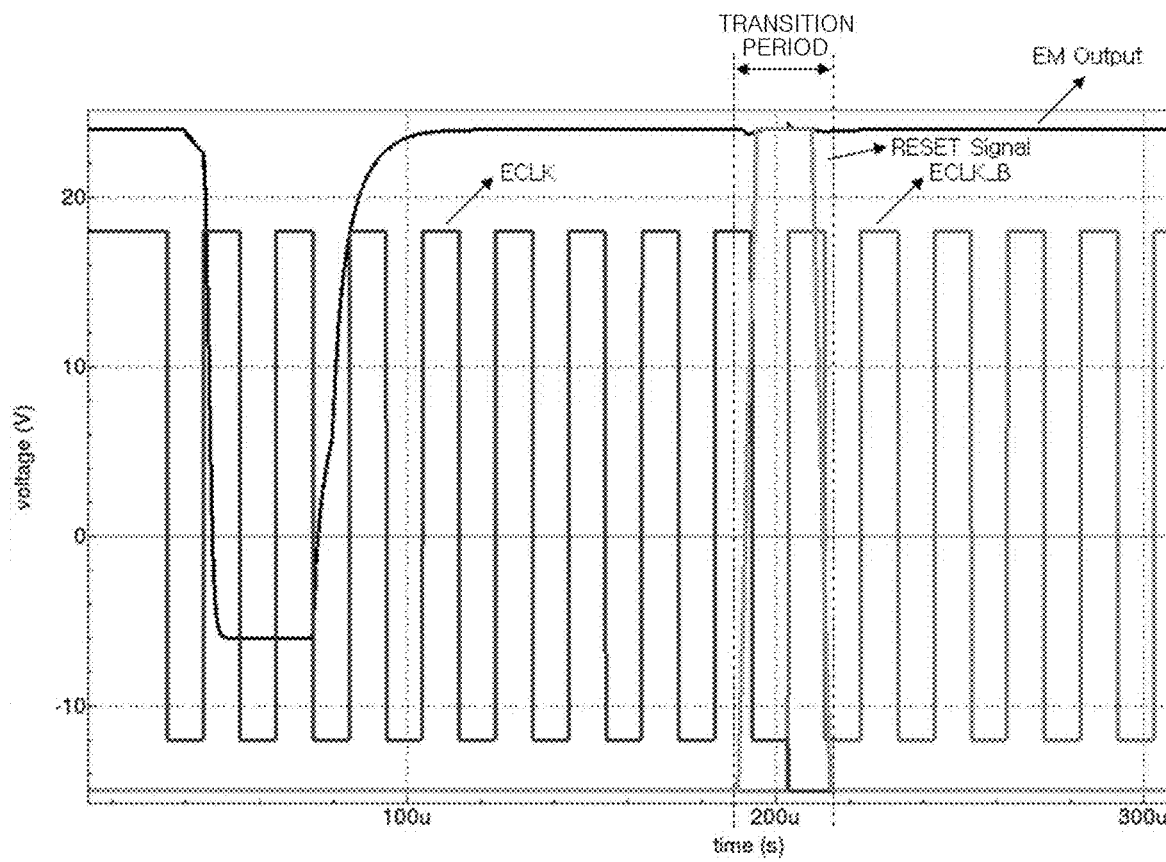
FIG. 10 is a view illustrating a simulation result obtained by applying the circuit illustrated in FIG. 7.

FIG. 9 is a set of simulation waveforms obtained by inputting a driving signal to the circuit illustrated in FIG. 7, and FIG. 10 is a view illustrating a simulation result obtained by applying the circuit illustrated in FIG. 7.

Referring to FIG. 9, "Q(n)" is a waveform of the pull-up control node and represents a voltage of the first control node Q/QB during the first unit time and a voltage of the second control node QB/Q during the second unit time.

In addition, "QB(n)" is a waveform of the pull-down control node and represents a voltage of the second control node QB/Q during the first unit time and a voltage of the first control node Q/QB during the second unit time.

Referring to FIG. 10, it is illustrated that the EM output waveform is being output normally even when a transition time is set between the first unit time and the second unit time and the first transistor and the second transistor are alternately driven as the pull-up transistor during the transition time.

Further, a gate driving circuit according to a second embodiment of the present disclosure may alternately drive two pull-up transistors to distribute the stress of the pull-up transistors.

Figure 11:
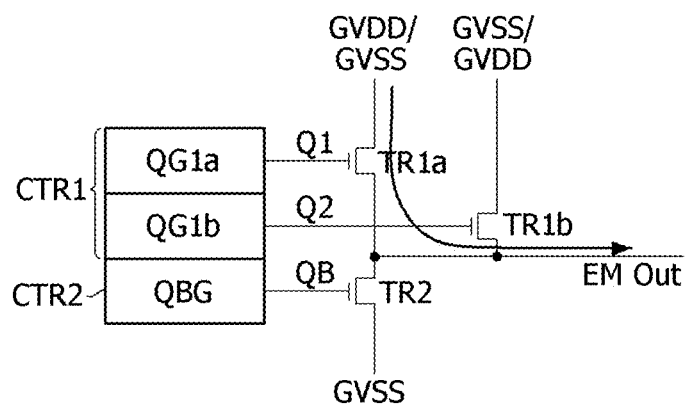
FIG. 11 is a view illustrating a configuration of a signal transmitter according to a second embodiment of the present disclosure.

FIG. 11 is a view illustrating a configuration of a signal transmitter according to the second embodiment of the present disclosure.

Referring to FIG. 11, a signal transmitter ST(n) according to the second embodiment of the present disclosure includes a 1a-th Q generation logic part QG1a configured to control a voltage of a 1a-th control node Q1, a 1b-th Q generation logic part QG1b configured to control a voltage of a 1b-th control node Q2, and a QB generation logic part QBG configured to control a voltage of a second control node QB, which are respectively connected to a 1a-th transistor TR1a, 1b-th transistor TR1b, and a second transistor TR2.

The 1a-th Q generation logic part QG1a charges the 1a-th control node Q1 during a first unit time in which an activation clock is input to control the 1a-th transistor TR1a to be a pull-up transistor, and is deactivated during a second unit time in which a deactivation clock is input. The 1b-th Q generation logic part QG1b charges the 1b-th control node Q2 during the second unit time in which the activation clock is input to control the 1b-th transistor TR1b to be the pull-up transistor, and is deactivated during the first unit time in which the deactivation clock is input.

The 1a-th transistor TR1a operates as the pull-up transistor during the first unit time in which the 1a-th control node Q1 is a pull-up control node Q(n). During the first unit time, the second control node QB is maintained at a gate reference voltage GVSS. In this case, the second transistor TR2 operates as a pull-down transistor.

The 1b-th transistor TR1b operates as the pull-up transistor during the second unit time in which the 1b-th control node Q2 is the pull-up control node Q(n). During the second unit time, the second control node QB is maintained at the gate reference voltage GVSS. In this case, the second transistor TR2 operates as the pull-down transistor.

Figure 12:
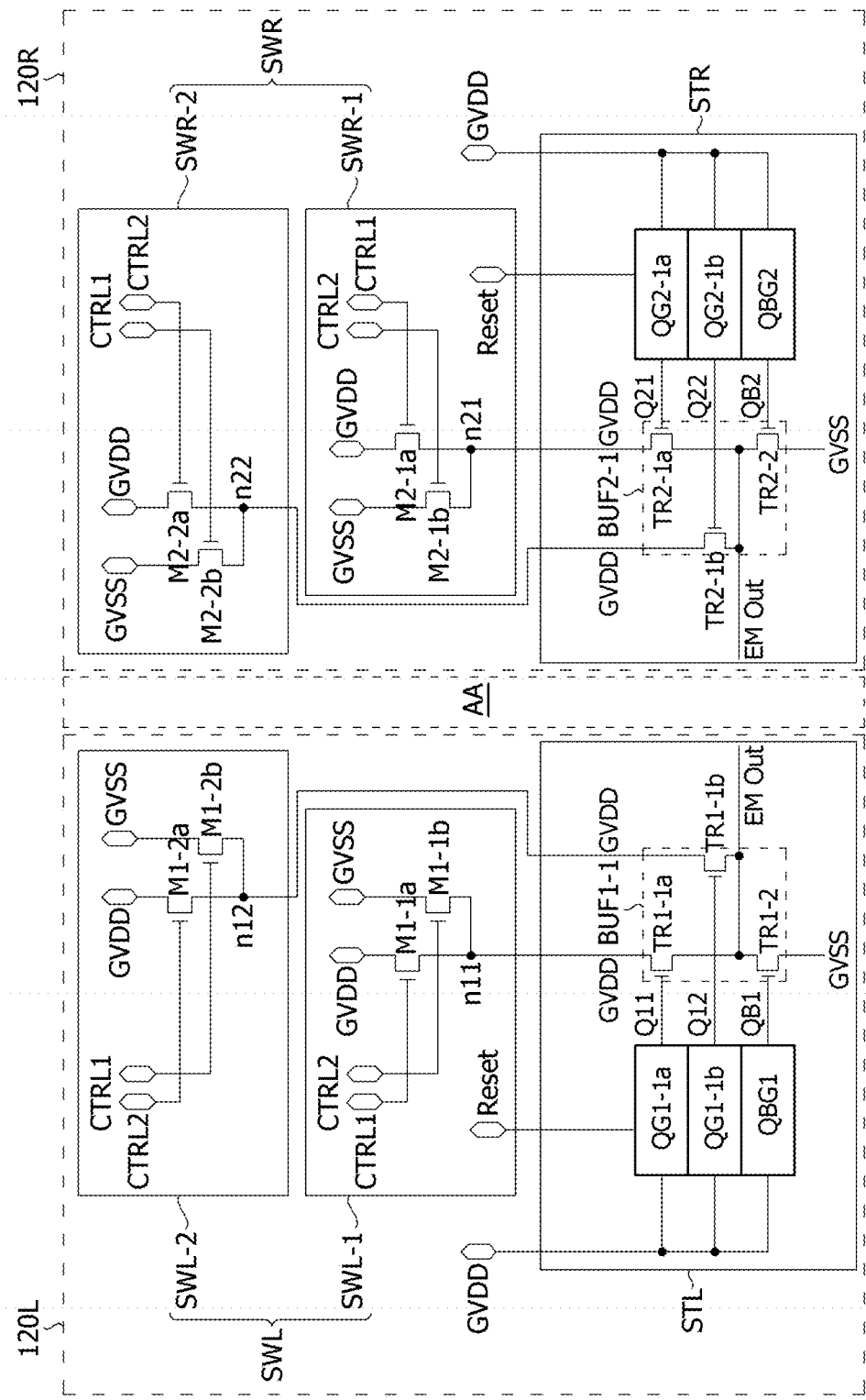
FIG. 12 is a view illustrating a schematic configuration of a gate driver according to the second embodiment of the present disclosure.

FIG. 12 is a view illustrating a schematic configuration of a gate driver according to the second embodiment of the present disclosure.

Referring to FIG. 12, the gate driver according to the second embodiment of the present disclosure may include a first signal transmitter STL, a second signal transmitter STR, a first switch part SWL, and a second switch part SWR. A pixel array AA is disposed between the first signal transmitter STL and the second signal transmitter STR, but is omitted for convenience of description.

The first signal transmitter STL may be disposed in a left bezel area of a display panel, and may include a (1-1a)th Q generation logic part QG1-1a, a (1-1b)th Q generation logic part QG1-1b, a (1-2)th QB generation logic part QBG1, and a (1-1)th buffer BUF1-1.

The (1-1a)th Q generation logic part QG1-1a may control a voltage of a (1-1a)th control node Q11, the (1-1b)th Q generation logic part QG1-1b may control a voltage of a (1-1b)th control node Q12, and the (1-2)th QB generation logic part QBG1 may control a voltage of a (1-2)th control node QB1.

The (1-1)th buffer BUF1-1 may include a (1-1a)th transistor TR1-1a, a (1-1b)th transistor TR1-1b, and a (1-2)th transistor TR1-2. The (1-1a)th transistor TR1-1a may operate as a pull-up transistor during the first unit time and may be turned off during the second unit time. The (1-1b)th transistor TR1-1b may be turned off during the first unit time and may operate as the pull-up transistor during the second unit time.

The first switch part SWL may include a (1-1)th switch part SWL-1 and a (1-2)th switch part SWL-2. The (1-1)th switch part SWL-1 may include a (1-1a)th switch element M1-1a and a (1-1b)th switch element M1-1b. The (1-1a)th switch element M1-1a includes a gate electrode to which a first control signal CTRL1 is applied, a first electrode connected to a first power node GVDD, and a second electrode connected to a (1-1)th node n11. The (1-1b)th switch element M1-1b includes a gate electrode to which a second control signal CTRL2 is applied, a first electrode connected to a second power node GVSS, and a second electrode connected to the (1-1)th node n11. The (1-1)th node n11 is connected to the second electrode of the (1-1a)th switch element M1-1a, the second electrode of the (1-1b)th switch element M1-1b, and a drain node of the (1-1a)th transistor TR1-1a.

The (1-2)th switch part SWL-2 may include a (1-2a)th switch element M1-2a and a (1-2b)th switch element M1-2b. The (1-2a)th switch element M1-2a includes a gate electrode to which the second control signal CTRL2 is applied, a first electrode connected to the first power node GVDD, and a second electrode connected to a (1-2)th node n12. The (1-2b)th switch element M1-2b includes a gate electrode to which the first control signal CTRL1 is applied, a first electrode connected to the second power node GVSS, and a second electrode connected to the (1-2)th node n12. The (1-2)th node n12 is connected to the second electrode of the (1-2a)th switch element M1-2a, the second electrode of the (1-2b)th switch element M1-2b, and a drain node of the (1-2)th transistor TR1-2. The second signal transmitter STR may be disposed in a right bezel area of the display panel, and may include a (2-1a)th Q generation logic part QG2-1a, a (2-1b)th Q generation logic part QG2-1b, a (2-2)th QB generation logic part QBG2, and a (2-1)th buffer BUF2-1.

The (2-1a)th Q generation logic part QG2-1a may control a voltage of a (2-1a)th control node Q21, the (2-1b)th Q generation logic part QG2-1b may control a voltage of a (2-1b)th control node Q22, and the (2-2)th QB generation logic part QBG2 may control a voltage of a (2-2)th control node QB2.

The (2-1)th buffer BUF2-1 may include a (2-1a)th transistor TR2-1a, a (2-1b)th transistor TR2-1b, and a (2-2)th transistor TR2-2. The (2-1a)th transistor TR2-1a may operate as the pull-up transistor during the first unit time and may be turned off during the second unit time. The (2-1b)th transistor TR2-1b may be turned off during the first unit time and may operate as the pull-up transistor during the second unit time.

The second switch part SWR may include a (2-1)th switch part SWR-1 and a (2-2)th switch part SWR-2. The (2-1)th switch part SWR-1 may include a (2-1a)th switch element M2-1a and a (2-1b)th switch element M2-1b. The (2-1a)th switch element M2-1a includes a gate electrode to which a first control signal CTRL1 is applied, a first electrode connected to the first power node GVDD, and a second electrode connected to a (2-1)th node n21. The (2-1b)th switch element M2-1b includes a gate electrode to which a second control signal CTRL2 is applied, a first electrode connected to the second power node GVSS, and a second electrode connected to the (2-1)th node n21. The (2-1)th node n21 is connected to the second electrode of the (2-1a)th switch element M2-1a, the second electrode of the (2-1b)th switch element M2-1b, and a drain node of the (2-1)th transistor TR2-1a.

The (2-2)th switch part SWR-2 may include a (2-2a)th switch element M2-2a and a (2-2b)th switch element M2-2b. The (2-2a)th switch element M2-2a includes a gate electrode to which the second control signal CTRL2 is applied, a first electrode connected to the first power node GVDD, and a second electrode connected to a (2-2)th node n22. The (2-2b)th switch element M2-2b includes a gate electrode to which the first control signal CTRL1 is applied, a first electrode connected to the second power node GVSS, and a second electrode connected to the (2-2)th node n22. The (2-2)th node n22 is connected to the second electrode of the (2-2a)th switch element M2-2a, the second electrode of the (2-2b)th switch element M2-2b, and a drain node of the (2-2)th transistor TR2-2.

Figure 13B:
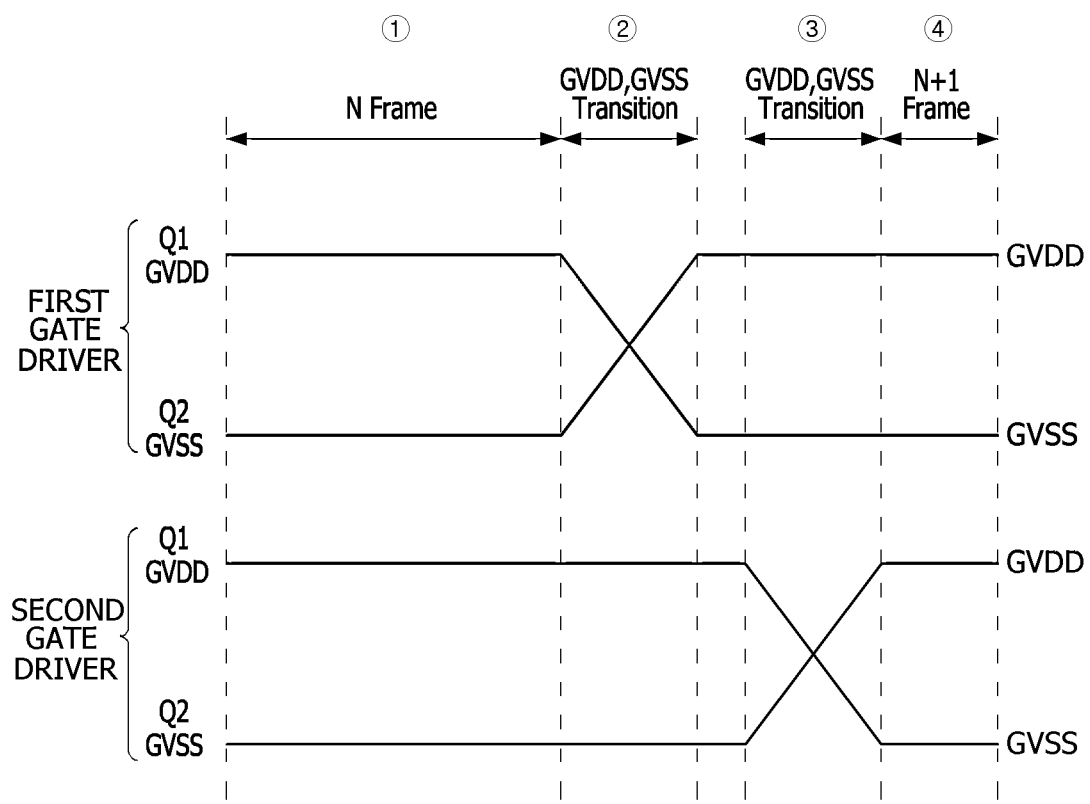

FIGS. 13A and 13B are views for describing an operation principle of the gate driver illustrated in FIG. 12.

Referring to FIGS. 12, 13A, and 13B, during a first process, that is, a first unit time ①, in the first gate driver 120L, the (1-1a)th transistor TR1-1a may operate as the pull-up transistor (QG1-1a ON), the (1-1b)th transistor TR1-1b may be deactivated (QG1-1b OFF), and the (1-2)th transistor TR1-2 may operate as the pull-down transistor.

At this point, in the second gate driver 120R, the (2-1a)th transistor TR2-1a may operate as the pull-up transistor, the (2-1b)th transistor TR2-1b may be deactivated, and the (2-2)th transistor TR2-2 may operate as the pull-down transistor.

That is, during the first unit time ①, both the first gate driver 120L and the second gate driver 120R are driven to generate an output so that an output waveform is maintained.

During a second process, that is, a first transition time ② after the first unit time, in the first gate driver 120L, the (1-1a)th control node Q11 may be discharged, and the (1-1b)th control node Q12 may be charged to transition to the pull-up control node.

At this point, in the second gate driver 120R, the (2-1a)th transistor TR2-1a may operate as the pull-up transistor, the (2-1b)th transistor TR2-1b may be deactivated, and the (2-2)th transistor TR2-2 may operate as the pull-down transistor.

That is, during the first transition time ②, even when the first gate driver 120L is not driven and thus no output is generated, the second gate driver 120R is driven so that the output waveform is maintained. "Tran" in FIG. 13A represents voltage inversion.

During a third process, that is, a second transition time ③ after the first transition time, in the second gate driver 120R, the (2-1a)th control node Q21 may be discharged, and the (2-1b)th control node Q22 may be charged to transition to the pull-up control node.

At this point, in the first gate driver 120L, the (1-1a)th transistor TR1-1a may be deactivated, the (1-1b)th transistor TR1-1b may operate as the pull-up transistor, and the (1-2)th transistor TR1-2 may operate as the pull-down transistor.

That is, during the second transition time ③, even when the second gate driver 120R is not driven and thus no output is generated, the first gate driver 120L is driven so that the output waveform is maintained.

During a fourth process, that is, a second unit time ④, in the first gate driver 120L, the (1-1a)th transistor TR1-1a may be deactivated, the (1-1b)th transistor TR1-1b may operate as the pull-up transistor, and the (1-2)th transistor TR1-2 may operate as the pull-down transistor.

At this point, in the second gate driver 120R, the (2-1a)th transistor TR2-1a may be deactivated, the (2-1b)th transistor TR2-1b may operate as the pull-up transistor, and the (2-2)th transistor TR2-2 may operate as the pull-down transistor.

That is, during the second unit time ④, both the first gate driver 120L and the second gate driver 120R are driven to generate an output so that the output waveform is maintained.

In the first gate driver 120L, two pull-up transistors may be alternately driven during the first transition time, and in the second gate driver 120R, two pull-up transistors may be alternately driven during the second transition time, but the first transition time and the second transition time are set differently from each other without overlapping each other so that the output waveform is maintained. In the above-described embodiment, a hybrid driving method in which single-feeding and double-feeding are applied is used.

Figure 14:
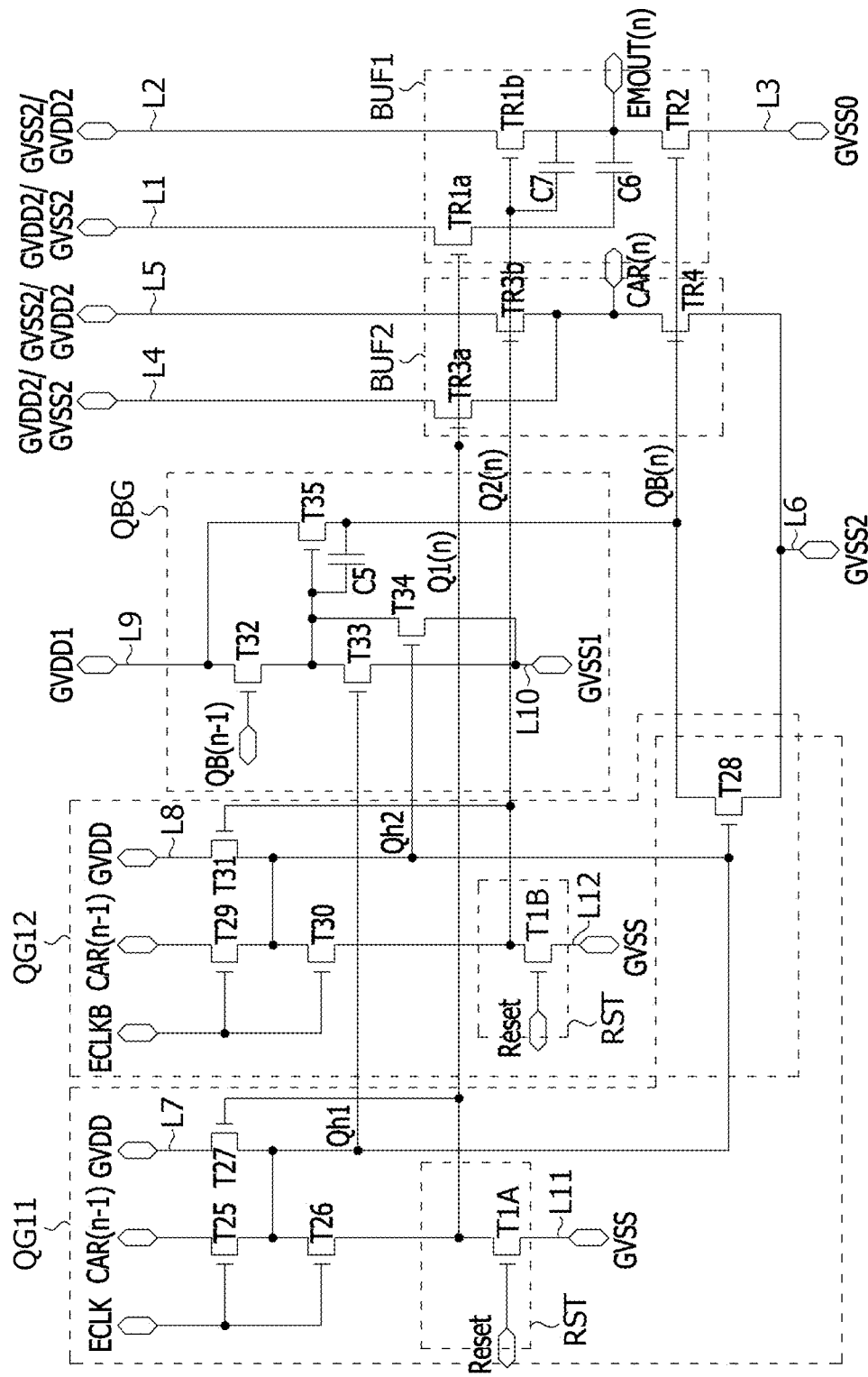
FIG. 14 is a circuit diagram illustrating the signal transmitter and a buffer illustrated in FIG. 11 in detail.
Figure 15A:
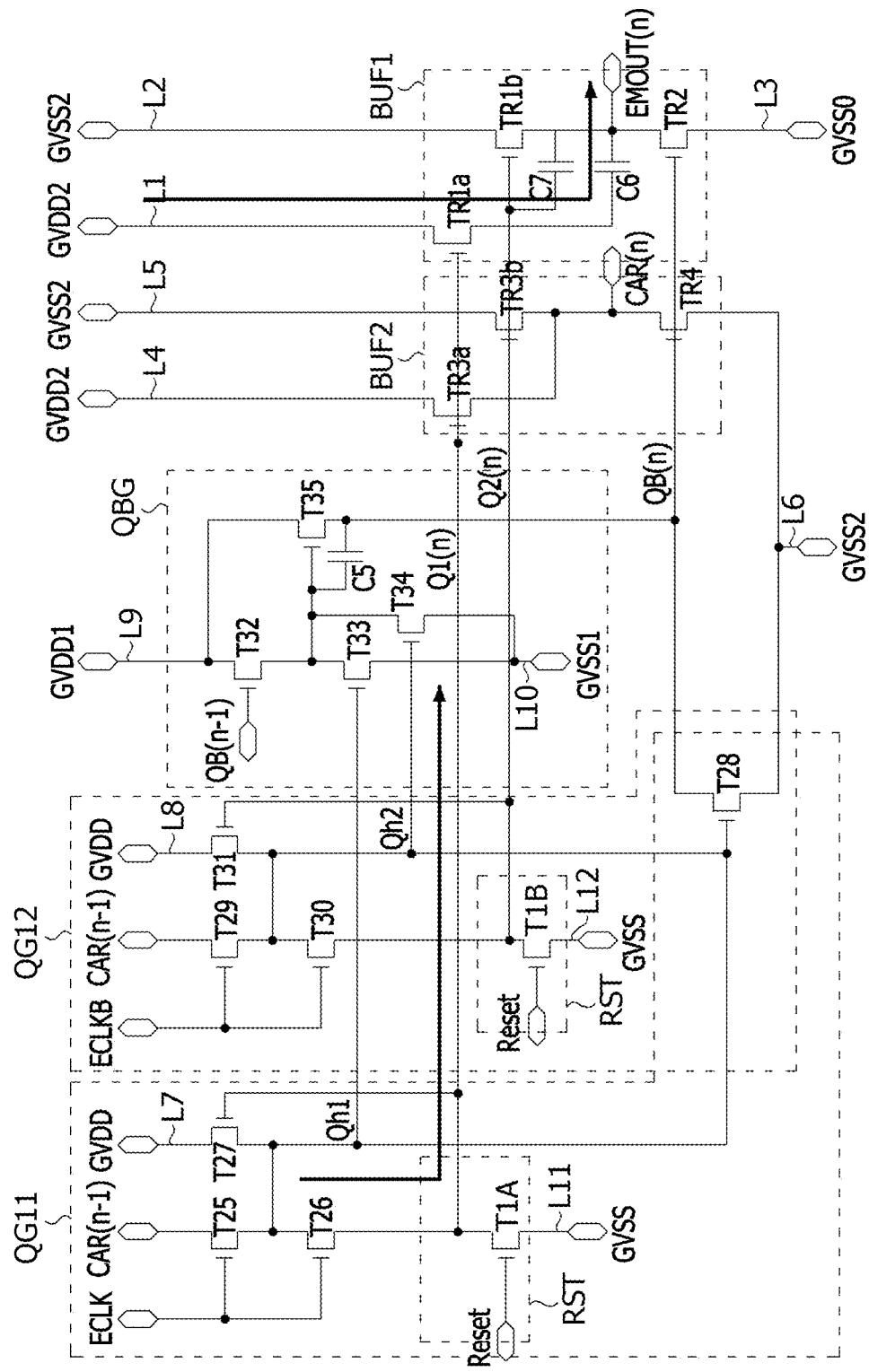
FIGS. 15A and 15B are circuit diagrams illustrating operations of a first unit time and a second unit time in the circuit illustrated in FIG. 14.
Figure 15B:
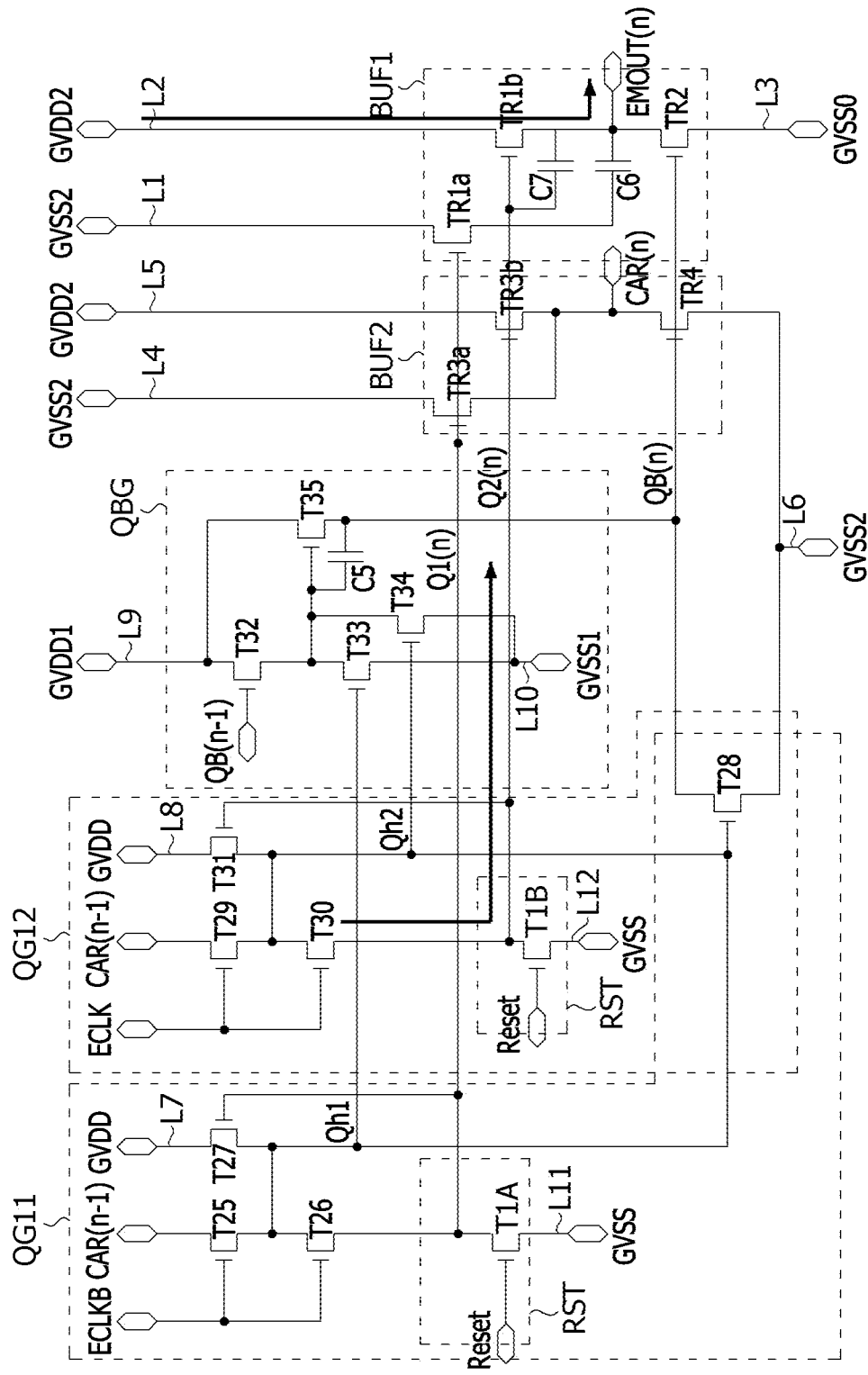

FIG. 14 is a circuit diagram illustrating the signal transmitter and the buffer illustrated in FIG. 11 in detail, and FIGS. 15A and 15B are circuit diagrams illustrating operations of the first unit time and the second unit time in the circuit illustrated in FIG. 14.

Referring to FIG. 14, an n-th signal transmitter ST(n) according to the embodiment of the present disclosure includes a 1a-th Q generation logic part QG11, a 1b-th Q generation logic part QG12, and a QB generation logic part QBG.

The 1a-th Q generation logic part QG11 drives a 1a-th transistor TR1a of a first buffer BUF1 by charging a first control node Q1(n) during a first unit time in which an activation clock ECLK is input. As shown in FIG. 15A, the 1a-th Q generation logic part QG11 may further drive a 3a-th transistor TR3a of a second buffer BUF2 during the first unit time. As shown in FIG. 15B, a deactivation clock ECLKB may be input during a second unit time so that the 1a-th Q generation logic part QG11 may be deactivated.

The 1b-th Q generation logic part QG12 and the 1a-th Q generation logic part QG11 are alternately activated, and charge a 1b-th control node Q2(n) to drive the 1b-th transistor TR1b. As shown in FIG. 15B, the 1b-th Q generation logic part QG12 drives the 1b-th transistor TR1b of the first buffer BUF1 during the second unit time in which the activation clock ECLK is input. The 1b-th Q generation logic part QG12 may further drive a 3b-th transistor TR3b of the second buffer BUF2 during the second unit time. As shown in FIG. 15A, the deactivation clock ECLKB may be input during the first unit time so that the 1b-th Q generation logic part QG12 may be deactivated.

The activation clock ECLK includes a plurality of pulses that swing between a high voltage and a low voltage during the unit time. The deactivation clock ECLKB is maintained at the low voltage during the unit time.

The QB generation logic part QBG drives pull-down transistors TR2 and TR4 by charging a second control node QB(n) during a pull-down time in which the 1a-th and 1b-th control nodes Q1(n) and Q2(n) are discharged. The QB generation logic part QBG may drive the pull-down transistors TR2 and TR4 of the buffer BUF in response to a voltage of a pull-down control node of a signal transmitter in a previous stage, for example, an (n−1)th signal transmitter ST(n−1).

The first buffer BUF1 charges and discharges a first output node to output an EM pulse EMOUT(n). The first buffer BUF1 includes the 1a-th and 1b-th pull-up transistors TR1a and TR1b alternately driven by the 1a-th and 1b-th Q generation logic parts QG11 and QG12, and a first pull-down transistor TR2 driven by the QB generation logic part QBG.

The 1a-th transistor TR1a includes a gate electrode connected to the 1a-th control node Q1(n), a first electrode connected to a first power node L1, and a second electrode connected to a first output node EMOUT(n). The 1b-th transistor TR1b includes a gate electrode connected to the 1b-th control node Q2(n), a first electrode connected to the second power node L2, and a second electrode connected to the first output node EMOUT(n). A gate driving voltage GVDD2 is applied to the first power node L1. A second capacitor C6 may be connected between the second electrode of the 1a-th transistor TR1a and the first output node EMOUT(n). A third capacitor C7 may be connected between the gate electrode and the second electrode of the 1b-th transistor TR1b.

The second transistor TR2 is connected to the 1a-th and 1b-th transistors TR1a and TR1b with the first output node EMOUT(n) therebetween. The second transistor TR2 includes a gate electrode connected to the second control node QB(n), a first electrode connected to the first output node EMOUT(n), and a second electrode connected to a third power node L3. A gate reference voltage GVSS0 is applied to the third power node L3. The second buffer BUF2 charges and discharges a second output node CAR(n) to output a carry pulse CAR(n). The second buffer BUF2 includes the 3a-th and 3b-th transistors TR3a and TR3b alternately driven by the 1a-th and 1b-th Q generation logic parts QG11 and QG12, and the fourth transistor TR4 driven by the QB generation logic part QBG.

The 3a-th transistor TR3a includes a gate electrode connected to the 1a-th control node Q1(n), a first electrode connected to the fourth power node L4, and a second electrode connected to the second output node CAR(n). The 3b-th transistor TR3b includes a gate electrode connected to the 1b-th control node Q2(n), a first electrode connected to the fifth power node L5, and a second electrode connected to the second output node CAR(n).

The fourth transistor TR4 is connected to the 3a-th and 3b-th transistors TR3a and TR3b with the second output node CAR(n) therebetween. The fourth transistor TR4 includes a gate electrode connected to the second control node QB(n), a first electrode connected to the second output node CAR(n), and a second electrode connected to the sixth power node L6.

The 1a-th Q generation logic part QG11 may include fifth to eighth transistors T25 to T28.

The fifth transistor T25 is turned on during the first unit time, in which the activation clock ECLK is input to a first CLK node, to connect a carry signal node to a first buffer node Qh1. A carry pulse CAR(n−1) from the signal transmitter in the previous stage is applied to the carry signal node. The carry pulse CAR(n−1) may be output from a second output node of the previous signal transmitter, for example, the (n−1)th signal transmitter ST(n−1). The fifth transistor T25 includes a gate electrode connected to the first CLK node, a first electrode connected to the carry signal node, and a second electrode connected to the first buffer node Qh1. The deactivation clock ECLKB is input to the first CLK node during the second unit time.

The sixth transistor T26 is turned on during the first unit time in which the activation clock ECLK is input to the first CLK node to connect the first buffer node Qh1 to the 1a-th control node Q1(n). The sixth transistor T26 includes a gate electrode connected to the first CLK node, a first electrode connected to the first buffer node Qh1, and a second electrode connected to the 1a-th control node Q1(n).

The fifth and sixth transistors T25 and T26 are turned on in response to a high voltage of the activation clock ECLK during the first unit time, in which the activation clock ECLK is applied to the first CLK node, to charge the first buffer node Qh1 and the 1a-th control node Q1(n). The fifth and sixth transistors T25 and T26 are maintained in an off state during the second unit time in which the deactivation clock ECLKB is input to the first CLK node.

The seventh transistor T27 is turned on when the 1a-th control node Q1(n) is charged to the high voltage, and connects a seventh power node L7 to the first buffer node Qh1 to charge the first buffer node Qh1. A gate driving voltage GVDD is applied to the seventh power node L7. The seventh transistor T27 includes a gate electrode connected to the 1a-th control node Q1(n), a first electrode connected to the seventh power node L7, and a second electrode connected to the first buffer node Qh1.

The eighth transistor T28 is turned on when a voltage of the first buffer node Qh1 or a second buffer node Qh2 is the high voltage, and connects the second control node QB(n) to a sixth power node L6 to discharge the second control node QB(n). A gate reference voltage GVSS2 is applied to the sixth power node L6. The eighth transistor T28 includes a gate electrode connected to the first and second buffer nodes Qh1 and Qh2, a first electrode connected to the second control node QB(n), and a second electrode connected to the sixth power node L6.

The eighth transistor T28 may be shared by the 1a-th Q generation logic part QG11 and the 1b-th Q generation logic part QG12.

The 1b-th Q generation logic part QG12 may include ninth to eleventh transistors T29 to T31.

The ninth transistor T29 is turned on during the second unit time, in which the activation clock ECLK is input to a second CLK node, to connect the carry signal node to the second buffer node Qh2. The carry pulse CAR(n−1) from the signal transmitter in the previous stage is applied to the carry signal node. The ninth transistor T29 includes a gate electrode connected to the second CLK node, a first electrode connected to the carry signal node, and a second electrode connected to the second buffer node Qh2. The deactivation clock ECLKB is input to the second CLK node during the first unit time.

The tenth transistor T30 is turned on during the second unit time, in which the activation clock ECLK is input to the second CLK node, to connect the second buffer node Qh2 to the 1b-th control node Q2(n). The tenth transistor T30 includes a gate electrode connected to the second CLK node, a first electrode connected to the second buffer node Qh2, and a second electrode connected to the 1b-th control node Q2(n).

The ninth and tenth transistors T29 and T30 are turned on in response to the high voltage of the activation clock ECLK during the second unit time, in which the activation clock ECLK is applied to the second CLK node, to charge the second buffer node Qh2 and the 1b-th control node Q2(n). The ninth and tenth transistors T29 and T30 are maintained in an off state during the first unit time in which the deactivation clock ECLKB is input to the second CLK node.

The eleventh transistor T31 is turned on when the 1b-th control node Q2(n) is charged to the high voltage, and connects an eighth power node L8 to the second buffer node Qh2 to charge the second buffer node Qh2. The gate driving voltage GVDD is applied to the eighth power node L8. The eleventh transistor T31 includes a gate electrode connected to the 1b-th control node Q2(n), a first electrode connected to the eighth power node L8, and a second electrode connected to the second buffer node Qh2.

The pull-up transistors TR1a, TR1b, TR3a, and TR3b are turned on in response to the voltages of the 1a-th and 1b-th control nodes Q1(n) and Q2(n), which are alternately charged during the first and second unit times, to charge the output nodes.

The QB generation logic part QBG charges the second control node QB(n) during the pull-down time. The pull-down transistors TR2 and TR4 are turned on when the second control node QB(n) is charged to the high voltage to discharge the output nodes to the gate reference voltages GVSS0 and GVSS2, respectively.

The QB generation logic part QBG may include twelfth to fifteenth transistors T32 to T35.

The twelfth transistor T32 is turned on when a pull-down control node QB(n−1) of the signal transmitter in the previous stage, for example, the (n−1)th signal transmitter ST(n−1), is at the high voltage, that is, at the pull-down time, and connects a ninth power node L9 to a gate electrode of the fifteenth transistor T35. A gate driving voltage GVDD1 is applied to the ninth power node L9. The twelfth transistor T32 includes a gate electrode connected to the pull-down control node QB(n−1) of the signal transmitter in the previous stage, a first electrode connected to the ninth power node L9, and a second electrode connected to the gate electrode of the fifteenth transistor T35.

The thirteenth transistor T33 is turned on when the voltage of the first buffer node Qh1 is the high voltage, that is, at the first unit time to connect the gate electrode of the fifteenth transistor T35 to a tenth power node L10. A gate reference voltage GVSS1 is applied to the tenth power node L10. The thirteenth transistor T33 includes a gate electrode connected to the first buffer node Qh1, a first electrode connected to the gate electrode of the fifteenth transistor T35, and a second electrode connected to the tenth power node L10.

The fourteenth transistor T34 is turned on when the voltage of the second buffer node Qh2 is the high voltage, that is, at the second unit time to connect the gate electrode of the fifteenth transistor T35 to the tenth power node L10. The fourteenth transistor T34 includes a gate electrode connected to the second buffer node Qh2, a first electrode connected to the gate electrode of the fifteenth transistor T35, and a second electrode connected to the tenth power node L10.

The fifteenth transistor T35 is turned on at the pull-down time, at which a gate voltage is the high voltage, and connects the ninth power node L9 to the pull-down control node QB(n) to charge the second control node QB(n). The fifteenth transistor T35 includes a gate electrode connected to the second electrode of the twelfth transistor T32 and the first electrodes of the thirteenth and fourteenth transistors T33 and T34, a first electrode connected to the ninth power node L9, and a second electrode connected to the pull-down control node QB(n). A first capacitor C5 may be connected between the gate electrode and the second electrode of the fifteenth transistor T35.

At this point, in order to prevent a malfunction of the gate driver, the n-th signal transmitter ST(n) according to the embodiment of the present disclosure may further include a reset part RST so that the first pull-up control node and the second pull-up control node are discharged before the first transition time and the second transition time.

The reset part RST may include a 1A-th switch element T1A and a 1B-th switch element T1B.

The 1A-th switch element T1A may be turned on in response to a first reset signal Reset to discharge the first pull-up control node. The 1A-th switch element T1A includes a gate electrode to which the first reset signal is applied, a first electrode connected to the first pull-up control node, and a second electrode connected to an eleventh power node L11.

The 1B-th switch element T1B may be turned on in response to a second reset signal Reset to discharge the second pull-up control node. The 1B-th switch element T1B includes a gate electrode to which the second reset signal is applied, a first electrode connected to the second pull-up control node, and a second electrode connected to a twelfth power node L12.

Figure 16:
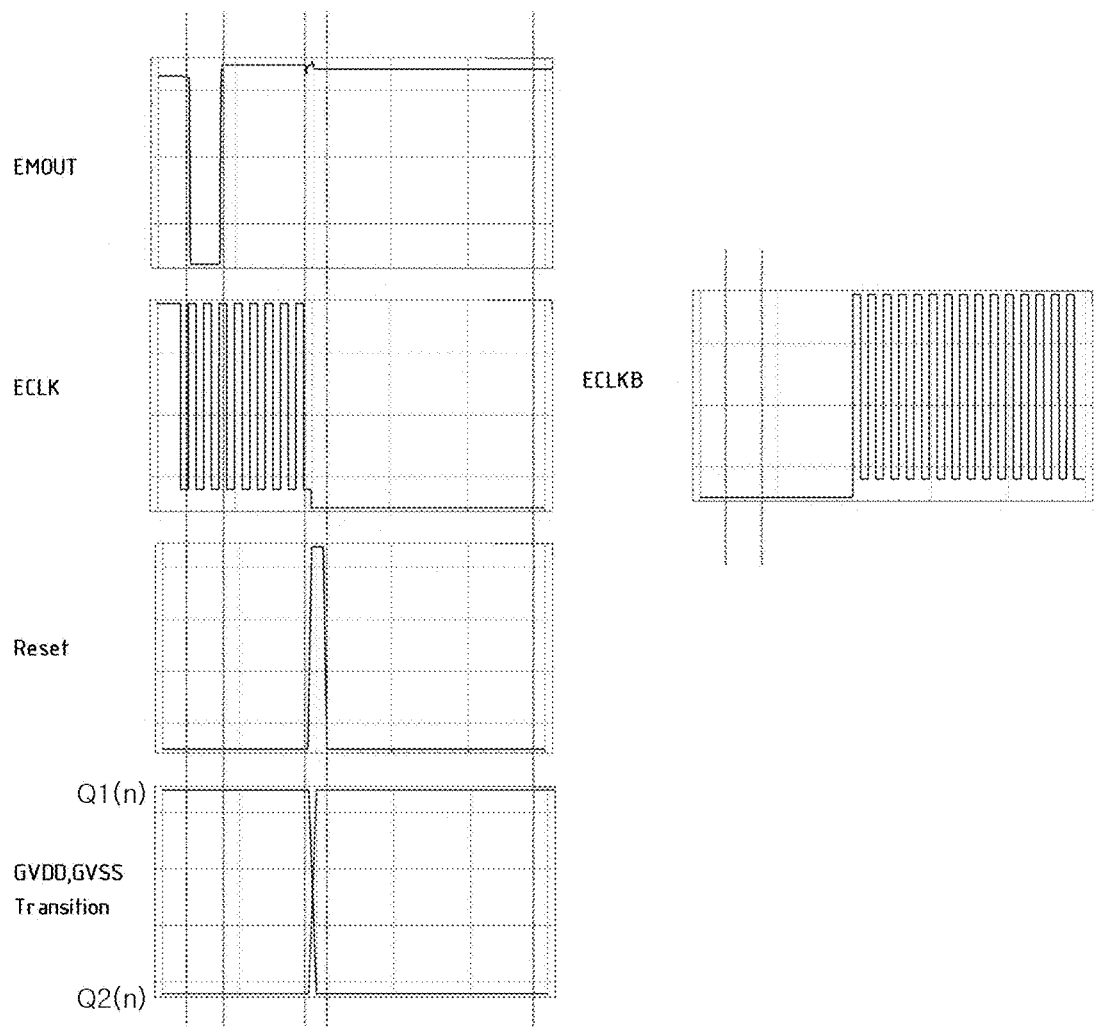
FIG. 16 is a set of simulation waveforms obtained by inputting a driving signal to the circuit illustrated in FIG. 14.

FIG. 16 is a set of simulation waveforms obtained by inputting a driving signal to the circuit illustrated in FIG. 14.

Referring to FIG. 16, "Q1(n)" is a waveform of the first pull-up control node and represents the voltage of the (1-1a)th control node Q1 during the first unit time and the voltage of the (1-1a)th control node Q1 during the second unit time.

In addition, "Q2(n)" is a waveform of the second pull-up control node and represents the voltage of the (1-1b)th control node Q2 during the first unit time and the voltage of the (1-1b)th control node Q2 during the second unit time.

Further, a gate driving circuit according to a third embodiment of the present disclosure may alternately drive two pull-down transistors to distribute the stress of the pull-down transistors. Since an output is made from the pull-up transistor, there is no significant influence on output characteristics, but the alternate driving of the pull-down transistors is necessary to secure stable output characteristics.

Figure 17:
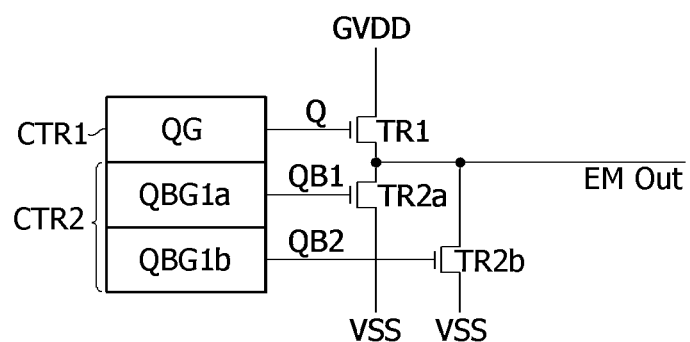
FIG. 17 is a view illustrating a configuration of a signal transmitter according to a third embodiment of the present disclosure.

FIG. 17 is a view illustrating a configuration of a signal transmitter according to the third embodiment of the present disclosure.

Referring to FIG. 17, a signal transmitter ST(n) according to the third embodiment of the present disclosure includes a Q generation logic part QG configured to control a voltage of a first control node Q, a 1a-th QB generation logic part QBG1a configured to control a voltage of a 2a-th control node QB1, and a 1b-th QB generation logic part QBG1b configured to control a voltage of a 2b-th control node QB2, which are respectively connected to a first transistor TR1, a 2a-th transistor TR2a, and a 2b-th transistor TR2b. The 1a-th QB generation logic part QBG1a charges the 2a-th control node QB1 during a first unit time in which an activation clock is input to control the 2a-th transistor TR2a to be a pull-down transistor, and is deactivated during a second unit time in which a deactivation clock is input. The 1b-th QB generation logic part QBG1b charges the 2b-th control node QB2 during the second unit time in which the activation clock is input to control the 2b-th transistor TR2b to be the pull-down transistor, and is deactivated during the first unit time in which the deactivation clock is input.

The 2a-th transistor TR2a operates as the pull-down transistor during the first unit time in which the 2a-th control node QB1 is a pull-down control node QB(n). During the first unit time, the first control node Q is maintained at a gate high voltage GVDD. At this point, the first transistor TR1 operates as a pull-up transistor.

The 2b-th transistor TR2b operates as the pull-down transistor during the second unit time in which the 2b-th control node QB2 is the pull-down control node QB(n). During the second unit time, the first control node Q is maintained at the gate high voltage GVDD. At this point, the first transistor TR1 operates as the pull-up transistor.

Figure 18:
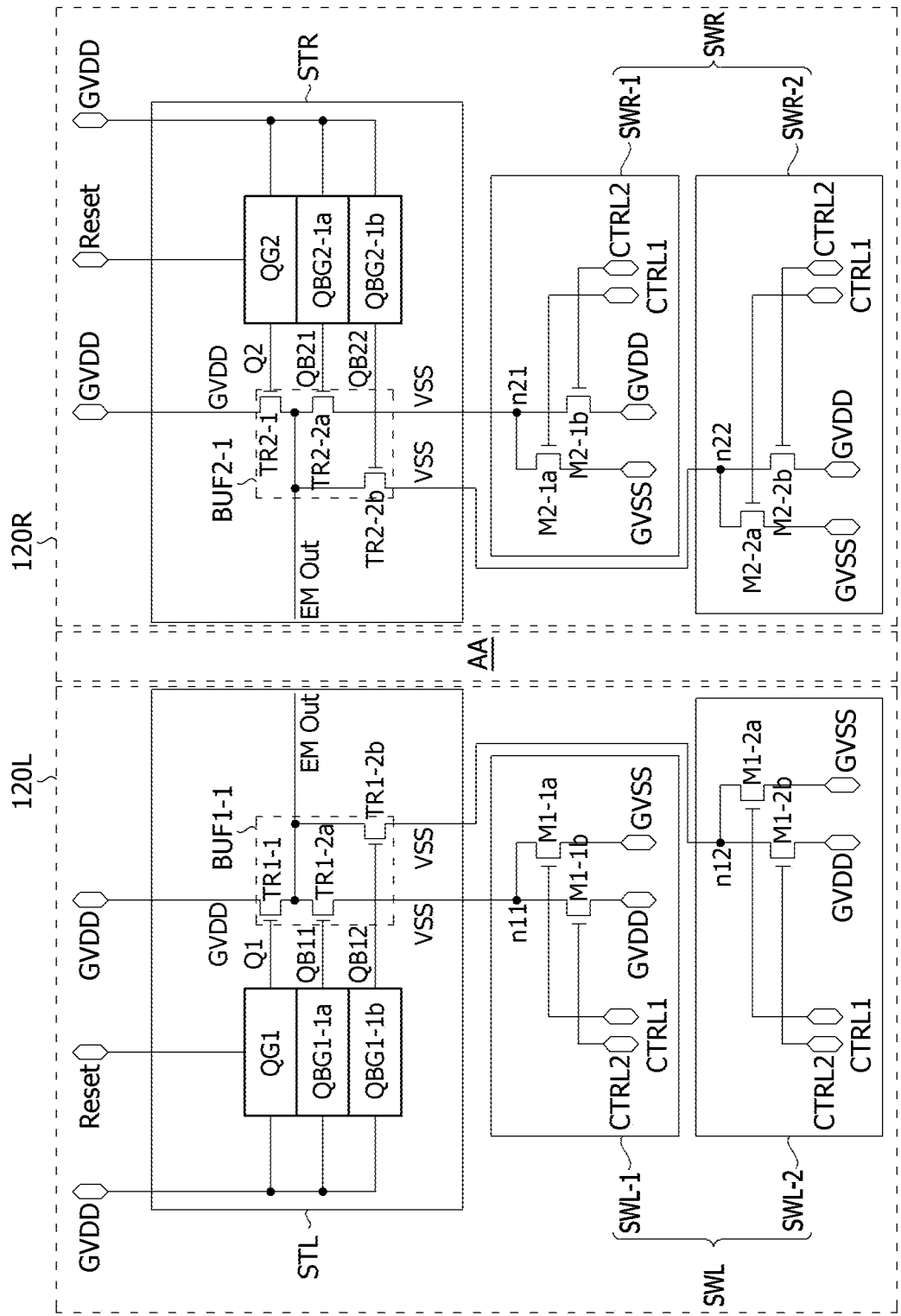
FIG. 18 is a view illustrating a schematic configuration of a gate driver according to the third embodiment of the present disclosure.

FIG. 18 is a view illustrating a schematic configuration of a gate driver according to the third embodiment of the present disclosure.

Referring to FIG. 18, the gate driver according to the third embodiment of the present disclosure may include a first signal transmitter STL, a second signal transmitter STR, a first switch part SWL, and a second switch part SWR. A pixel array AA is disposed between the first signal transmitter STL and the second signal transmitter STR, but is omitted for convenience of description.

The first signal transmitter STL may be disposed in a left bezel area of a display panel, and may include a first Q generation logic part QG1, a (1-1a)th QB generation logic part QBG1-1a, a (1-1b)th QB generation logic part QBG1-1b, and a (1-1)th buffer BUF1-1. The first Q generation logic part QG1 may control a voltage of a (1-1)th control node Q1, the (1-1a)th QB generation logic part QBG1-1a may control a voltage of a (1-2a)th control node QB11, and the (1-1b)th QB generation logic part QBG1-1b may control a voltage of a (1-2b)th control node QB12.

The (1-1)th buffer BUF1-1 may include a (1-1)th transistor TR1-1, a (1-2a)th transistor TR1-2a, and a (1-2b)th transistor TR1-2b. The (1-1)th transistor TR1-1 may operate as the pull-up transistor. The (1-2a)th transistor TR1-2a may operate as the pull-down transistor during the first unit time and may be deactivated during the second unit time. The (1-2b)th transistor TR1-2b may be deactivated during the first unit time and may operate as the pull-down transistor during the second unit time.

The first switch part SWL may include a (1-1)th switch part SWL-1 and a (1-2)th switch part SWL-2. The (1-1)th switch part SWL-1 may include a (1-1a)th switch element M1-1a and a (1-1b)th switch element M1-1b. The (1-1a)th switch element M1-1a includes a gate electrode to which a first control signal CTRL1 is applied, a first electrode connected to a (1-1)th node n11, and a second electrode connected to a second power node GVSS. The (1-1b)th switch element M1-1b includes a gate electrode to which a second control signal CTRL2 is applied, a first electrode connected to the (1-1)th node n11, and a second electrode connected to a first power node GVDD. The (1-1)th node n11 is connected to the first electrode of the (1-1a)th switch element M1-1a, the first electrode of the (1-1b)th switch element M1-1b, and a source node of the (1-2a)th transistor TR1-2a.

The (1-2)th switch part SWL-2 may include a (1-2a)th switch element M1-2a and a (1-2b)th switch element M1-2b. The (1-2a)th switch element M1-2a includes a gate electrode to which the first control signal CTRL1 is applied, a first electrode connected to a (1-2)th node n12, and a second electrode connected to the second power node GVSS. The (1-2b)th switch element M1-2b includes a gate electrode to which the second control signal CTRL2 is applied, a first electrode connected to the (1-2)th node n12, and a second electrode connected to the first power node GVDD. The (1-2)th node n12 is connected to the first electrode of the (1-2a)th switch element M1-2a, the first electrode of the (1-2b)th switch element M1-2b, and a source node of the (1-2b)th transistor TR1-2b.

The second signal transmitter STR may be disposed in a right bezel area of the display panel, and may include a second Q generation logic part QG2, a (2-1a)th QB generation logic part QBG2-1a, a (2-1b)th QB generation logic part QBG2-1b, and a (2-1)th buffer BUF2-1. The second Q generation logic part QG2 may control a voltage of a (2-1)th control node Q2, the (2-1a)th QB generation logic part QBG2-1a may control a voltage of a (2-2a)th control node QB21, and the (2-1b)th QB generation logic part QBG2-1b may control a voltage of a (2-2b)th control node QB22.

The (2-1)th buffer BUF2-1 may include a (2-1)th transistor TR2-1, a (2-2a)th transistor TR2-2a, and a (2-2b)th transistor TR2-2b. The (2-1)th transistor TR2-1 may operate as the pull-up transistor. The (2-2a)th transistor TR2-2a may operate as the pull-down transistor during the first unit time and may be deactivated during the second unit time.

The second switch part SWR may include a (2-1)th switch part SWR-1 and a (2-2)th switch part SWR-2. The (2-1)th switch part SWR-1 may include a (2-1a)th switch element M2-1a and a (2-1b)th switch element M2-1b. The (2-1a)th switch element M2-1a includes a gate electrode to which the first control signal CTRL1 is applied, a first electrode connected to a (2-1)th node n21, and a second electrode connected to the second power node GVSS. The (2-1b)th switch element M2-1b includes a gate electrode to which the second control signal CTRL2 is applied, a first electrode connected to the (2-1)th node n21, and a second electrode connected to the first power node GVDD. The (2-1)th node n21 is connected to the first electrode of the (2-1a)th switch element M2-1a, the first electrode of the (2-1b)th switch element M2-1b, and a second node of the (2-2a)th transistor TR2-2a.

The (2-2)th switch part SWR-2 may include a (2-2a)th switch element M2-2a and a (2-2b)th switch element M2-2b. The (2-2a)th switch element M2-2a includes a gate electrode to which the first control signal CTRL1 is applied, a first electrode connected to a (2-2)th node n22, and a second electrode connected to the second power node GVSS. The (2-2b)th switch element M2-2b includes a gate electrode to which the second control signal CTRL2 is applied, a first electrode connected to the (2-2)th node n22, and a second electrode connected to the first power node GVDD. The (2-2)th node n22 is connected to the first electrode of the (2-2a)th switch element M2-2a, the first electrode of the (2-2b)th switch element M2-2b, and a second node of the (2-2b)th transistor TR2-2b.

Figure 19B:
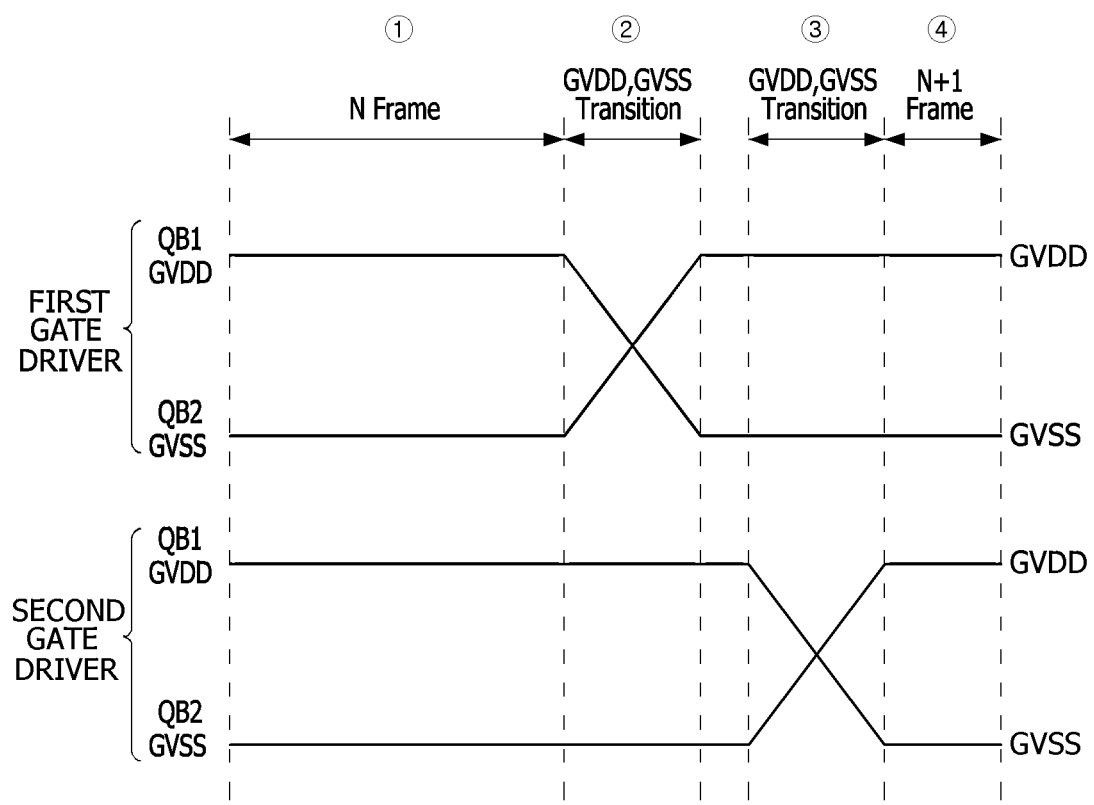

FIGS. 19A and 19B are views for describing an operation principle of the gate driver illustrated in FIG. 18.

Referring to FIGS. 18, 19A, and 19B, during a first process, that is, a first unit time ①, in the first gate driver 120L, the (1-1)th transistor TR1-1 may operate as the pull-up transistor, the (1-2a)th transistor TR1-2a may operate as the pull-down transistor (QBG1-1a ON), and the (1-2b)th transistor TR1-2b may be deactivated (QBG1-1b OFF).

At this point, in the second gate driver 120R, the (2-1)th transistor TR2-1 may operate as the pull-up transistor, the (2-2a)th transistor TR2-2a may operate as the pull-down transistor, and the (2-2b)th transistor TR2-2b may be deactivated.

That is, during the first unit time ①, both the first gate driver 120L and the second gate driver 120R are driven to generate an output so that an output waveform is maintained.

During a second process, that is, a first transition time ② after the first unit time, in the first gate driver 120L, the (1-2a)th control node QB11 may be discharged, and the (1-2b)th control node QB12 may be charged to transition to the pull-up control node.

At this point, in the second gate driver 120R, the (2-1)th transistor TR2-1 may operate as the pull-up transistor, the (2-2a)th transistor TR2-2a may operate as the pull-down transistor, and the (2-2b)th transistor TR2-2b may be deactivated That is, during the first transition time ED, even when the first gate driver 120L is not driven and thus no output is generated, the second gate driver 120R is driven so that the output waveform is maintained.

During a third process, that is, a second transition time ③ after the first transition time, in the second gate driver 120R, the (2-2a)th control node QB21 may be discharged, and the (2-2b)th control node QB22 may be charged to transition to the pull-down control node.

At this point, in the first gate driver 120L, the (1-1)th transistor TR1-1 may operate as the pull-up transistor, the (1-2a)th transistor TR1-2a may be deactivated, and the (1-2b)th transistor TR1-2b may operate as the pull-down transistor.

That is, during the second transition time ③, even when the second gate driver 120R is not driven and thus no output is generated, the first gate driver 120L is driven so that the output waveform is maintained.

During a fourth process, that is, a second unit time ④, in the first gate driver 120L, the (1-1)th transistor TR1-1 may operate as the pull-up transistor, the (1-2a)th transistor TR1-2a may be deactivated, and the (1-2b)th transistor TR1-2b may operate as the pull-down transistor.

At this point, in the second gate driver 120R, the (2-1)th transistor TR2-1 may operate as the pull-up transistor, the (2-2a)th transistor TR2-2a may be deactivated, and the (2-2b)th transistor TR2-2b may operate as the pull-down transistor.

That is, during the second unit time ④, both the first gate driver 120L and the second gate driver 120R are driven to generate an output so that the output waveform is maintained.

The first gate driver may correspond to a first shift register and the second gate driver may correspond to a second shift register. In this case, in a first process, the first shift register pulls down an i-th gate line (i is a positive integer), and simultaneously, the second shift register pulls down the i-th gate line, in a second process following the first process, the second shift register pulls down the i-th gate line, in a third process following the second process, the first shift register pulls down the i-th gate line, and in a fourth process following the third process, the first shift register pulls down the i-th gate line, and simultaneously, the second shift register pulls down the i-th gate line.

In the first gate driver 120L, two pull-down transistors may be alternately driven during the first transition time, and in the second gate driver 120R, two pull-down transistors may be alternately driven during the second transition time, but the first transition time and the second transition time are set differently from each other without overlapping each other so that the output waveform is maintained.

Figure 20:
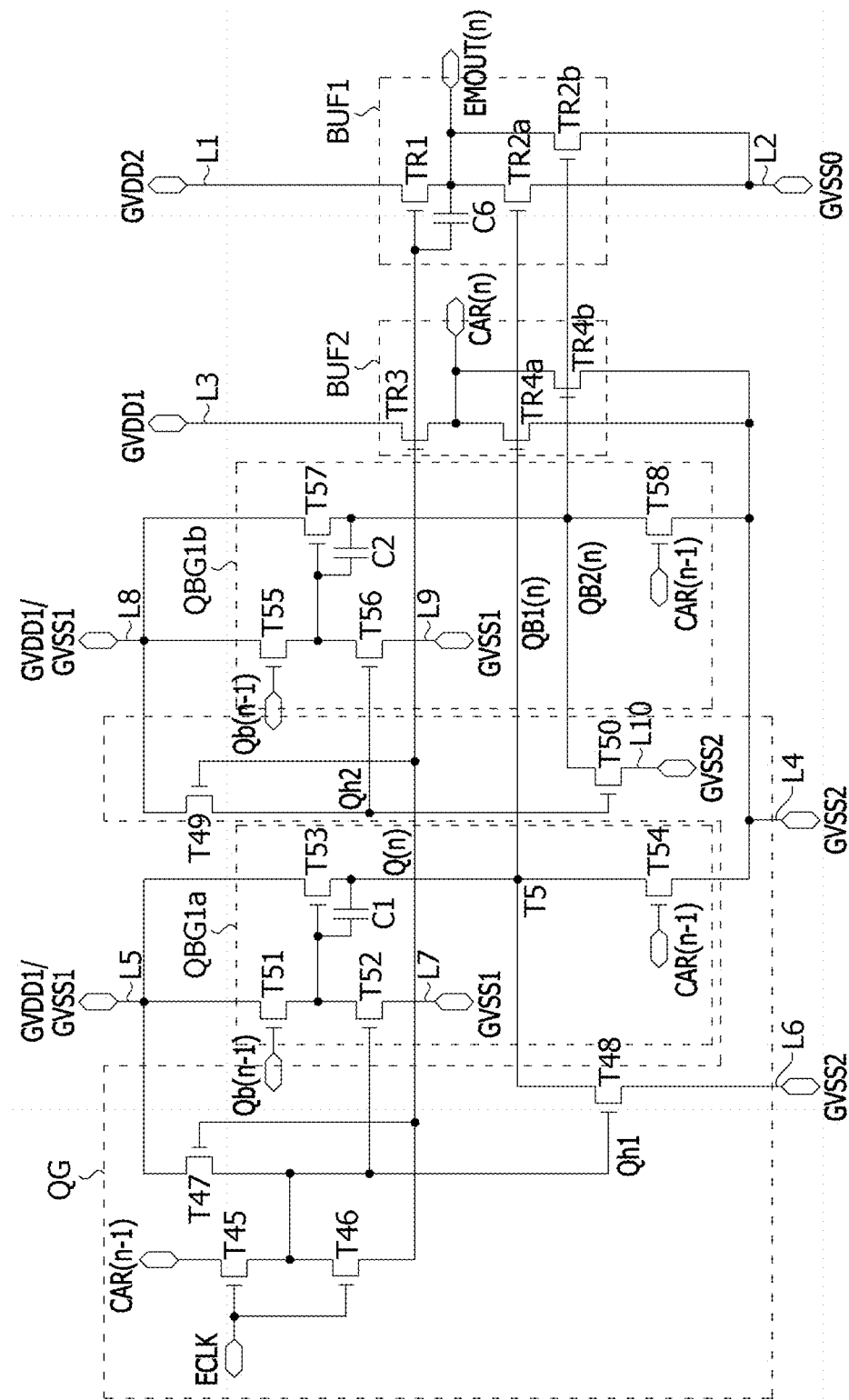
FIG. 20 is a circuit diagram illustrating the signal transmitter and a buffer illustrated in FIG. 17 in detail.
Figure 21A:
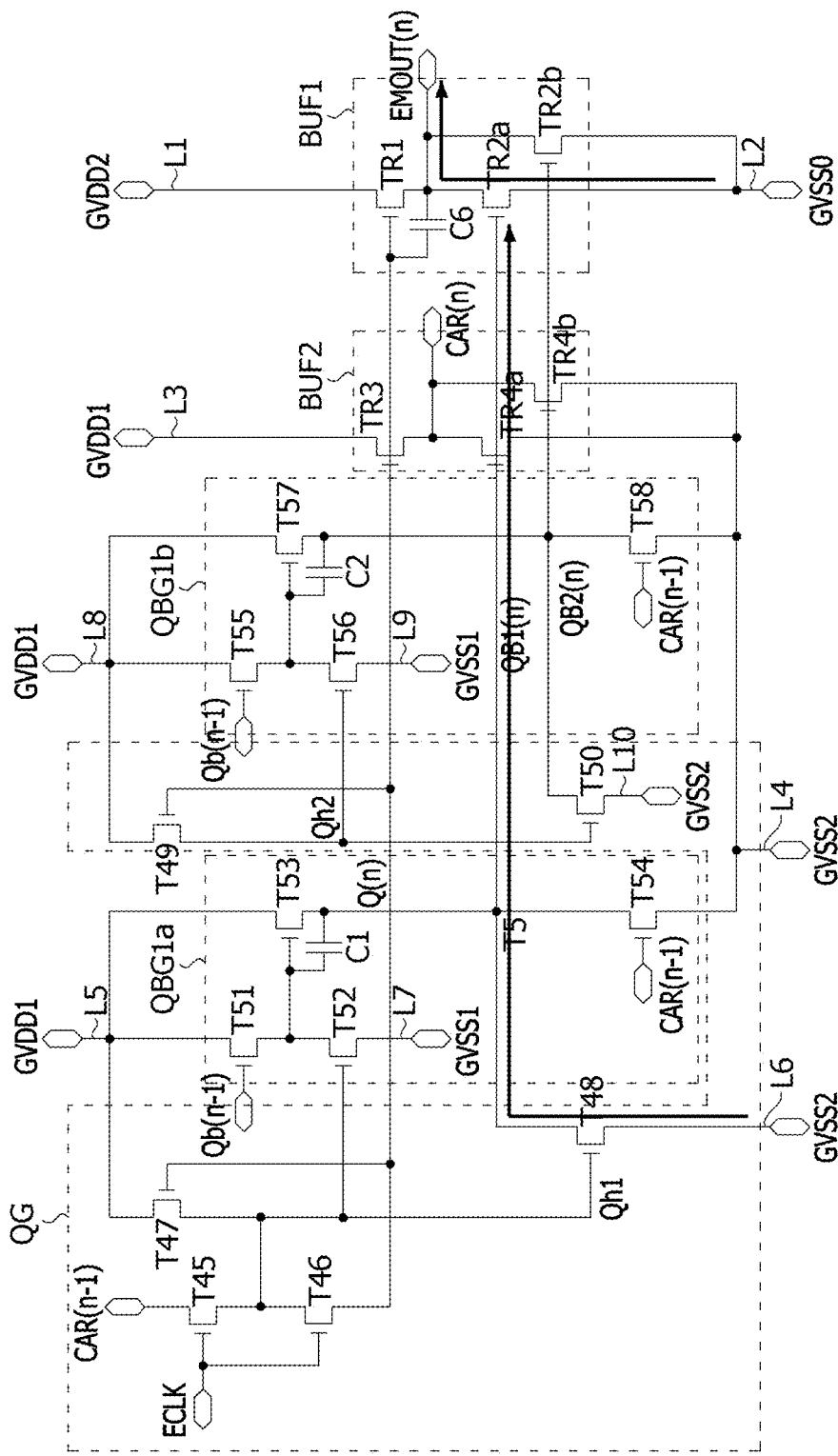
FIGS. 21A and 21B are circuit diagrams illustrating operations of a first unit time and a second unit time in the circuit illustrated in FIG. 20.
Figure 21B:
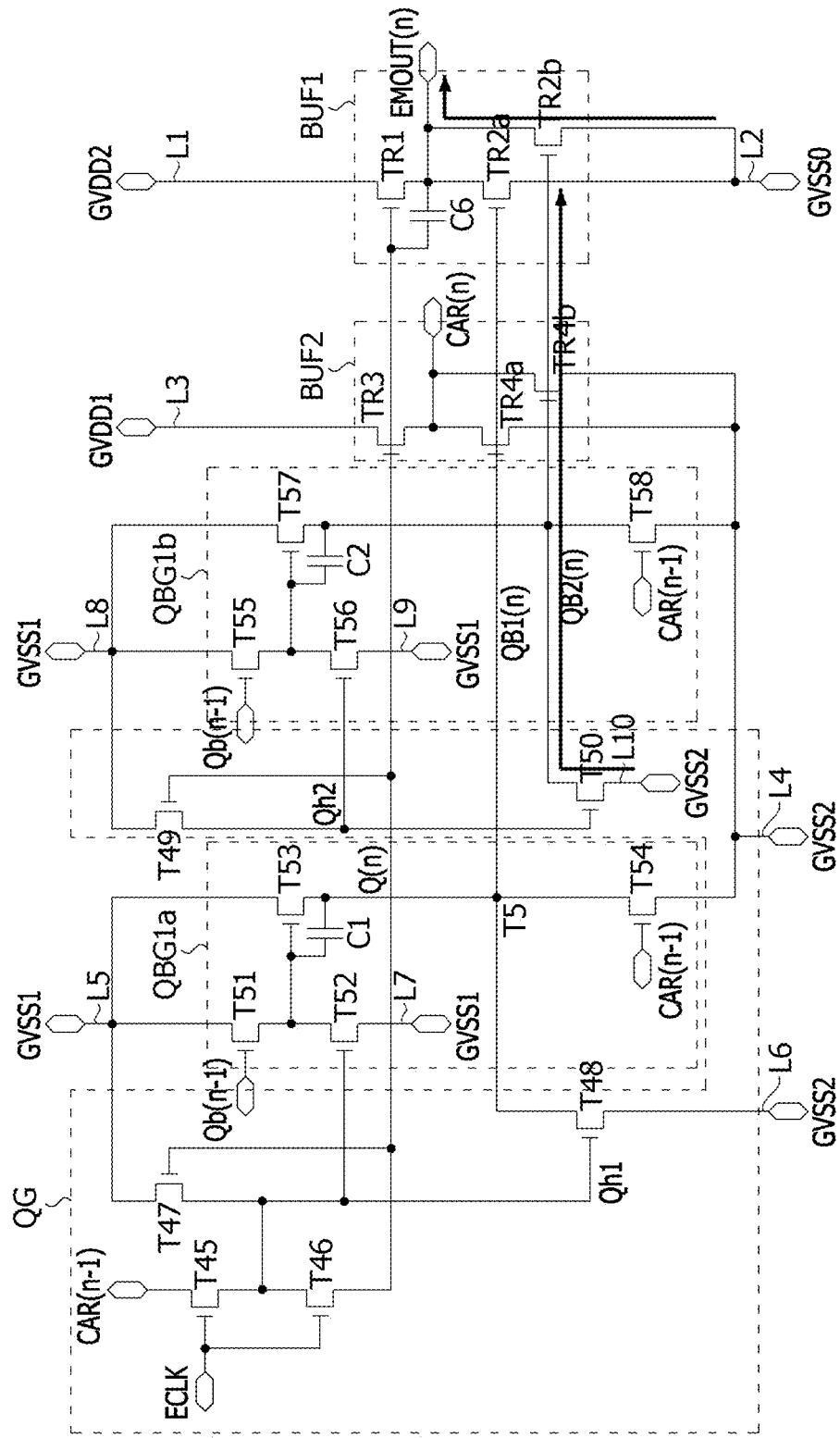

FIG. 20 is a circuit diagram illustrating the signal transmitter and the buffer illustrated in FIG. 17 in detail, and FIGS. 21A and 21B are circuit diagrams illustrating operations of the first unit time and the second unit time in the circuit illustrated in FIG. 20.

Referring to FIGS. 20, 21A, and 21B, an n-th signal transmitter ST(n) according to the embodiment of the present disclosure includes a Q generation logic part QG, a 1a-th QB generation logic part QBG1a, and a 1b-th QB generation logic part QBG1b.

The Q generation logic part QG drives a pull-up transistor TR1 of a first buffer BUF1 by charging a pull-up control node Q(n) during a pull-up time in which an activation clock ECLK is input.

The 1a-th QB generation logic part QBG1a drives pull-down transistors TR2a and TR4a by charging a first pull-down control node QB1(n) during the first unit time in which the pull-up control node Q(n) is discharged.

The 1b-th QB generation logic part QBG1b drives pull-down transistors TR2b and TR4b by charging a second pull-down control node QB2(n) during the second unit time in which the pull-up control node Q(n) is discharged.

The first buffer BUF1 charges and discharges a first output node to output an EM pulse EMOUT(n). The first buffer BUF1 includes a first transistor TR1 driven by the Q generation logic part QG, and 2a-th and 2b-th transistors TR2a and TR2b that are alternately driven by the 1a-th and 1b-th QB generation logic parts QBG1a and QBG1b.

The first transistor TR1 includes a gate electrode connected to the pull-up control node Q(n), a first electrode connected to a first power node L1, and a second electrode connected to the first output node. A gate driving voltage GVDD2 is applied to the first power node L1. A second capacitor C6 may be connected between the gate electrode and the second electrode of the first transistor TR1.

The 2a-th and 2b-th transistors TR2a and TR2b are each connected to the first transistor TR1 with the first output node EMOUT(n) therebetween. The 2a-th transistor TR2a includes a gate electrode connected to a 2a-th control node [QB1(n)], a first electrode connected to the first output node, and a second electrode connected to a second power node L2. The 2b-th transistor TR2b includes a gate electrode connected to a 2b-th control node [QB2(n)], a first electrode connected to the first output node, and a second electrode connected to the second power node L2. A gate reference voltage GVSS0 is applied to the second power node L2.

A second buffer BUF2 charges and discharges a second output node to output a carry pulse CAR(n). The second buffer BUF2 includes a third transistor TR3 driven by the Q generation logic part QG, and 4a-th and 4b-th pull-down transistors TR4a and TR4b that are alternately driven by the 1a-th and 1b-th QB generation logic parts QBG1a and QBG1b.

The third transistor TR3 includes a gate electrode connected to the pull-up control node [Q(n)], a first electrode connected to a third power node L3, and a second electrode connected to the second output node.

The 4a-th and 4b-th pull-down transistors TR4a and TR4b are each connected to the third transistor TR3 with the second output node therebetween. The 4a-th transistor TR4a includes a gate electrode connected to the 2a-th control node QB1(n), a first electrode connected to the second output node, and a second electrode connected to a fourth power node L4. The 4b-th transistor TR4b includes a gate electrode connected to the 2b-th control node QB2(n), a first electrode connected to the second output node, and a second electrode connected to the fourth power node L4.

As shown in FIGS. 21A and 21B, the Q generation logic part QG may include fifth to tenth transistors T45 to T50.

The fifth transistor T45 is turned on during the first unit time, in which the activation clock ECLK is input to a first CLK node, to connect a carry signal node to a first buffer node Qh1. A carry pulse CAR(n−1) from a signal transmitter in a previous stage is applied to the carry signal node. The carry pulse CAR(n−1) may be output from a second output node of the previous signal transmitter, for example, an (n−1)th signal transmitter ST(n−1). The fifth transistor T45 includes a gate electrode connected to the first CLK node, a first electrode connected to the carry signal node, and a second electrode connected to the first buffer node Qh1. The deactivation clock ECLKB is input to the first CLK node during the second unit time.

The sixth transistor T46 is turned on during a time, in which the activation clock ECLK is input to the first CLK node, to connect the first buffer node Qh1 to the pull-up control node Q(n). The sixth transistor T46 includes a gate electrode connected to the first CLK node, a first electrode connected to the first buffer node Qh1, and a second electrode connected to the pull-up control node Q(n).

The fifth and sixth transistors T45 and T46 are turned on in response to a high voltage of the activation clock ECLK during the time, in which the activation clock ECLK is applied to the first CLK node, to charge the first buffer node Qh1 and the pull-up control node Q(n).

The seventh transistor T47 is turned on when the pull-up control node Q(n) is charged to the high voltage, and connects a fifth power node L5 to the first buffer node Qh1 to charge the first buffer node Qh1. A gate driving voltage GVDD1 is applied to the fifth power node L5. The seventh transistor T47 includes a gate electrode connected to the pull-up control node Q(n), a first electrode connected to the fifth power node L5, and a second electrode connected to the first buffer node Qh1.

The eighth transistor T48 is turned on when a voltage of the first buffer node Qh1 is the high voltage, and connects the pull-down control node QB1(n) to a sixth power node L6 to discharge the pull-down control node QB1(n). A gate reference voltage GVSS2 is applied to the sixth power node L6. The eighth transistor T48 includes a gate electrode connected to the first buffer node Qh1, a first electrode connected to the pull-down control node QB1(n), and a second electrode connected to the sixth power node L6.

The ninth transistor T49 is turned on when the pull-up control node Q(n) is charged to the high voltage, and connects an eighth power node L8 to a second buffer node Qh2 to charge the second buffer node Qh2. The gate driving voltage GVDD1 is applied to the eighth power node L8. The ninth transistor T49 includes a gate electrode connected to the pull-up control node Q(n), a first electrode connected to the eighth power node L8, and a second electrode connected to the second buffer node Qh2.

The tenth transistor T50 is turned on when a voltage of the second buffer node Qh2 is the high voltage, and connects the pull-down control node QB2(n) to a tenth power node L10 to discharge the pull-down control node QB2(n). The gate reference voltage GVSS2 is applied to the tenth power node L10. The tenth transistor T50 includes a gate electrode connected to the second buffer node Qh2, a first electrode connected to the pull-down control node QB2(n), and a second electrode connected to the tenth power node L10.

The 1a-th QB generation logic part QBG1a may include eleventh to fourteenth transistors T51 to T54.

The eleventh transistor T51 is turned on when a voltage of a pull-down control node [Qb(n−1)] of the signal transmitter in the previous stage, for example, the (n−1)th signal transmitter ST(n−1) is a high voltage VDD to connect the fifth power node L5 to a gate electrode of the thirteenth transistor T53. In the fifth power node L5, the gate driving voltage GVDD1 is applied during the first unit time and a gate reference voltage GVSS1 is applied during the second unit time. The eleventh transistor T51 includes a gate electrode connected to the pull-down control node [Qb(n−1)] of the signal transmitter in the previous stage, a first electrode connected to the fifth power node L5, and a second electrode connected to the gate electrode of the thirteenth transistor T53.

The twelfth transistor T52 is turned on when a voltage of the first buffer node Qh1 is the high voltage VDD to connect the gate electrode of the thirteenth transistor T53 to a seventh power node L7. The gate reference voltage GVSS1 is applied to the seventh power node L7. The twelfth transistor T52 includes a gate electrode connected to the first buffer node Qh1, a first electrode connected to the gate electrode of the thirteenth transistor T53, and a second electrode connected to the seventh power node L7.

The thirteenth transistor T53 is turned on when a gate voltage is the high voltage VDD to connect the fifth power node L5 to the 2a-th control node QB1(n). The gate driving voltage GVDD1 is applied to the fifth power node L5. The thirteenth transistor T53 includes a gate electrode connected to the second electrode of the eleventh transistor T51 and the first electrode of the twelfth transistor T52, a first electrode connected to the fifth power node L5, and a second electrode connected to the 2a-th control node QB1(n). A first capacitor C1 may be connected between the gate electrode and the second electrode of the thirteenth transistor T53.

The fourteenth transistor T54 may be turned off when the 2a-th control node QB1(n) is charged. The fourteenth transistor T54 includes a gate electrode connected to the carry signal node, a first electrode connected to the 2a-th control node QB1(n), and a second electrode connected to the fourth power node L4.

The 1b-th QB generation logic part QBG1b may include fifteenth to eighteenth transistors T55 to T58.

The fifteenth transistor T55 is turned on when a voltage of the pull-down control node [Qb(n−1)] of the signal transmitter in the previous stage, for example, the (n−1)th signal transmitter ST(n−1) is the high voltage VDD to connect the eighth power node L8 to a gate electrode of the seventeenth transistor T57. In the eighth power node L8, the gate driving voltage GVDD1 is applied during the second unit time and the gate reference voltage GVSS1 is applied during the first unit time. The fifteenth transistor T55 includes a gate electrode connected to the pull-down control node Qb(n−1) of the signal transmitter in the previous stage, a first electrode connected to the eighth power node L8, and a second electrode connected to the gate electrode of the seventeenth transistor T57.

The sixteenth transistor T56 is turned on when the voltage of the second buffer node Qh2 is the high voltage VDD to connect the gate electrode of the seventeenth transistor T57 to the ninth power node L9. The gate reference voltage GVSS1 is applied to the ninth power node L9. The sixteenth transistor T56 includes a gate electrode connected to the second buffer node Qh2, a first electrode connected to the gate electrode of the seventeenth transistor T57, and a second electrode connected to the ninth power node L9.

The seventeenth transistor T57 is turned on when a gate voltage is the high voltage VDD to connect the eighth power node L8 to the 2b-th control node QB2(n). The gate driving voltage GVDD1 is applied to the eighth power node L8. The seventeenth transistor T57 includes a gate electrode connected to the second electrode of the fifteenth transistor T55 and the first electrode of the sixteenth transistor T56, a first electrode connected to the eighth power node L8, and a second electrode connected to the 2b-th control node QB2(n). A second capacitor C2 may be connected between the gate electrode and the second electrode of the seventeenth transistor T57.

The eighteenth transistor T58 may be turned off when the 2b-th control node QB2(n) is charged. The eighteenth transistor T58 includes a gate electrode connected to the carry signal node, a first electrode connected to the 2b-th control node QB2(n), and a second electrode connected to the fourth power node L4.

At this point, since the n-th signal transmitter ST(n) according to the third embodiment of the present disclosure has a structure in which the pull-down transistors are alternately driven, when the voltage of the pull-up control node does not become low, the pull-down control node is not affected, and thus an additional reset part is not required. However, the present disclosure is not necessarily limited thereto, and the reset part may be further configured according to the structure.

Figure 22:
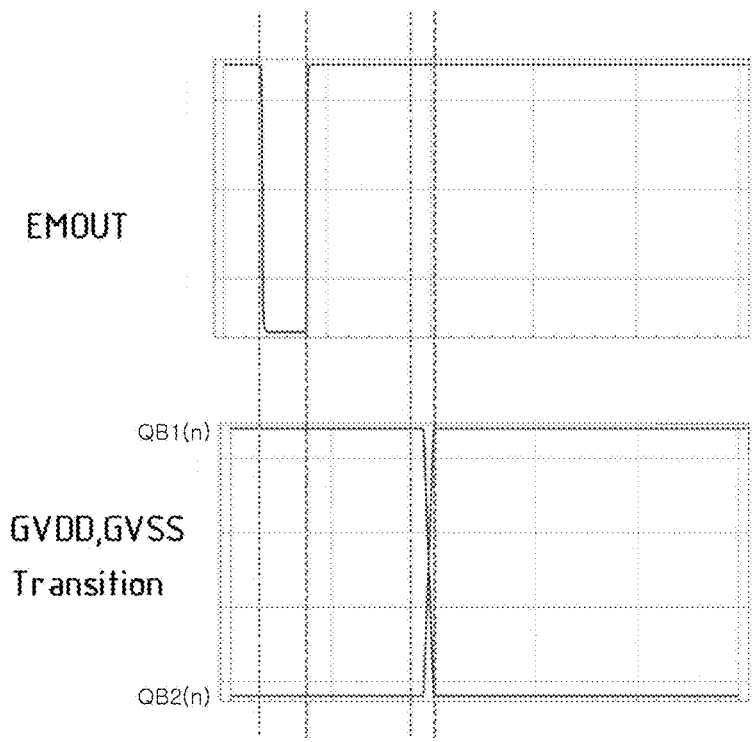
FIG. 22 is a set of simulation waveforms obtained by inputting a driving signal to the circuit illustrated in FIG. 20.

FIG. 22 is a set of simulation waveforms obtained by inputting a driving signal to the circuit illustrated in FIG. 20.

Referring to FIG. 22, "QB1(n)" is a waveform of the first pull-down control node and represents the voltage of the (2a)th control node QB1(n) during the first unit time and the voltage of the (2a)th control node QB1(n) during the second unit time.

In addition, "QB2(n)" is a waveform of the second pull-down control node and represents the voltage of the (2b)th control node QB2(n) during the first unit time and the voltage of the (2b)th control node QB2(n) during the second unit time.

Figure 23:
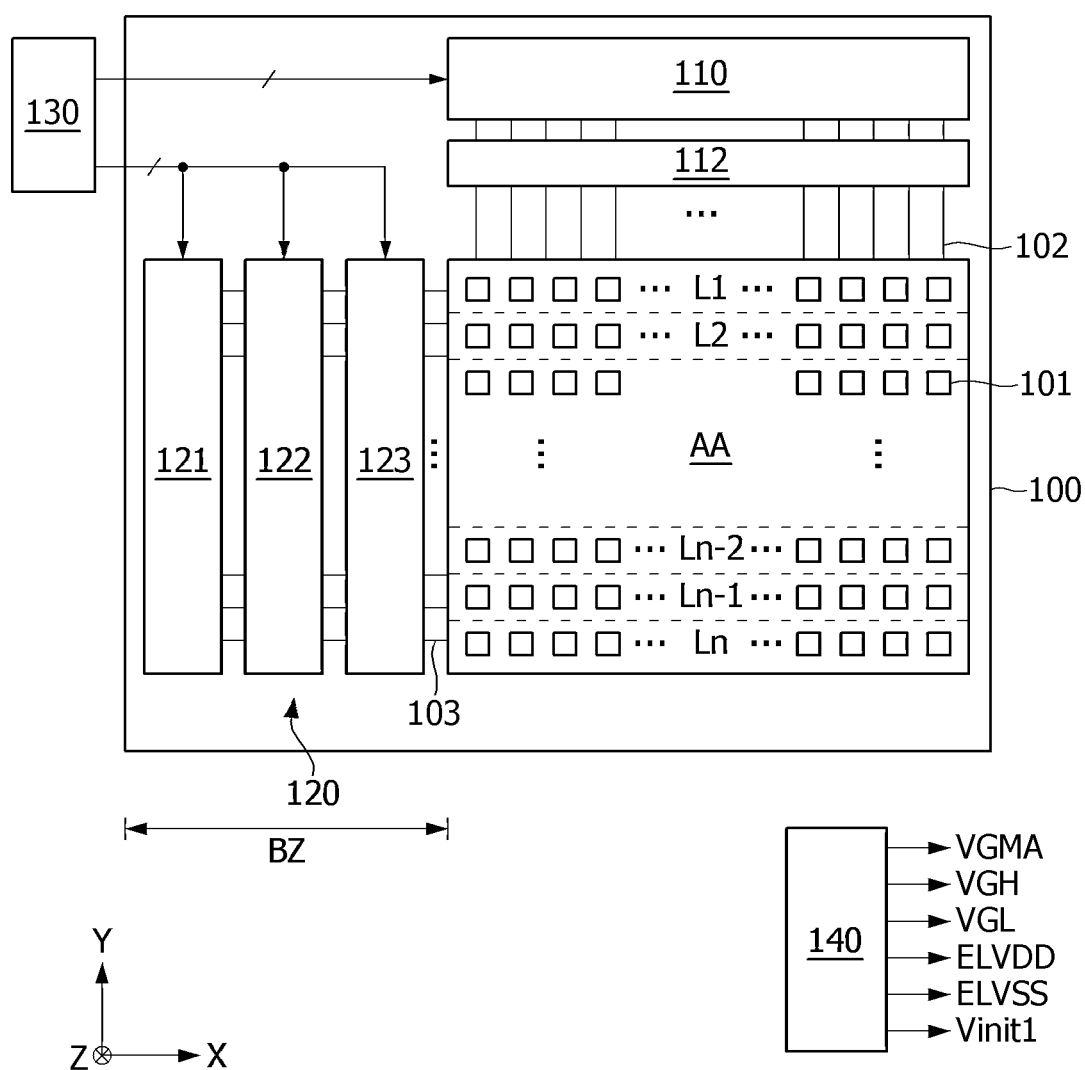
FIG. 23 is a block diagram illustrating a display device according to an embodiment of the present disclosure.
Figure 24:
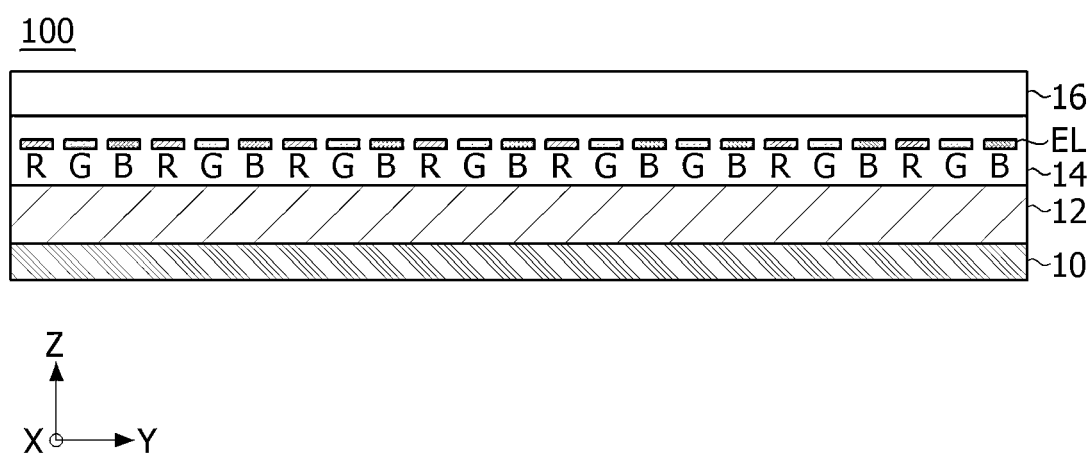
FIG. 24 is a view illustrating a cross-sectional structure of a display panel illustrated in FIG. 23.

FIG. 23 is a block diagram illustrating a display device according to an embodiment of the present disclosure, and FIG. 24 is a diagram illustrating a cross-sectional structure of the display panel shown in FIG. 23.

Referring to FIGS. 23 and 24, the display device according to an embodiment of the present disclosure includes a display panel 100, a display panel driver for writing pixel data to pixels of the display panel 100, and a power supply 140 for generating power necessary for driving the pixels and the display panel driver.

The display panel 100 includes a pixel array AA that displays an input image. The pixel array AA includes a plurality of data lines 102, a plurality of gate lines 103 intersected with the data lines 102, and pixels arranged in a matrix form.

The pixel array AA includes a plurality of pixel lines L1 to Ln. Each of the pixel lines L1 to Ln includes one line of pixels arranged along a line direction X in the pixel array AA of the display panel 100. Pixels arranged in one pixel line share the gate lines 103. Pixels arranged in a column direction Y along a data line direction share the same data line 102. One horizontal period 1H is a time obtained by dividing one frame period by the total number of pixel lines L1 to Ln.

Touch sensors may be disposed on the display panel 100. A touch input may be sensed using separate touch sensors or may be sensed through pixels. The touch sensors may be disposed as an on-cell type or an add-on type on the screen of the display panel or implemented as in-cell type touch sensors embedded in the pixel array AA.

The display panel 100 may be implemented as a flexible display panel. The flexible display panel may be made of a plastic OLED panel. An organic thin film may be disposed on a back plate of the plastic OLED panel, and the pixel array AA and light emitting element may be formed on the organic thin film.

The back plate of the plastic OLED may be a polyethylene terephthalate (PET) substrate. The organic thin film is formed on the back plate. The pixel array AA and a touch sensor array may be formed on the organic thin film. The back plate blocks moisture permeation so that the pixel array AA is not exposed to humidity. The organic thin film may be a thin Polyimide (PI) film substrate. A multi-layered buffer film may be formed of an insulating material (not shown) on the organic thin film. Lines may be formed on the organic thin film so as to supply power or signals applied to the pixel array AA and the touch sensor array.

To implement color, each of the pixels 101 may be divided into a red sub-pixel (hereinafter referred to as "R sub-pixel"), a green sub-pixel (hereinafter referred to as "G sub-pixel"), and a blue sub-pixel (hereinafter referred to as "B sub-pixel"). Each of the pixels may further include a white sub-pixel. Each of the sub-pixels includes a pixel circuit. The pixel circuit is connected to the data line 102 and the gate line 103.

Hereinafter, a pixel may be interpreted as having the same meaning as a sub-pixel.

As shown in FIG. 24, when viewed from a cross-sectional structure, the display panel 100 may include a circuit layer 12, a light emitting element layer 14, and an encapsulation layer 16 stacked on a substrate 10.

The circuit layer 12 may include a pixel circuit connected to wirings such as a data line, a gate line, and a power line, a gate driver (GIP) connected to the gate lines, and the like.

The wirings and circuit elements of the circuit layer 12 may include a plurality of insulating layers, two or more metal layers separated with the insulating layer therebetween, and an active layer including a semiconductor material.

The light emitting element layer 14 may include a light emitting element EL driven by a pixel circuit. The light emitting element EL may include a red (R) light emitting element, a green (G) light emitting element, and a blue (B) light emitting element. The light emitting element layer 14 may include a white light emitting element and a color filter. The light emitting elements EL of the light emitting element layer 14 may be covered by a protective layer including an organic film and a passivation film.

The light emitting element EL may be implemented as an OLED including an organic compound layer formed between an anode and a cathode. The organic compound layer may include, but is not limited to, a hole injection layer (HIL), a hole transport layer (HTL), a light emitting layer (EML), an electron transport layer (ETL), and an electron injection layer (EIL).

An organic light emitting diode used as the light emitting element may have a tandem structure in which a plurality of light emitting layers are stacked. The organic light emitting diode having the tandem structure may improve the luminance and lifespan of the pixel.

The encapsulation layer 16 covers the light emitting element layer 14 to seal the circuit layer 12 and the light emitting element layer 14. The encapsulation layer 16 may have a multilayered insulating structure in which an organic film and an inorganic film are alternately stacked. The inorganic film blocks the penetration of moisture and oxygen. The organic film planarizes the surface of the inorganic film. When the organic film and the inorganic film are stacked in multiple layers, a movement path of moisture or oxygen becomes longer compared to a single layer, so that penetration of moisture and oxygen affecting the light emitting element layer 14 can be effectively blocked.

A touch sensor layer may be disposed on the encapsulation layer 16. The touch sensor layer may include capacitive type touch sensors that sense a touch input based on a change in capacitance before and after the touch input. The touch sensor layer may include metal wiring patterns and insulating layers forming the capacitance of the touch sensors. The capacitance of the touch sensor may be formed between the metal wiring patterns. A polarizing plate may be disposed on the touch sensor layer. The polarizing plate may improve visibility and contrast ratio by converting the polarization of external light reflected by metal of the touch sensor layer and the circuit layer 12. The polarizing plate may be implemented as a polarizing plate in which a linear polarizing plate and a phase delay film are bonded, or a circular polarizing plate. A cover glass may be adhered to the polarizing plate.

The display panel 100 may further include a touch sensor layer and a color filter layer stacked on the encapsulation layer 16. The color filter layer may include red, green, and blue color filters and a black matrix pattern. The color filter layer may replace the polarizing plate and increase the color purity by absorbing a part of the wavelength of light reflected from the circuit layer and the touch sensor layer. In this embodiment, by applying the color filter layer 20 having a higher light transmittance than the polarizing plate to the display panel, the light transmittance of the display panel 100 can be improved, and the thickness and flexibility of the display panel 100 can be improved. A cover glass may be adhered on the color filter layer.

The power supply 140 generates DC power required for driving the pixel array AA and the display panel driver of the display panel 100 by using a DC-DC converter. The DC-DC converter may include a charge pump, a regulator, a buck converter, a boost converter, and the like. The power supply 140 may adjust a DC input voltage from a host system (not shown) and thereby generate DC voltages such as a gamma reference voltage VGMA, gate-on voltages VGH and VEH, gate-off voltages VGL and VEL, a pixel driving voltage ELVDD, a pixel low-potential power supply voltage ELVSS, a reference voltage Vref, an initial voltage Vinit1, an anode voltage Vano, and the like. The gamma reference voltage VGMA is supplied to a data driver 110. The gate-on voltages VGH and VEH and the gate-off voltages VGL and VEL are supplied to a gate driver 120. The pixel driving voltage ELVDD and the pixel low-potential power supply voltage ELVSS, a reference voltage Vref, an initial voltage Vinit1, an anode voltage Vano, and the like are commonly supplied to the pixels.

The display panel driver writes pixel data (digital data) of an input image to the pixels of the display panel 100 under the control of a timing controller (TCON) 130.

The display panel driver includes the data driver 110 and the gate driver 120.

The demultiplexer array 112 sequentially supplies data voltages output from channels of the data driver 110 to the data lines 102 using a plurality of demultiplexers (DE-MUXs). The demultiplexers may include a plurality of switch elements disposed on the display panel 100. When the demultiplexers are disposed between output terminals of the data driver 110 and the data lines 102, the number of channels of the data driver 110 may be reduced. The demultiplexer array 112 may be omitted. In this case, output buffers AMP of the data driver 110 are directly connected to the data lines 102.

The display panel driver may further include a touch sensor driver for driving the touch sensors. The touch sensor driver is omitted from FIG. 1. The touch sensor driver may be integrated into one drive integrated circuit (IC). In a mobile device or wearable device, the timing controller 130, the power supply 140, the data driver 110, the touch sensor driver, and the like may be integrated into one drive integrated circuit (IC).

The data driver 110 generates a data voltage Vdata by converting pixel data of an input image received from the timing controller 130 with a gamma compensation voltage every frame period by using a digital to analog converter (DAC). The gamma reference voltage VGMA is divided for respective gray scales through a voltage divider circuit. The gamma compensation voltage divided from the gamma reference voltage VGMA is provided to the DAC of the data driver 110. The data voltage Vdata is outputted through the output buffer AMP in each of the channels of the data driver 110.

In the data driver 110, the output buffer AMP included in one channel may be connected to adjacent data lines 102 through the de-multiplexer array 112. The de-multiplexer array 112 may be formed directly on the substrate of the display panel 100 or integrated into one drive IC together with the data driver 110.

The gate driver 120 may be implemented as a gate in panel (GIP) circuit formed directly on a circuit layer 12 of the display panel 100 together with the TFT array of the pixel array AA. The gate driver 120 sequentially outputs gate signals to the gate lines 103 under the control of the timing controller 130. The gate driver 120 may sequentially supply the gate signals to the gate lines 103 by shifting the gate signals using a shift register.

The gate signal may include a scan signal for selecting pixels of a line in which data is to be written in synchronization with the data voltage, and an EM signal defining an emission time of pixels charged with the data voltage.

The gate driver 120 may include a scan driver 121, an EM driver 122, and an initialization driver 123.

The scan driver 121 outputs a scan signal SCAN in response to a start pulse and a shift clock from the timing controller 130, and shifts the scan signal SCAN according to the shift clock timing. The EM driver 122 outputs an EM signal EM in response to a start pulse and a shift clock from the timing controller 130, and sequentially shifts the EM signal EM according to the shift clock. The initialization driver 123 outputs an initialization signal Vinit1 in response to a start pulse and a shift clock from the timing controller 130, and shifts the initialization signal Vinit1 according to the shift clock timing. Therefore, the scan signal SCAN, the EM signal EM, and the initialization signal Vinit1 are sequentially supplied to the gate lines 103 of the pixel lines L1 to Ln. In case of a bezel-free model, at least some of transistors constituting the gate driver 120 and clock wirings may be dispersedly disposed in the pixel array AA.

The timing controller 130 receives, from a host system (not shown), digital video data DATA of an input image and a timing signal synchronized therewith. The timing signal includes a vertical synchronization signal Vsync, a horizontal synchronization signal Hsync, a main clock CLK, a data enable signal DE, and the like. Because a vertical period and a horizontal period can be known by counting the data enable signal DE, the vertical synchronization signal Vsync and the horizontal synchronization signal Hsync may be omitted. The data enable signal DE has a cycle of one horizontal period (1H).

The host system may be any one of a television (TV) system, a set-top box, a navigation system, a personal computer (PC), a home theater system, a vehicle system, and a mobile device system.

The timing controller 130 multiplies an input frame frequency by i and controls the operation timing of the display panel driving circuit with a frame frequency of the input frame frequency×i (i is a positive integer greater than 0) Hz. The input frame frequency is 60 Hz in the NTSC (National Television Standards Committee) scheme and 50 Hz in the PAL (Phase-Alternating Line) scheme.

Based on the timing signals Vsync, Hsync, and DE received from the host system, the timing controller 130 generates a data timing control signal for controlling the operation timing of the data driver 110, MUX signals MUX1 and MUX2 for controlling the operation timing of the de-multiplexer array 112, and a gate timing control signal for controlling the operation timing of the gate driver 120.

The voltage level of the gate timing control signal outputted from the timing controller 130 may be converted into the gate-on voltages VGH and VEH and the gate-off voltages VGL and VEL through a level shifter (not shown) and then supplied to the gate driver 120. That is, the level shifter converts a low level voltage of the gate timing control signal into the gate-off voltages VGL and VEL and converts a high level voltage of the gate timing control signal into the gate-on voltages VGH and VEH. The gate timing control signal includes the start pulse and the shift clock.

It will be apparent to those skilled in the art that various modifications and variations can be made in the gate driver and the display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A gate driver, comprising:
   a first shift register configured to sequentially supply a gate signal to a plurality of gate lines through output nodes connected to the gate lines; and
   a second shift register configured to sequentially supply the gate signal to the gate lines through output nodes connected to the gate lines,
   wherein, in a first process, the gate signal is supplied from the first shift register to one side of an i-th gate line (i is a positive integer) and simultaneously supplied from the second shift register to the other side of the i-th gate line,
   in a second process following the first process, the gate signal is supplied from the second shift register to the other side of the i-th gate line,
   in a third process following the second process, the gate signal is supplied from the first shift register to the one side of the i-th gate line, and
   in a fourth process following the third process, the gate signal is supplied from the first shift register to the one side of the i-th gate line and simultaneously supplied from the second shift register to the other side of the i-th gate line,
   wherein an i-th signal transmitter of the first shift register includes a (1-1)th buffer transistor and a (1-2)th buffer transistor that are connected to the one side of the i-th gate line, and
   an i-th signal transmitter of the second shift register includes a (2-1)th buffer transistor and a (2-2)th buffer transistor that are connected to the other side of the i-th gate line,
   wherein in the first process, a gate driving voltage (GVDD) is applied to the (1-1)th and (2-1)th buffer transistors, and a gate reference voltage (GVSS) lower than the gate driving voltage is applied to the (1-2)th and (2-2)th buffer transistors,
   in the second process, the gate driving voltage applied to the (1-1)th buffer transistor is inverted to the gate reference voltage, the gate reference voltage applied to the (1-2)th buffer transistor is inverted to the gate driving voltage, the gate driving voltage is applied to the (2-1)th buffer transistor, and the gate reference voltage is applied to the (2-2)th buffer transistor,
   in the third process, the gate driving voltage applied to the (2-1)th buffer transistor is inverted to the gate reference voltage, the gate reference voltage applied to the (2-2)th buffer transistor is inverted to the gate driving voltage, the gate reference voltage is applied to the (1-1)th buffer transistor, and the gate driving voltage is applied to the (1-2)th buffer transistor, and
   in the fourth process, the gate reference voltage is applied to the (1-1)th and (2-1)th buffer transistors, and the gate driving voltage is applied to the (1-2)th and (2-2)th buffer transistors.

2. The gate driver of claim 1,
   wherein, in the first process, the (1-1)th and (2-1)th buffer transistors are simultaneously driven to double-feed the gate signal to the i-th gate line,
   in the second process, the (2-1)th buffer transistor is driven to single-feed the gate signal to the i-th gate line,
   in the third process, the (1-2)th buffer transistor is driven to single-feed the gate signal to the i-th gate line, and in the fourth process, the (1-2)th and (2-2)th buffer transistors are simultaneously driven to double-feed the gate signal to the i-th gate line.

3. The gate driver of claim 1, wherein the first process is performed during a first unit time, the second process is performed during a first transition time, the third process is performed during a second transition time, the fourth process is performed during a second unit time, and wherein the first transition time and the second transition time are set differently from each other without overlapping each other.

4. A display device, comprising:
a display panel in which a plurality of data lines to which a data voltage is applied, a plurality of gate lines crossing the data lines and to which a gate signal is applied, and pixel circuits connected to a plurality of power lines are disposed;
a data driver configured to receive pixel data and output the data voltage; and
the gate driver of claim 1.

5. A gate driver, comprising:
a first shift register configured to sequentially supply a gate signal to a plurality of gate lines through output nodes connected to the gate lines; and
a second shift register configured to sequentially supply the gate signal to the gate lines through output nodes connected to the gate lines,
wherein, in a first process, the gate signal is supplied from the first shift register to one side of an i-th gate line (i is a positive integer) and simultaneously supplied from the second shift register to the other side of the i-th gate line,
in a second process following the first process, the gate signal is supplied from the second shift register to the other side of the i-th gate line,
in a third process following the second process, the gate signal is supplied from the first shift register to the one side of the i-th gate line, and
in a fourth process following the third process, the gate signal is supplied from the first shift register to the one side of the i-th gate line and simultaneously supplied from the second shift register to the other side of the i-th gate line,
wherein an i-th signal transmitter of the first shift register includes a (1-1a)th buffer transistor, a (1-1b)th buffer transistor, and a (1-2)th buffer transistor that are connected to the one side of the i-th gate line, and
an i-th signal transmitter of the second shift register includes a (2-1a)th buffer transistor, a (2-1b)th buffer transistor, and a (2-2)th buffer transistor that are connected to the other side of the i-th gate line,
wherein, in the first process, the (1-1a)th and (2-1a)th buffer transistors are simultaneously driven to double-feed the gate signal to the i-th gate line,
in the second process, the (2-1a)th buffer transistor is driven to single-feed the gate signal to the i-th gate line,
in the third process, the (1-1b)th buffer transistor is driven to single-feed the gate signal to the i-th gate line, and
in the fourth process, the (1-1b)th and (2-1b)th buffer transistors are simultaneously driven to double-feed the gate signal to the i-th gate line.

6. The gate driver of claim 5, wherein in the i-th signal transmitter of the first shift register,
in the first process, a gate driving voltage (GVDD) is applied to the (1-1a)th and (2-1a)th buffer transistors, and a gate reference voltage (GVSS) lower than the gate driving voltage is applied to the (1-1b)th and (2-1b)th buffer transistors, in the second process, the gate driving voltage applied to the (1-1a)th buffer transistor is inverted to the gate reference voltage, the gate reference voltage applied to the (1-1b)th buffer transistor is inverted to the gate driving voltage, the gate driving voltage is applied to the (2-1a)th buffer transistor, and the gate reference voltage is applied to the (2-1b)th buffer transistor,
in the third process, the gate driving voltage applied to the (2-1a)th buffer transistor is inverted to the gate reference voltage, the gate reference voltage applied to the (2-1b)th buffer transistor is inverted to the gate driving voltage, the gate reference voltage is applied to the (1-1a)th buffer transistor, and the gate driving voltage is applied to the (1-1b)th buffer transistor, and
in the fourth process, the gate reference voltage is applied to the (1-1a)th and (2-1a)th buffer transistors, and the gate driving voltage is applied to the (1-1b)th and (2-1b)th buffer transistors.

7. A display device, comprising:
a display panel in which a plurality of data lines to which a data voltage is applied, a plurality of gate lines crossing the data lines and to which a gate signal is applied, and pixel circuits connected to a plurality of power lines are disposed;
a data driver configured to receive pixel data and output the data voltage; and
the gate driver of claim 5.

8. The display device of claim 7, wherein all transistors in a panel including the data driver, the gate driver, and the pixel circuits are implemented with oxide thin film transistors (TFTs) including an n-channel type oxide semiconductor.

9. A gate driver, comprising:
a first shift register configured to sequentially supply a gate signal to a plurality of gate lines through output nodes connected to the gate lines; and
a second shift register configured to sequentially supply the gate signal to the gate lines through output nodes connected to the gate lines,
wherein, in a first process, the first shift register pulls down an i-th gate line (i is a positive integer), and simultaneously, the second shift register pulls down the i-th gate line,
in a second process following the first process, the second shift register pulls down the i-th gate line,
in a third process following the second process, the first shift register pulls down the i-th gate line, and
in a fourth process following the third process, the first shift register pulls down the i-th gate line, and simultaneously, the second shift register pulls down the i-th gate line,
wherein an i-th signal transmitter of the first shift register includes a (1-1)th buffer transistor, a (1-2a)th buffer transistor, and a (1-2b)th buffer transistor that are connected to one side of the i-th gate line, and
an i-th signal transmitter of the second shift register includes a (2-1)th buffer transistor, a (2-2a)th buffer transistor, and a (2-2b)th buffer transistor that are connected to the other side of the i-th gate line,
wherein in the first process, a gate driving voltage (GVDD) is applied to the (1-1)th buffer transistor, a gate reference voltage (GVSS) lower than the gate driving voltage is applied to the (1-2a)th buffer transistor, the gate driving voltage is applied to the (2-1)th buffer transistor, and the gate reference voltage is applied to the (2-2a)th buffer transistor, in the second process, the gate driving voltage is applied to the (1-1)th buffer transistor, the (1-2a)th and (1-2b)th buffer transistors are deactivated, the gate driving voltage is applied to the (2-1)th buffer transistor, and the gate reference voltage is applied to the (2-2b)th buffer transistor, in the third process, the gate driving voltage is applied to the (1-1)th buffer transistor, the gate reference voltage is applied to the (1-2b)th buffer transistor, the gate driving voltage is applied to the (2-1)th buffer transistor, and the (2-2a)th and (2-2b)th buffer transistors are deactivated, and in the fourth process, the gate driving voltage is applied to the (1-1)th buffer transistor, the gate reference voltage is applied to the (1-2b)th buffer transistor, the gate driving voltage is applied to the (2-1)th buffer transistor, and the gate reference voltage is applied to the (2-2b)th buffer transistor.

10. The gate driver of claim 9, wherein the first process is performed during a first unit time, the second process is performed during a first transition time, the third process is performed during a second transition time, the fourth process is performed during a second unit time, and wherein the first transition time and the second transition time are set differently from each other without overlapping each other.

11. A gate driver, comprising:
an i-th signal transmitter (i is a positive integer) of a first shift register, which is configured to output a first gate signal to one side of an i-th gate line according to a voltage of a (1-1)th control node and a voltage of a (1-2)th control node; and
an i-th signal transmitter of a second shift register, which is configured to output a second gate signal to the other side of the i-th gate line according to a voltage of a (2-1)th control node and a voltage of a (2-2)th control node,
wherein the (1-1)th control node is controlled to be a pull-up control node to pull up a voltage of the first gate signal to a high potential voltage during a (1-1)th unit time, and deactivated during a (1-2)th unit time,
the (1-2)th control node is deactivated during the (1-1)th unit time, and controlled to be a pull-up control node to pull up the voltage of the first gate signal to the high potential voltage during the (1-2)th unit time,
the (2-1)th control node is controlled to be a pull-up control node to pull up a voltage of the second gate signal to the high potential voltage during a (2-1)th unit time, and deactivated during a (2-2)th unit time, and
the (2-2)th control node is deactivated during the (2-1)th unit time, and controlled to be a pull-up control node to pull up the voltage of the second gate signal to the high potential voltage during the (2-2)th unit time,
wherein a time point, at which a transition between the (1-1)th unit time and the (1-2)th unit time is made, is different from a time point at which a transition between (2-1)th unit time and the (2-2)th unit time is made.

12. The gate driver of claim 11, wherein the i-th signal transmitter of the first shift register includes:
a first controller configured to receive an activation clock during the (1-1)th unit time to control the (1-1)th control node to be the pull-up control node, and receive the activation clock during the (1-2)th unit time to control the (1-2)th control node to be the pull-up control node; and first buffers configured to output the first gate signal according to the voltage of the (1-1)th control node and the voltage of the (1-2)th control node, and the i-th signal transmitter of the second shift register includes:
a second controller configured to receive the activation clock during the (2-1)th unit time to control the (2-1)th control node to be the pull-up control node, and receive the activation clock during the (2-2)th unit time to control the (2-2)th control node to be the pull-up control node; and
second buffers configured to output the second gate signal according to the voltage of the (2-1)th control node and the voltage of the (2-2)th control node.

13. The gate driver of claim 12, further comprising:
a first switch part connected to the i-th signal transmitter of the first shift register; and
a second switch part connected to the i-th signal transmitter of the second shift register,
wherein the first switch part converts a voltage applied to the (1-1)th control node, the (1-2)th control node, and the first buffers to the high potential voltage or a low potential voltage lower than the high potential voltage during a first transition time between the (1-1)th unit time and the (1-2)th unit time, and
the second switch part converts a voltage applied to the (2-1)th control node, the (2-2)th control node, and the second buffers to the high potential voltage or the low potential voltage during a second transition time between the (2-1)th unit time and the (2-2)th unit time.

14. The gate driver of claim 13, wherein each of the first buffers includes:
a (1-1)th transistor driven in response to the voltage of the (1-1)th control node; and
a (1-2)th transistor driven in response to the voltage of the (1-2)th control node, and each of the second buffers includes:
a (2-1)th transistor driven in response to the voltage of the (2-1)th control node; and
a (2-2)th transistor driven in response to the voltage of the (2-2)th control node.

15. The gate driver of claim 14, wherein the first switch part includes:
a (1-1)th switch part including a (1-1a)th switch element configured to connect a high potential voltage line to a first electrode of the (1-1)th transistor in response to a first control signal, and a (1-1b)th switch element configured to connect a low potential voltage line to the first electrode of the (1-1)th transistor in response to a second control signal; and
a (1-2)th switch part including a (1-2a)th switch element configured to connect the low potential voltage line to a second electrode of the (1-2)th transistor in response to the first control signal, and a (1-2b)th switch element configured to connect the high potential voltage line to the second electrode of the (1-2)th transistor in response to the second control signal.

16. The gate driver of claim 14, wherein the second switch part includes:
a (2-1)th switch part including a (2-1a)th switch element configured to connect a high potential voltage line to a first electrode of the (2-1)th transistor in response to a first control signal, and a (2-1b)th switch element configured to connect a low potential voltage line to the first electrode of the (2-1)th transistor in response to a second control signal; and a (2-2)th switch part including a (2-2a)th switch element configured to connect the low potential voltage line to a second electrode of the (2-2)th transistor in response to the first control signal, and a (2-2b)th switch element configured to connect the high potential voltage line to the second electrode of the (2-2)th transistor in response to the second control signal.

17. The gate driver of claim 14, wherein the i-th signal transmitter of the first shift register further includes a first reset part configured to discharge the (1-1)th control node and the (1-2)th control node during the first transition time, and the i-th signal transmitter of the second shift register further includes a second reset part configured to discharge the (2-1)th control node and the (2-2)th control node during the second transition time.

18. The gate driver of claim 17, wherein the first controller includes:
   a (1-1a)th Q generation logic part configured to charge the (1-1)th control node during the (1-1)th unit time to control the (1-1)th control node to be the pull-up control node;
   a (1-2a)th QB generation logic part configured to charge the (1-2)th control node when the (1-1)th control node is discharged during the (1-1)th unit time to control the (1-2)th control node to be a pull-down control node;
   a (1-1b)th Q generation logic part configured to charge the (1-2)th control node during the (1-2)th unit time to control the (1-2)th control node to be the pull-up control node; and
   a (1-2b)th QB generation logic part configured to charge the (1-1)th control node when the (1-2)th control node is discharged during the (1-2)th unit time to control the (1-1)th control node to be the pull-down control node, and
   the second controller includes:
   a (2-1a)th Q generation logic part configured to charge the (2-1)th control node during the (2-1)th unit time to control the (2-1)th control node to be the pull-up control node;
   a (2-2a)th QB generation logic part configured to charge the (2-2)th control node when the (2-1)th control node is discharged during the (2-1)th unit time to control the (2-2)th control node to be the pull-down control node;
   a (2-1b)th Q generation logic part configured to charge the (2-2)th control node during the (2-2)th unit time to control the (2-2)th control node to be the pull-up control node; and
   a (2-2b)th QB generation logic part configured to charge the (2-1)th control node when the (2-2)th control node is discharged during the (2-2)th unit time to control the (2-1)th control node to be the pull-down control node.

19. The gate driver of claim 13, wherein the (1-1)th control node includes a (1-1a)th control node and a (1-1b)th control node,
   each of the first buffers includes:
   a (1-1a)th transistor driven in response to a voltage of the (1-1a)th control node;
   a (1-1b)th transistor driven in response to a voltage of the (1-1b)th control node; and
   a (1-2)th transistor driven in response to the voltage of the (1-2)th control node, the (2-1)th control node includes a (2-1a)th control node and a (2-1b)th control node, and each of the second buffers includes:
   a (2-1a)th transistor driven in response to a voltage of the (2-1a)th control node;

a (2-1b)th transistor driven in response to a voltage of the (2-1b)th control node; and
   a (2-2)th transistor driven in response to the voltage of the (2-2)th control node.

20. The gate driver of claim 19, wherein the first switch part includes:
   a (1-1)th switch part including a (1-1a)th switch element configured to connect a high potential voltage line to a first electrode of the (1-1a)th transistor in response to a first control signal, and a (1-1b)th switch element configured to connect a low potential voltage line to the first electrode of the (1-1a)th transistor in response to a second control signal; and
   a (1-2)th switch part including a (1-2a)th switch element configured to connect the high potential voltage line to a first electrode of the (1-1b)th transistor in response to the second control signal, and a (1-2b)th switch element configured to connect the low potential voltage line to the first electrode of the (1-1b)th transistor in response to the first control signal.

21. The gate driver of claim 20, wherein the second switch part includes:
   a (2-1)th switch part including a (2-1a)th switch element configured to connect the high potential voltage line to a first electrode of the (2-1a)th transistor in response to the first control signal, and a (2-1b)th switch element configured to connect the low potential voltage line to the first electrode of the (2-1a)th transistor in response to the second control signal; and
   a (2-2)th switch part including a (2-2a)th switch element configured to connect the high potential voltage line to a first electrode of the (2-1b)th transistor in response to the second control signal, and a (2-2b)th switch element configured to connect the low potential voltage line to the first electrode of the (2-1b)th transistor in response to the first control signal.

22. The gate driver of claim 19, wherein the i-th signal transmitter of the first shift register further includes a first reset part configured to discharge the (1-1a)th control node and the (1-1b)th control node during the first transition time, and the i-th signal transmitter of the second shift register further includes a second reset part configured to discharge the (2-1a)th control node and the (2-1b)th control node during the second transition time.

23. The gate driver of claim 22, wherein the first controller includes:
   a (1-1a)th Q generation logic part that is configured to charge the (1-1a)th control node during a first unit time to turn the (1-1a)th transistor on and is deactivated during a second unit time;
   a (1-1b)th Q generation logic part that is configured to charge the (1-1b)th control node during the second unit time to turn the (1-1b)th transistor on and is deactivated during the first unit time; and
   a (1-2)th QB generation logic part configured to charge the (1-2)th control node during a time, in which the (1-1a)th control node or the (1-1b)th control node is discharged, to turn the (1-2)th transistor on, and
   the second controller includes:
   a (2-1a)th Q generation logic part that is configured to charge the (2-1a)th control node during the first unit time to turn the (2-1a)th transistor on and is deactivated during the second unit time;
   a (2-1b)th Q generation logic part that is configured to charge the (2-1b)th control node during the second unit time to turn the (2-1b)th transistor on and is deactivated during the first unit time; and
a (2-2)th QB generation logic part configured to charge the (2-2)th control node during a time, in which the (2-1a)th control node or the (2-1b)th control node is discharged, to turn the (2-2)th transistor on.

24. The gate driver of claim 19, wherein a first electrode of the (1-1a)th transistor is connected to a first power node, a first electrode of the (1-1b)th transistor is connected to a second power node,
wherein each of the first buffers further comprises a first capacitor connected between a second electrode of the (1-1a)th transistor and an output node, and a second capacitor connected between a gate electrode and a second electrode of the (1-1b)th transistor, and
wherein the output node is between the (1-1a)th transistor and the (1-1b)th transistor.

25. The gate driver of claim 19, wherein the (1-1a)th transistor and the (1-1b)th transistor are each connected to the (1-2)th transistor with an output node therebetween,
wherein each of the first buffers further comprises a capacitor connected between a gate electrode of the (1-2)th transistor and the output node.

26. The gate driver of claim 14, wherein a first electrode of the (1-1)th transistor is connected to a first power node, a second electrode of the (1-2)th transistor is connected to a second power node, and
wherein each of the first buffers further comprises a first capacitor connected between a gate electrode and a second electrode of the (1-1)th transistor, and a second capacitor connected between a gate electrode and a first electrode of the (1-2)th transistor.

27. A gate driver, comprising:
an i-th signal transmitter (i is a positive integer) of a first shift register, which is configured to output a first gate signal to one side of an i-th gate line according to a voltage of a (1-1)th control node and a voltage of a (1-2)th control node; and
an i-th signal transmitter of a second shift register, which is configured to output a second gate signal to the other side of the i-th gate line according to a voltage of a (2-1)th control node and a voltage of a (2-2)th control node,
wherein the (1-2)th control node includes a (1-2a)th control node and a (1-2b)th control node, and
the (2-2)th control node includes a (2-2a)th control node and a (2-2b)th control node,
wherein the (1-1)th control node is controlled to be a pull-up control node to pull up a voltage of the first gate signal to a first voltage,
the (1-2a)th control node is controlled to be a pull-down control node to pull down the voltage of the first gate signal to a second voltage lower than the first voltage during a (1-1)th unit time, and deactivated during a (1-2)th unit time,
the (1-2b)th control node is deactivated during a (1-1)th unit time, and controlled to be the pull-down control node to pull down the voltage of the first gate signal to the second voltage during a (1-2)th unit time,
the (2-1)th control node is controlled to be the pull-up control node to pull up a voltage of the second gate signal to the first voltage,
the (2-2a)th control node is controlled to be a pull-down control node to pull down the voltage of the second gate signal to the second voltage during a (2-1)th unit time, and deactivated during a (2-2)th unit time, and the (2-2b)th control node is deactivated during a (2-1)th unit time, and controlled to be the pull-down control node to pull down the voltage of the second gate signal to the second voltage during a (2-2)th unit time,
wherein a time point, at which a transition between the (1-1)th unit time and the (1-2)th unit time is made, is different from a time point at which a transition between (2-1)th unit time and the (2-2)th unit time is made.

28. The gate driver of claim 27, wherein the i-th signal transmitter of the first shift register includes:
a first controller configured to control the (1-1)th control node to be the pull-up control node, and to receive an activation clock during the (1-1)th unit time to control the (1-2)th control node to be the pull-down control node, and receive the activation clock during the (1-2)th unit time to control the (1-2)th control node to be deactivated; and
first buffers configured to output the first gate signal according to the voltage of the (1-1)th control node and the voltage of the (1-2)th control node, and
the i-th signal transmitter of the second shift register includes:
a second controller configured to control the (2-1)th control node to be the pull-up control node, and to receive the activation clock during the (2-1)th unit time to control the (2-2)th control node to be the pull-up control node, and receive the activation clock during the (2-2)th unit time to control the (2-2)th control node to be deactivated; and
second buffers configured to output the second gate signal according to the voltage of the (2-1)th control node and the voltage of the (2-2)th control node.

29. The gate driver of claim 28, wherein
each of the first buffers includes:
a (1-1)th transistor driven in response to the voltage of the (1-1)th control node;
a (1-2a)th transistor driven in response to a voltage of the (1-2a)th control node; and
a (1-2b)th transistor driven in response to a voltage of the (1-2b)th control node, and
each of the second buffers includes:
a (2-1)th transistor driven in response to the voltage of the (2-1)th control node;
a (2-2a)th transistor driven in response to a voltage of the (2-2a)th control node; and
a (2-2b)th transistor driven in response to a voltage of the (2-2b)th control node.

30. The gate driver of claim 29, wherein the first switch part includes:
a (1-1)th switch part including a (1-1a)th switch element configured to connect a low potential voltage line to a second electrode of the (1-2a)th transistor in response to a first control signal, and a (1-1b)th switch element configured to connect a high potential voltage line to the second electrode of the (1-2a)th transistor in response to a second control signal; and
a (1-2)th switch part including a (1-2a)th switch element configured to connect the low potential voltage line to a second electrode of the (1-2b)th transistor in response to the first control signal, and a (1-2b)th switch element configured to connect the high potential voltage line to the second electrode of the (1-2b)th transistor in response to the second control signal.

31. The gate driver of claim 30, wherein the second switch part includes:

a (2-1)th switch part including a (2-1a)th switch element configured to connect the low potential voltage line to a second electrode of the (2-2a)th transistor in response to the first control signal and a (2-1b)th switch element configured to connect the high potential voltage line to the second electrode of the (2-2a)th transistor in response to the second control signal; and a (2-2)th switch part including a (2-2a)th switch element configured to connect the low potential voltage line to a second electrode of the (2-2b)th transistor in response to the first control signal, and a (2-2b)th switch element configured to connect the high potential voltage line to the second electrode of the (2-2b)th transistor in response to the second control signal.

32. The gate driver of claim 31, wherein the first controller includes:
a (1-1)th Q generation logic part configured to charge the (1-1)th control node to turn the (1-1)th transistor on;
a (1-2a)th QB generation logic part that is configured to charge the (1-2a)th control node during a first unit time to turn the (1-2a)th transistor on and is deactivated during a second unit time; and
a (1-2b)th QB generation logic part that is configured to charge the (1-2b)th control node during the second unit time to turn the (1-2b)th transistor on and is deactivated during the first unit time, and
the second controller includes:
a (2-1)th Q generation logic part configured to charge the (2-1)th control node to turn the (2-1)th transistor on;
a (2-2a)th QB generation logic part that is configured to charge the (2-2a)th control node during the first unit time to turn the (2-2a)th transistor on and is deactivated during the second unit time; and
a (2-2b)th QB generation logic part that is configured to charge the (2-2b)th control node during the second unit time to turn the (2-2b)th transistor on and is deactivated during the first unit time.

33. The gate driver of claim 29, wherein a first electrode of the (1-2a)th transistor is connected to a first power node, a first electrode of the (1-2b)th transistor is connected to a second power node,
wherein each of the first buffers further comprises a first capacitor connected between a second electrode of the (1-2a)th transistor and an output node, and a second capacitor connected between a gate electrode and a second electrode of the (1-2b)th transistor, and
wherein the output node is between the (1-2a)th transistor and the (1-2b)th transistor.

34. The gate driver of claim 29, wherein the (1-2a)th transistor and the (1-2b)th transistor are each connected to the (1-1)th transistor with an output node therebetween,
wherein each of the first buffers further comprises a capacitor connected between a gate electrode of the (1-1)th transistor and the output node.

35. The gate driver of claim 27, wherein the first voltage is a gate-on voltage, and the second voltage is a gate-off voltage.

36. A display device, comprising:
a display panel in which a plurality of data lines to which a data voltage is applied, a plurality of gate lines crossing the data lines and to which a gate signal is applied, and pixel circuits connected to a plurality of power lines are disposed;
a data driver configured to receive pixel data and output the data voltage; and
a gate driver configured to output the gate signal using a shift register,
wherein the gate driver includes:
a first shift register configured to sequentially supply the gate signal to the plurality of gate lines through output nodes connected to the gate lines; and
a second shift register configured to sequentially supply the gate signal to the gate lines through output nodes connected to the gate lines,
wherein, in a first process, the first shift register pulls down an i-th gate line (i is a positive integer), and simultaneously, the second shift register pulls down the i-th gate line,
in a second process following the first process, the second shift register pulls down the i-th gate line,
in a third process following the second process, the first shift register pulls down the i-th gate line, and
in a fourth process following the third process, the first shift register pulls down the i-th gate line, and simultaneously, the second shift register pulls down the i-th gate line,
wherein an i-th signal transmitter of the first shift register includes a (1-1)th buffer transistor, a (1-2a)th buffer transistor, and a (1-2b)th buffer transistor that are connected to one side of the i-th gate line,
an i-th signal transmitter of the second shift register includes a (2-1)th buffer transistor, a (2-2a)th buffer transistor, and a (2-2b)th buffer transistor that are connected to the other side of the i-th gate line,
wherein in the first process, a gate driving voltage (GVDD) is applied to the (1-1)th buffer transistor, a gate reference voltage (GVSS) lower than the gate driving voltage is applied to the (1-2a)th buffer transistor, the gate driving voltage is applied to the (2-1)th buffer transistor, and the gate reference voltage is applied to the (2-2a)th buffer transistor,
in the second process, the gate driving voltage is applied to the (1-1)th buffer transistor, the (1-2a)th and (1-2b)th buffer transistors are deactivated, the gate driving voltage is applied to the (2-1)th buffer transistor, and the gate reference voltage is applied to the (2-2b)th buffer transistor,
in the third process, the gate driving voltage is applied to the (1-1)th buffer transistor, the gate reference voltage is applied to the (1-2b)th buffer transistor, the gate driving voltage is applied to the (2-1)th buffer transistor, and the (2-2a)th and (2-2b)th buffer transistors are deactivated, and
in the fourth process, the gate driving voltage is applied to the (1-1)th buffer transistor, the gate reference voltage is applied to the (1-2b)th buffer transistor, the gate driving voltage is applied to the (2-1)th buffer transistor, and the gate reference voltage is applied to the (2-2b)th buffer transistor.

37. The display device of claim 36, wherein the first process is performed during a first unit time, the second process is performed during a first transition time, the third process is performed during a second transition time, the fourth process is performed during a second unit time, and wherein the first transition time and the second transition time are set differently from each other without overlapping each other.

* * * * *